US008687526B2

(12) United States Patent
Jeong et al.

(10) Patent No.: US 8,687,526 B2
(45) Date of Patent: Apr. 1, 2014

(54) DIGITAL BROADCAST TRANSMITTER, DIGITAL BROADCAST RECEIVER, AND METHODS FOR CONFIGURING AND PROCESSING STREAMS THEREOF

(75) Inventors: Jin-hee Jeong, Yongin-si (KR); Chan-sub Park, Incheon (KR); Kum-ran Ji, Suwon-si (KR); Hak-ju Lee, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 13/233,734

(22) Filed: Sep. 15, 2011

(65) Prior Publication Data
US 2012/0063502 A1     Mar. 15, 2012

Related U.S. Application Data

(60) Provisional application No. 61/413,014, filed on Nov. 12, 2010, provisional application No. 61/410,532, filed on Nov. 5, 2010, provisional application No. 61/383,089, filed on Sep. 15, 2010.

(30) Foreign Application Priority Data

Jul. 29, 2011     (KR) .................. 10-2011-0075971

(51) Int. Cl.
H04B 7/005     (2006.01)
H03H 7/30     (2006.01)
(52) U.S. Cl.
USPC .......................................... 370/278; 375/231
(58) Field of Classification Search
None
See application file for complete search history.

(56) References Cited

U.S. PATENT DOCUMENTS

| | | | |
|---|---|---|---|
| 2007/0092032 A1* | 4/2007 | Yu et al. | 375/295 |
| 2009/0044230 A1 | 2/2009 | Oh et al. | |
| 2009/0323729 A1 | 12/2009 | Simon et al. | |
| 2010/0149427 A1 | 6/2010 | Limberg | |
| 2010/0238902 A1* | 9/2010 | Ji et al. | 370/331 |
| 2011/0149828 A1* | 6/2011 | Song et al. | 370/312 |
| 2011/0286546 A1* | 11/2011 | Song et al. | 375/295 |
| 2012/0099506 A1* | 4/2012 | Song et al. | 370/312 |
| 2012/0176541 A1* | 7/2012 | Lee et al. | 348/474 |
| 2013/0064280 A1* | 3/2013 | Jeong et al. | 375/231 |

OTHER PUBLICATIONS

International Search Report (PCT/ISA/210) and Written Opinion (PCT/ISA/237), dated Mar. 26, 2012, issued by the International Searching Authority in corresponding International Application No. PCT/KR2011/006822.

* cited by examiner

*Primary Examiner* — Eunsook Choi
(74) *Attorney, Agent, or Firm* — Sughrue Mion, PLLC

(57) ABSTRACT

A method for processing a stream of a digital broadcast transmitter, the digital broadcast transmitter, a method of processing a stream of a digital broadcast receiver, and the digital broadcast receiver are provided. The method includes: configuring a stream including a slot to which mobile data is allocated; and encoding and interleaving the configured stream and outputting the encoded and interleaved stream. Each slot of the stream includes signaling data, and the signaling data includes a slot indicator indicating a type of a slot, and may include at least one of a backward training indicator and a forward training indicator according to a value of the slot indicator. Accordingly, information on an adjacent slot is efficiently used.

23 Claims, 68 Drawing Sheets

FIG. 41

| Type 1 |
|---|
| Type 0 |
| Type 0 |
| Type 0 |
| Type 1 |
| Type 0 |
| Type 0 |
| Type 0 |
| Type 1 |
| Type 0 |
| Type 0 |
| Type 0 |

FIG. 42

| | ex 1 | ex 2 | ex 3 | ex 4 | ex 5 | ex 6 |
|---|---|---|---|---|---|---|
| | Type 0 | Type 1-4 | Type 1-4 | Type 1-4 | Type 1-4 | Type 1-4 |
| | Type 1-1 | Type 0 | Type 0 | Type 1-2 | Type 1-2 | Type 1-4 |
| | Type 1-2 | Type 1-4 | Type 1-3 | Type 1-3 | Type 1-3 | Type 1-4 |
| | Type 1-3 | Type 0 | Type 0 | Type 0 | Type 1-1 | Type 1-4 |
| | Type 1-4 | Type 1-4 | Type 1-4 | Type 1-4 | Type 1-4 | Type 1-4 |
| | Type 0 | Type 0 | Type 0 | Type 1-2 | Type 1-2 | Type 1-4 |
| | Type 1-1 | Type 1-4 | Type 1-3 | Type 1-3 | Type 1-3 | Type 1-4 |
| | Type 1-2 | Type 0 | Type 0 | Type 0 | Type 1-1 | Type 1-4 |
| | Type 1-3 | Type 1-4 | Type 1-4 | Type 1-4 | Type 1-4 | Type 1-4 |
| | Type 1-4 | Type 0 | Type 0 | Type 1-2 | Type 1-2 | Type 1-4 |
| | Type 0 | Type 0 | Type 1-3 | Type 1-3 | Type 1-3 | Type 1-4 |
| | Type 1-1 | Type 0 | Type 0 | Type 0 | Type 1-1 | Type 1-4 |
| | Type 1-2 | Type 1-4 | Type 1-4 | Type 1-4 | Type 1-4 | Type 1-4 |
| | Type 1-3 | Type 0 | Type 0 | Type 1-2 | Type 1-2 | Type 1-4 |
| | Type 1-4 | Type 1-4 | Type 1-3 | Type 1-3 | Type 1-3 | Type 1-4 |
| | Type 0 | Type 0 | Type 0 | Type 0 | Type 1-1 | Type 1-4 | ns # DIGITAL BROADCAST TRANSMITTER, DIGITAL BROADCAST RECEIVER, AND METHODS FOR CONFIGURING AND PROCESSING STREAMS THEREOF

CROSS-REFERENCE TO RELATED APPLICATIONS

This application claims the benefit of U.S. Provisional Application No. 61/383,089, filed on Sep. 15, 2010, No. 61/410,532, filed on Nov. 5, 2010, and No. 61/413,014 filed on Nov. 12, 2010, and claims priority from Korean Patent Application No. 10-2011-0075971 filed on Jul. 29, 2011 in the Korean Intellectual Property Office, the disclosures of which are incorporated herein by reference in their entirety.

BACKGROUND

1. Field

Apparatuses and methods consistent with the exemplary embodiments relate to a digital broadcast transmitter, a digital broadcast receiver, and methods for configuring and processing streams thereof, and more particularly, to a digital broadcast transmitter to configure a transport stream including information on an adjacent slot and to transmit the transport stream, a digital broadcast receiver to receive and to process the transport stream, and methods thereof.

2. Description of the Related Art

As digital broadcasting becomes widespread, diverse types of electronic apparatuses support digital broadcasting services. In particular, a personal portable apparatus, such as a mobile phone, a navigator, a personal digital assistance (PDA), and an MP3 player, as well as a general home appliance, such as a digital broadcast television and a set-top box, supports the digital broadcasting.

Accordingly, digital broadcast standards for providing digital broadcasting service to such a portable apparatus have been discussed.

Among these, an advanced television systems committee—mobile/handheld (ATSC-MH) standard has been discussed. According to ATSC-MH standard, mobile data is placed in a transport stream that is configured for transmitting general data for a digital broadcasting service (i.e., normal data), and is then transmitted.

Since the mobile data is received and processed at the portable apparatus, the mobile data is processed to be robust against an error because of the mobility of the portable apparatus unlike the normal data, and is included in the transport stream.

FIG. 1 is a view illustrating an example of a transport stream including mobile data and normal data.

The stream a) of FIG. 1 illustrates a stream in which mobile data and normal data are placed in packets allocated thereto and are multiplexed.

The stream a) of FIG. 1 is converted into a stream b) by interleaving. Referring to b) of FIG. 1, the interleaved mobile data MH can be divided into an area "A" and an area "B". The area "A" represents an area which extends from a portion where mobile data over a predetermined size are collected in a plurality of transmission units, and the area "B" represents the remaining area. Dividing the mobile data into the area "A" and the area "B" is merely an example and the mobile data may be divided in different ways according to situations. For example, in b) of FIG. 1, even a portion not including normal data is set to the area "A" and a portion corresponding to a transmission unit in which a bit of normal data is included is set to the area "B."

The area "B" is relatively susceptible to an error compared to the area "A." More specifically, digital broadcast data may include known data for correcting an error, such as a training sequence to be demodulated and equalized appropriately at a receiver. According to the related-art ATSC-MH standard, the known data is not placed in the area "B" and, thus, the area "B" is susceptible to an error.

Also, if the stream is configured as shown in FIG. 1, there is a limit in transmitting the mobile data. In other words, although an increased number of broadcasting stations and apparatuses support broadcasting services for mobile apparatuses, stream transmitting efficiency deteriorates due to the stream configuration as shown in FIG. 1 in which a portion allocated to normal data cannot be used.

Accordingly, there is a need for a method for utilizing a configuration of a transport stream more efficiently than known in the related art.

SUMMARY

Exemplary embodiments overcome the above disadvantages and other disadvantages not described above. However, it is understood that an exemplary embodiment is not required to overcome the disadvantages described above, and an exemplary embodiment may not overcome any of the problems described above.

Exemplary embodiments provide a digital broadcast transmitter to provide information on an adjacent slot so that a digital broadcast receiver knows the information on the adjacent slot without additional power consumption, a method for processing a stream thereof, a digital broadcast receiver corresponding to the digital broadcast transmitter, and a method for processing a stream thereof.

According to an aspect of an exemplary embodiment, there is provided a method for processing a stream of a digital broadcast transmitter, the method including: configuring a stream including a slot to which M/H data is allocated; and encoding and interleaving the configured stream and outputting the encoded and interleaved stream.

The slot of the stream may include signaling data, and the signaling data may include a slot indicator indicating a type of the slot, and may include at least one of a backward training indicator and a forward training indicator according to a value of the slot indicator.

The configuring the stream may include: placing each of a plurality of parades in a plurality of slots according to a placing pattern in which slots corresponding to a same parade are not consecutively placed; generating the signaling data including the slot indicator, and the at least one of the backward training indicator and the forward training indicator; and encoding the signaling data and adding the encoded signaling data to the stream.

In the case of a Core Mobile Mode (CMM) slot, the generating the signaling data may include generating information on training data of a previous slot preceding the CMM slot as the backward training indicator and not generating the forward training indicator, and, in the case of a Scalable Full-Channel Mobile Mode (SFCMM) slot, the generating the signaling data may include generating information on training data of a previous slot preceding the SFCMM slot as the backward training indicator and generating information on training data of a next slot following the SFCMM slot as the forward training indicator.

The slot indicator may be represented by 1 bit, the backward training indicator may be represented by 3 bits, and the forward training indicator may be represented by 1 bit.

The configuring the stream may include placing known data so that the known data placed in sawteeth portions of two adjacent slots among the plurality of slots included in the stream are connected to each other.

The backward training indicator and the forward training indicator may be information to indicate locations of the known data of a previous slot or a next slot in the sawteeth portions to a digital broadcast receiver.

The slot indicator, the backward training indicator, and the forward training indicator may be determined with reference to a next slot corresponding to a same parade as a parade of a current slot.

According to an aspect of another exemplary embodiment, there is provided a digital broadcast transmitter including: a stream configuration unit which configures a stream including a slot to which mobile data is allocated; and an exciter unit which encodes and interleaves the configured stream and outputs the encoded and interleaved stream.

The slot of the stream may include signaling data, and the signaling data may include a slot indicator indicating a type of the slot, and may include at least one of a backward training indicator and a forward training indicator according to a value of the slot indicator.

The stream configuration unit may include: a data pre-processor which places each of a plurality of parades in a plurality of slots according to a placing pattern in which slots corresponding to a same parade are not consecutively placed; a signaling encoder which encodes the signaling data including the slot indicator, and at least one of the backward training indicator and the forward training indicator, and provides the signaling data to the data pre-processor; and a multiplexer which receives data processed by the data pre-processor and configures a transport stream.

In the case of a CMM slot, the signaling encoder may generate information on training data of a previous slot preceding the CMM slot as the backward training indicator and may not generate the forward training indicator, and, in the case of a SFCMM slot, the signaling encoder may generate information on training data of a previous slot preceding the SFCMM slot as the backward training indicator and generate information on training data of a next slot following the SFCMM slot as the forward training indicator.

The slot indicator may be represented by 1 bit, the backward training indicator may be represented by 3 bits, and the forward training indicator may be represented by 1 bit.

The stream configuration unit may include a group formatter which places known data so that the known data placed in sawteeth portions of two adjacent slots among the plurality of slots included in the stream are connected to each other.

The backward training indicator and the forward training indicator may be information to indicate locations of the known data of a previous slot or a next slot in the sawteeth portions to a digital broadcast receiver.

The slot indicator, the backward training indicator, and the forward training indicator may be determined with reference to a next slot corresponding to a same parade as a parade of a current slot.

According to an aspect of still another exemplary embodiment, there is provided a method for processing a stream of a digital broadcast receiver, the method including: receiving and demodulating a stream including a slot to which mobile data is allocated; equalizing the demodulated stream; decoding the equalized stream; and detecting and decoding signaling data included in the slot of the demodulated stream.

The slot of the stream may include the signaling data, and the signaling data may include a slot indicator indicating a type of the slot, and may include at least one of a backward training indicator and a forward training indicator according to a value of the slot indicator.

The detecting and decoding the signaling data may include: separating the signaling data from the demodulated stream; decoding the separated signaling data and checking the slot indicator; if the slot indicator indicates a CMM slot, checking the backward training indicator and checking training sequence information of a previous slot according to a value of the backward training indicator; and if the slot indicator indicates a SFCMM slot, checking the backward training indicator and the forward training indicator and checking training sequence information of the previous slot and training sequence information of a next slot according to values of the backward training indicator and the forward training indicator.

The method may further include, in the case of the CMM slot, detecting known data from the previous slot according to the training sequence information of the previous slot, and, in the case of the SFCMM slot, detecting known data placed in the previous slot and known data placed in the next slot according to the training sequence information of the previous slot and the training sequence information of the next slot.

The detected known data may be used in at least one of the demodulating, the equalizing, and the decoding.

The slot indicator may be represented by 1 bit, the backward training indicator may be represented by 3 bits, and the forward training indicator may be represented by 1 bit.

According to an aspect of yet another exemplary embodiment, there is provided a digital broadcast receiver including: a demodulator which receives and demodulates a stream including a slot to which mobile data is allocated; an equalizer which equalizes the demodulated stream; a decoder which decodes the equalized stream; and a signaling decoder which detects and decodes the signaling data included in the slot of the demodulated stream.

The slot of the stream may include the signaling data, and the signaling data may include a slot indicator indicating a type of the slot, and may include at least one of a backward training indicator and a forward training indicator according to a value of the slot indicator.

The digital broadcast receiver may further include a storage unit which stores information on an adjacent slot.

The signaling decoder may separate the signaling data from the demodulated stream, decode the separated signaling data and check the slot indicator, if the slot indicator indicates a CMM slot, may check training sequence information of a previous slot according to a value of the backward training indicator from the storage unit, and if the slot indicator indicates a SFCMM slot, may check training sequence information of a previous slot and training sequence information of a next slot according to values of the backward training indicator and the forward training indicator from the storage unit.

The digital broadcast receiver may further include a known data detector which, in the case of the CMM slot, detects known data from the previous slot according to the training sequence information of the previous slot, and, in the case of the SFCMM slot, detects known data placed in the previous slot and known data placed in the next slot according to the training sequence information of the previous slot and the training sequence information of the next slot.

The detected known data may be used by at least one of the demodulator, the equalizer, and the decoder.

The slot indicator may be represented by 1 bit, the backward training indicator may be represented by 3 bits, and the forward training indicator may be represented by 1 bit.

According to the exemplary embodiments described above, information on an adjacent slot is notified in advance and is used.

BRIEF DESCRIPTION OF THE DRAWING FIGURES

The above and/or other aspects will be more apparent by describing in detail exemplary embodiments, with reference to the accompanying drawings in which:

FIGS. 41 to 43 are views illustrating diverse types of slots which are arranged in sequence repeatedly;

FIG. 56 is a view illustrating a stream configuration after interleaving in a scalable mode 11a;

FIG. 57 is a view illustrating a stream configuration before interleaving in a scalable mode 11a;

DETAILED DESCRIPTION OF EXEMPLARY EMBODIMENTS

Figure 1:
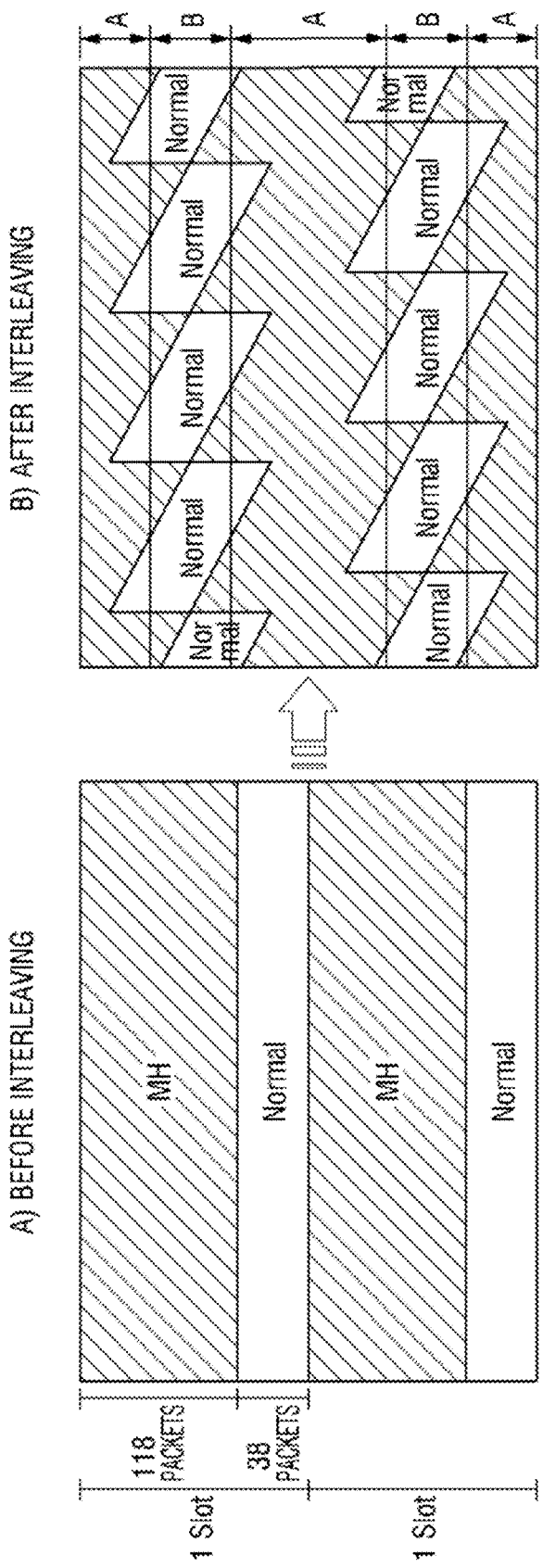
FIG. 1 is a view illustrating an example of a configuration of a transport stream according to the ATSC-MH standard.

Hereinafter, exemplary embodiments will be described in greater detail with reference to the accompanying drawings.

In the following description, same reference numerals are used for the same elements when they are depicted in different drawings. The matters defined in the description, such as detailed constructions and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the invention with unnecessary detail. Expressions such as "at least one of," when preceding a list of elements, modify the entire list of elements and do not modify the individual elements of the list.

[Digital Broadcast Transmitter]

Figure 2:
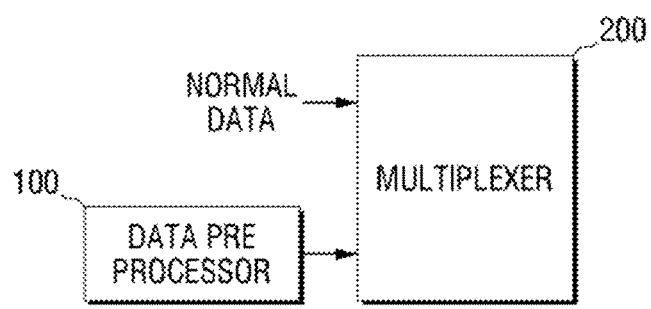
FIGS. 2 to 4 are block diagrams illustrating a digital broadcast transmitter according to various exemplary embodiments.

Referring to FIG. 2, a digital broadcast transmitter according to an exemplary embodiment includes a data pre-processor 100 and a multiplexer 200.

The data pre-processor 100 receives mobile data and processes the mobile data appropriately to convert the mobile data into a format suitable for transmission.

The multiplexer 200 configures a transport stream with the mobile data. Specifically, the multiplexer 200 can multiplex the mobile data output from the data pre-processor 100 with normal data if normal data exists, thereby configuring the transport stream.

The data pre-processor 100 may process the mobile data so that the mobile data is placed in all or some of the packets allocated to normal data of the entire stream.

That is, as shown in FIG. 1, some of the packets are allocated to normal data according to the ATSC-MH standard. More specifically, a stream is divided into a plurality of slots in a time unit as shown in FIG. 1, and one slot includes 156 packets in total. 38 of these packets are allocated to normal data, while the remaining 118 packets are allocated to mobile data. Hereinafter, for convenience of description, the 118 packets are referred to as a first area which is allocated to the mobile data, and the 38 packets are referred to as a second area which is allocated to the normal data. Also, the normal data includes diverse types of general data that can be received and processed by a receiving device (such as a TV), and the mobile data includes a type of data that can be received and processed by a mobile apparatus. The mobile data may be expressed by diverse terms such as robust data, turbo data, and additional data according to situations.

The data pre-processor 100 may place mobile data in the packet area which is allocated to the mobile data and may also separately place mobile data in all or some of the packets which are allocated to the normal data. Mobile data placed in the packets allocated to the mobile data may be referred to as "first mobile data" and the area allocated to the first mobile data may be referred to as the first area, as described above. On the other hand, mobile data placed in the second area, that is, in the packets allocated to the normal data, is referred to as new mobile data. The first mobile data and the new mobile data may be the same or different from each other. The data pre-processor 10 may place the mobile data in various patterns according to, for example, a setting condition of a frame mode and another mode. The patterns in which the mobile data is placed will be explained in detail below.

The multiplexer 200 configures a transport stream. Specifically, if there is normal data to be transmitted, the multiplexer 200 multiplexes the normal data and the stream output from the data pre-processor 100.

Figure 3:
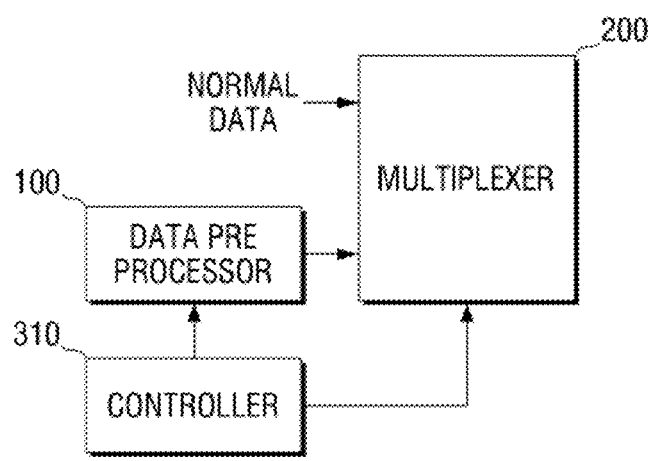

FIG. 3 is a view illustrating another exemplary embodiment in which a controller 310 is further included in the digital broadcast transmitter of FIG. 2. Referring to FIG. 3, the controller 310 of the digital broadcast transmitter determines a setting condition of a frame mode and controls operations of the data pre-processor 100.

More specifically, if it is determined that a first frame mode is set, the controller 310 controls the data pre-processor 100 not to place the mobile data in all of the packets allocated to the normal data and to place the mobile data in the first area. That is, the data pre-processor 100 outputs a stream including only the first mobile data. Accordingly, a transport stream is configured by placing normal data in the packets allocated to the normal data by the multiplexer 200.

If it is determined that a second frame mode is set, the controller 310 controls the data pre-processor 100 to place the first mobile data in the packets allocated to the mobile data, that is, in the first area, and also to place the mobile data in at least some of the packets allocated to the normal data, that is, in a part of the second area.

In this case, the controller 310 may determine a setting condition of a separately provided mode, that is, a mode for determining in how many packets the mobile data is placed among the packets allocated to the normal data. Accordingly, the controller 310 may control the data pre-processor 100 to place the mobile data in a predetermined number of packets which are determined according to the setting condition of the mode among all of the packets allocated to the normal data.

The mode recited herein may be provided in a variety of ways. For example, the mode may include at least one compatible mode and an incompatible mode. The compatible mode refers to a mode in which the digital broadcast transmitter is compatible with an existing normal data receiver, which receives and processes normal data, and the incompatible mode refers to a mode in which the digital broadcast transmitter is not compatible with the existing normal data receiver.

More specifically, the compatible mode may include a plurality of compatible modes in which the new mobile data is placed in at least a part of the second area. For example, the compatible mode may be one of a first compatible mode in which the mobile data is placed in some of the packets allocated to the normal data and a second compatible mode in which the mobile data is placed in all of the packets allocated to the normal data.

The first compatible mode may be a mode in which the mobile data is placed in some of the data areas of each of some packets in the second area. In other words, the mobile data is placed in some of the data areas of some packets, whereas the normal data is placed in the remaining data areas.

Also, the first compatible mode may be a mode in which the mobile data is placed in all of the data areas of some packets in the second area.

Also, the mode may be provided in a variety of ways, considering the number of packets allocated to the normal data, and a size, a type, a transmitting time, and a transmitting environment of the mobile data.

For example, if 38 packets are allocated to the normal data as shown in FIG. 1, the first compatible mode may include:
1) a first mode in which the new mobile data is placed in the 38 packets at a ratio of 1/4;
2) a second mode in which the new mobile data is placed in the 38 packets at a ratio of 2/4;
3) a third mode in which the new mobile data is placed in the 38 packets at a ratio of 3/4; and
4) a fourth mode in which the new mobile data is placed in all of the 38 packets.

In the first mode, the new mobile data may be placed in 11 packets, which is the sum of 2 packets of the 38 packets and 9 packets which are the quotient of the remaining 36 packets divided by 4. In the second mode, the new mobile data may be placed in the packets, which is the sum of 2 packets of the 38 packets and 18 packets which is the quotient of the remaining 36 packets divided by 2. In the third mode, the new mobile data may be placed in 29 packets, which is the sum of 2 packets of the 38 packets and 27 packets which is the result of multiplying the remaining 36 packets by 3/4. In the fourth mode, the new mobile data may be placed in all of the 38 packets.

On the other hand, the incompatible mode refers to a mode in which compatibility with the receiver to receive the normal data is disregarded and a transmission capacity of the new mobile data is increased. More specifically, the incompatible mode may be a mode in which the new mobile data is placed in an MPEG header and an RS parity area provided in the first area, in addition to the entire second area.

As a result, the data pre-processor 100 of FIG. 2 or FIG. 3 may place the new mobile data according to the following various modes and configure a transport stream:
1) a first mode in which the new mobile data is placed in 11 packets among the 38 packets allocated to the normal data;
2) a second mode in which the new mobile data is placed in 20 packets among the 38 packets allocated to the normal data;
3) a third mode in which the new mobile data is placed in 29 packets among the 38 packets allocated to the normal data;
4) a fourth mode in which the new mobile data is placed in all of the 38 packets allocated to the normal data; and
5) a fifth mode in which the new mobile data is placed in all of the 38 packets allocated to the normal data, and an area corresponding to the MPEG header and the parity of the areas allocated to the existing mobile data.

Hereinafter, the fifth mode is referred to as "incompatible mode" and the first through the fourth modes are referred to as "compatible modes," for the convenience of explanation and not for purposes of limitation. However, the name of each mode may vary. Also, in the above exemplary embodiment, the five modes in total including the four compatible modes and the one incompatible mode have been described, but the number of compatible modes may vary in other exemplary embodiments. For example, the first through the third modes may be used as the compatible modes, and the fourth mode may be set as the fifth mode, that is, the incompatible mode.

The data pre-processor 100 may insert known data in addition to the mobile data. The known data is a sequence that is commonly known to the digital broadcast transmitter and the digital broadcast receiver. The digital broadcast receiver receives the known data from the digital broadcast transmitter, identifies a difference over a pre-known sequence, and then comprehends a degree of error correction accordingly. The known data may be expressed by different terms such as training data, training sequence, reference signal, and supplemental reference signal, but the term "known data" will be used hereinafter for convenience of description.

The data pre-processor 100 inserts at least one of the mobile data and the known data into diverse portions of the entire transport stream, thereby improving reception performance.

That is, it can seen from b) of FIG. 1 that the mobile data MH is collected in the area "A" and is distributed in the area "B" in a conical form. Accordingly, the area "A" may be referred to as a body area and the area "B" may be referred to as a head/tail area. In the related art MH stream, the head/tail area does not contain known data and thus has a problem that it does not perform as well as the body area.

Accordingly, the data pre-processor 100 inserts the known data into an appropriate location so that the known data can be placed in the head/tail area. The known data may be placed in a pattern of long training sequences in which data over a predetermined size is arranged continuously, or may be placed in a distributed pattern in which data is arranged discontinuously.

The mobile data and the known data may be inserted in various ways according to various exemplary embodiments, some of which will be explained in detail below with reference to the drawings. However, an example of a detailed configuration of the digital broadcast transmitter will be explained first.

[Example of Detailed Configuration of Digital Broadcast Transmitter]

Figure 4:
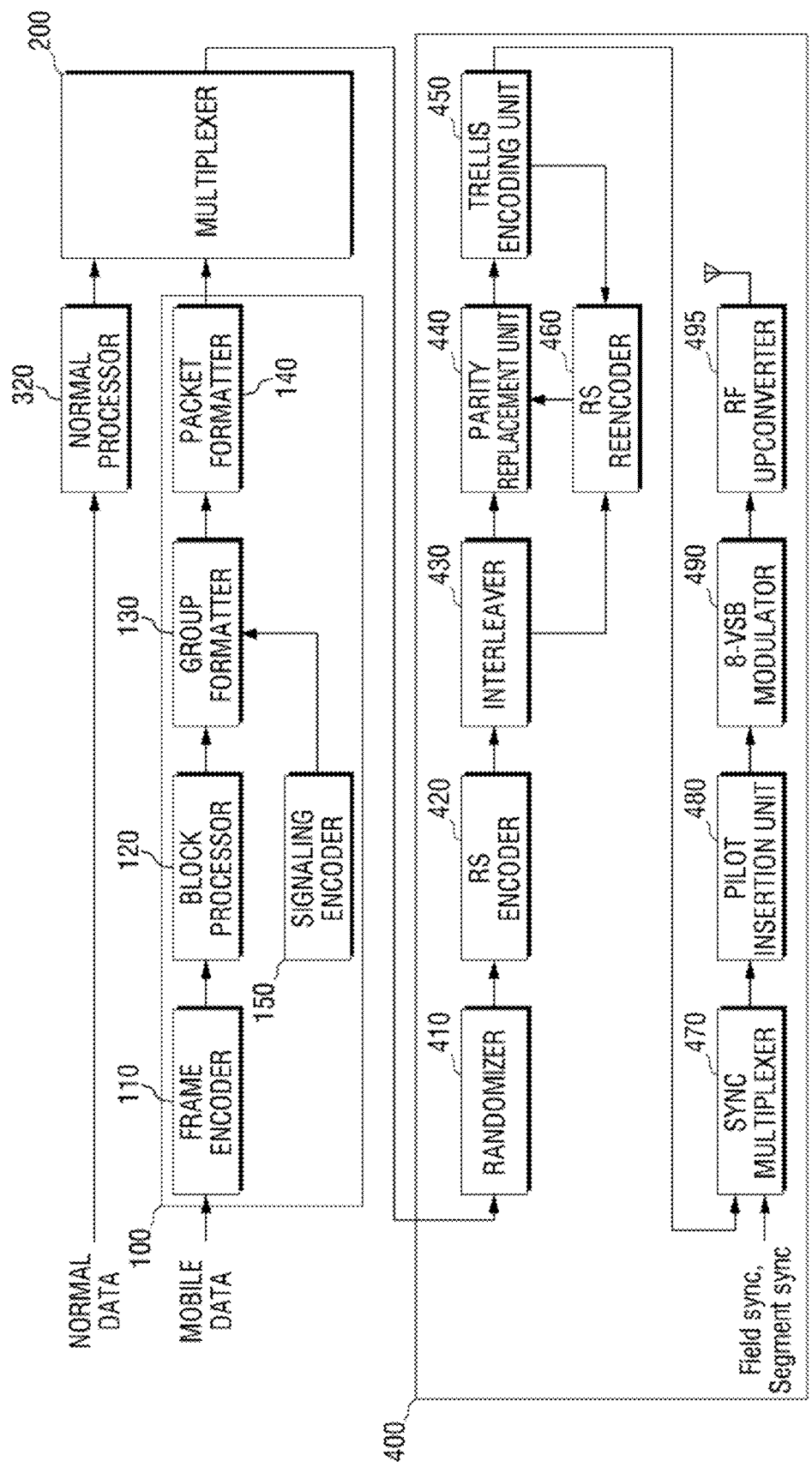

FIG. 4 is a block diagram illustrating an example of a detailed configuration of a digital broadcast transmitter according to an exemplary embodiment. Referring to FIG. 4, the digital broadcast transmitter may include a normal processor 320 and an exciter unit 400 in addition to the data pre-processor 100 and the multiplexer 200. Herein, a part including the data pre-processor 100, the normal processor 320, and the multiplexer 200 may be referred to as a stream configuration unit, for convenience of explanation.

The controller 310 of FIG. 3 is omitted from FIG. 4, though it is understood that the controller 310 can be included in the digital broadcast transmitter. Also, some elements may be deleted from the digital broadcast transmitter of FIG. 4 or one or more new elements may be added, according to other exemplary embodiments. Also, the arrangement order and the number of elements may vary according to various exemplary embodiments.

Referring to FIG. 4, the normal processor 320 receives normal data and converts the normal data into a format suitable for configuring a transport stream. That is, since the digital broadcast transmitter configures a transport stream including normal data and mobile data and transmits the transport stream, a related art digital broadcast receiver for normal data may be able to receive and process the normal data appropriately. Accordingly, the normal processor 320 adjusts a packet timing and a presentation clock reference (PCR) of the normal data (which may be referred to as main service data) so as to make the normal data format suitable for the MPEG/ATSC standard which is used to decode normal data. A detailed description thereof is disclosed in ANNEX B of ATSC-MH, the disclosure of which is incorporated herein in its entirety by reference, and thus is omitted herein.

The data pre-processor 100 includes a frame encoder 110, a block processor 120, a group formatter 130, a packet formatter 140, and a signaling encoder 150.

The frame encoder 110 performs Reed-Solomon (RS) frame encoding. More specifically, the frame encoder 110 receives a single service and builds a predetermined number of RS frames. For example, if a single service is an M/H ensemble unit including a plurality of M/H parades, a predetermined number of RS frames are built for each M/H parade. In particular, the frame encoder 110 randomizes input mobile data, performs RS-CRC encoding, divides each RS frame according to a pre-set RS frame mode, and outputs a predetermined number of RS frames.

Figure 5:
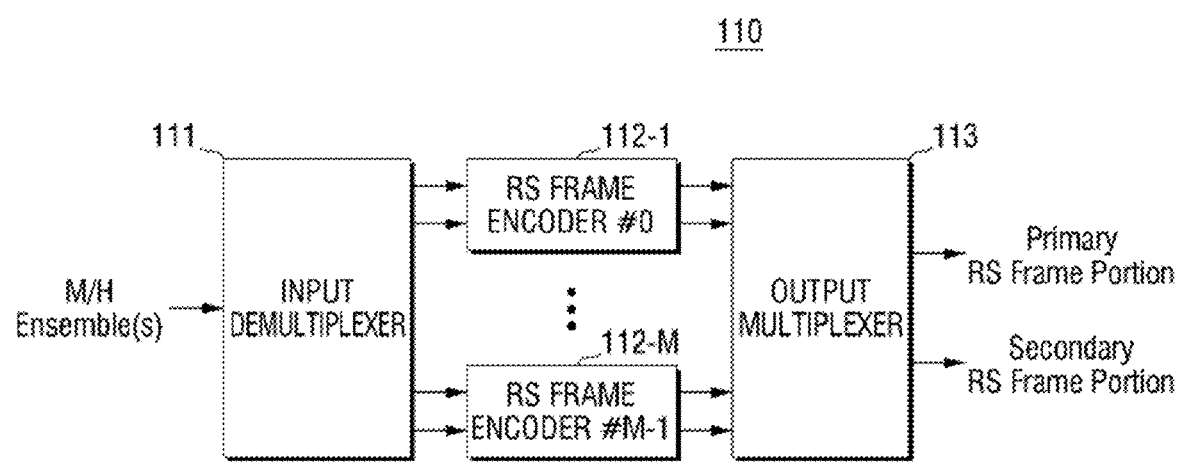
FIG. 5 is a block diagram illustrating an example of a frame encoder.

FIG. 5 is a block diagram illustrating an example of the frame encoder 110. Referring to FIG. 5, the frame encoder 110 includes an input demultiplexer 111, a plurality of RS frame encoders 112-1~112-M, and an output multiplexer 113.

If mobile data of a predetermined service unit (for example, an M/S ensemble unit) is input, the input demultiplexer 111 demultiplexes the mobile data into a plurality of ensembles such as a primary ensemble and a secondary ensemble according to pre-set configuration information (e.g., an RS frame mode), and outputs the demultiplexed ensembles to each RS frame encoder 112-1~112-M. Each RS frame encoder 112-1~122-M performs randomization, RS-CRC encoding, and dividing with respect to the input ensembles, and outputs the ensembles to the output multiplexer 113. The output multiplexer 113 multiplexes frame portions output from each RS frame encoder 112-1~112-M and outputs a primary RS frame portion and a secondary RS frame portion. In this case, only the primary RS frame portion may be output according to a setting condition of an RS frame mode.

Figure 6:
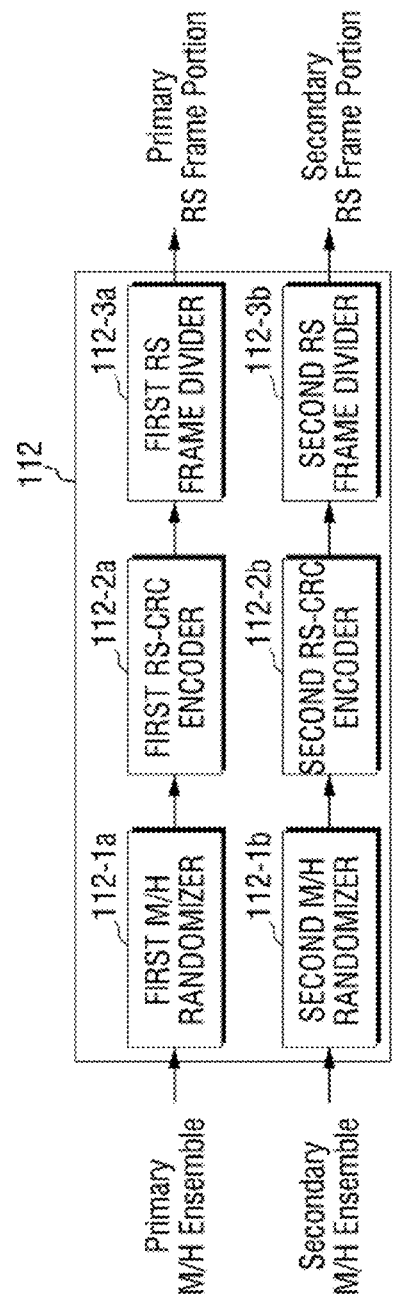
FIG. 6 is a block diagram illustrating an example of a Reed-Solomon (RS) frame encoder of the frame encoder of FIG. 5.

FIG. 6 is a block diagram illustrating an example of one of the RS frame encoders 112-1~112-M. Referring to FIG. 6, the frame encoder 112 includes a plurality of M/H randomizers 112-1a, 112-1b, a plurality of RS-CRC encoders 112-2a, 112-2b, and a plurality of RS frame dividers 112-3a, 112-3b. If the primary M/H ensemble and the secondary M/H ensemble are input from the input demultiplexer 111, the M/H randomizers 112-1a and 112-1b perform randomization and the RS-CRC encoders 112-2a and 112-2b perform RS-CRC encoding for the randomized data. The RS frame dividers 112-3a, 112-3b divide data to be block-coded appropriately and outputs the data to the output multiplexer 113 so that the block processor 120 disposed at the rear end of the frame encoder 110 block-codes the data appropriately. The output multiplexer 113 combines and multiplexes the frame portions and outputs the frame portions to the block processor 120 so that the block processor 120 block-codes the frame portions.

The block processor 120 codes a stream output from the frame encoder 110 by a block unit. That is, the block processor 120 performs block-coding.

Figure 7:
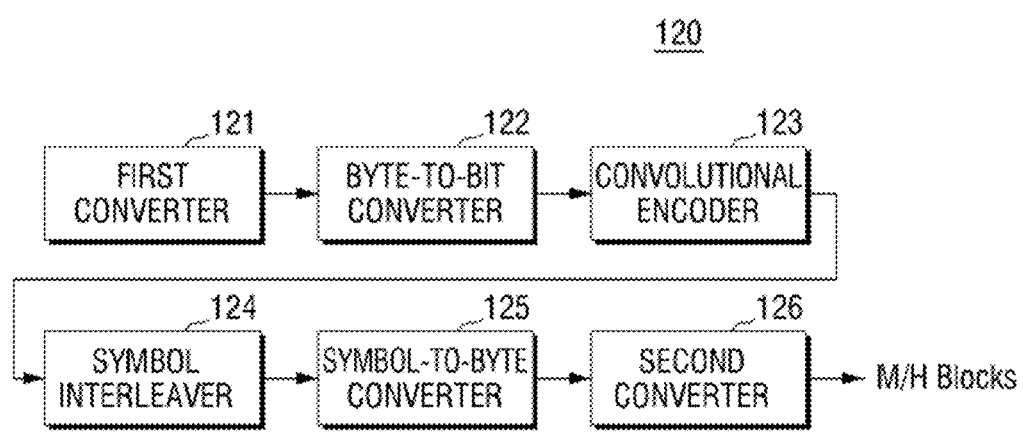
FIG. 7 is a block diagram illustrating an example of a block processor.

FIG. 7 is a block diagram illustrating an example of the block processor 120.

Referring to FIG. 7, the block processor 120 includes a first converter 121, a byte-to-bit converter 122, a convolutional encoder 123, a symbol interleaver 124, a symbol-to-byte converter 125, and a second converter 126.

The first converter 121 converts the RS frame output from the frame encoder 110 on a block basis. That is, the first converter 121 combines the mobile data in the RS frame according to a preset block mode and outputs a serially concatenated convolutional code (SCCC) block.

For example, if the block mode is "00," a single M/H block is converted into a single SCCC block.

Figure 8:
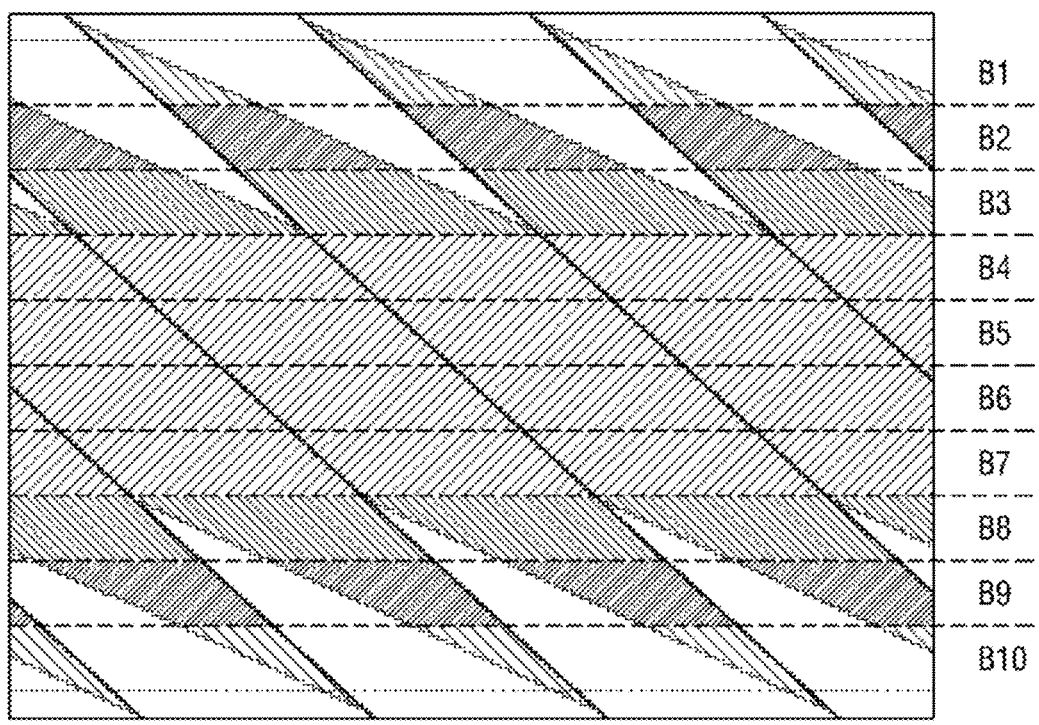
FIG. 8 is a view illustrating an example of dividing a stream into blocks.

FIG. 8 is a view illustrating M/H blocks which are a result of dividing mobile data on a block basis. Referring to FIG. 8, a single mobile data unit, for example, a M/H group, is divided into 10 M/H blocks B1~B10. If the block mode is "00," each block B1~B10 is converted into a SCCC block. If the block mode is "01," two M/H blocks are combined to form a single SCCC block and the SCCC block is output. The combination pattern may be diversely set according to various exemplary embodiments. For example, blocks B1 and B6 are combined to form a block SCB1 and blocks B2 and B7, blocks B3 and B8, blocks B4 and B9, and blocks B5 and B10 are combined to form blocks SCB2, SCB3, SCB4, and SCB5, respectively. According to the other block modes, blocks are combined in various ways and the number of combined blocks is variable.

The byte-to-bit converter 122 converts the SCCC block from a byte unit into a bit unit. This is because the convolutional encoder 123 operates on a bit basis. Accordingly, the convolutional encoder 123 performs convolutional encoding with respect to the converted data.

After that, the symbol interleaver 124 performs symbol interleaving. The symbol interleaving may be performed in the same way as the block interleaving. The symbol-interleaved data is converted into a byte unit by the symbol-to-byte converter 125 and is then reconverted into an M/H block unit by the second converter 126 and output.

The group formatter 130 receives the stream which is processed by the block processor 120 and formats the stream on a group basis. More specifically, the group formatter 130 maps the data output from the block processor 120 onto an appropriate location within the stream, and adds known data, signaling data, and initialization data to the stream.

In addition, the group formatter 130 adds a place holder byte for normal data, an MPEG-2 header, non-systematic RS parity and a dummy byte for conforming to a group format.

The signaling data refers to diverse information for processing the transport stream. The signaling data may be appropriately processed by the signaling encoder 150 and may be provided to the group formatter 130.

A transmission parameter channel (TPC) and a fast information channel (FIC) may be used to transmit the mobile data. The TPC is used to provide various parameters such as various forward error correction (FEC) mode information and M/H frame information. The FIC is used for a receiver to obtain a service swiftly and includes cross layer information between a physical layer and an upper layer. If such TPC information and FIC information are provided to the signaling encoder 150, the signaling encoder 150 processes the information appropriately and provides the processed information as signaling data.

Figure 9:
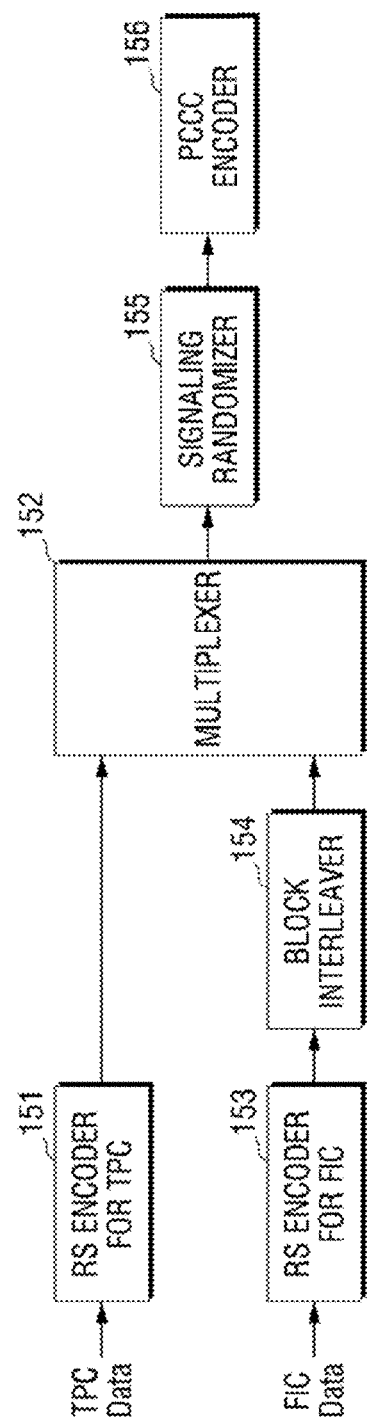
FIG. 9 is a block diagram illustrating an example of a signaling encoder.

FIG. 9 is a block diagram illustrating an example of the signaling encoder 150.

Referring to FIG. 9, the signaling encoder 150 includes an RS encoder for a TPC 151, a multiplexer 152, an RS encoder for a FIC 153, a block interleaver 154, a signaling randomizer 155, and a PCCC encoder 156. The RS encoder for the TPC 151 performs RS-encoding for input TPC data to form a TPC codeword. The RS encoder for the FIC 153 and the block interleaver 154 perform RS-encoding and block-interleaving for input FIC data to form an FIC codeword. The multiplexer 152 places the FIC code word after the TPC code word to form a series of sequences. The formed sequences are randomized by the signaling randomizer 155 and are coded into a parallel concatenated convolutional code (PCCC) by the PCCC encoder 156, and are then output to the group formatter 130 as signaling data.

The known data is a sequence that is commonly known to the digital broadcast transmitter and the digital broadcast receiver, as described above. The group formatter 130 inserts the known data into an appropriate location according to a control signal provided from an additional element, such as the controller 310, so that the known data is placed in an appropriate location in the stream after being interleaved by the exciter unit 400. For example, the known data may be inserted into an appropriate location so as to be placed even in the area "B" of the stream of b) of FIG. 1. The group formatter 130 determines a location where the known data is to be inserted with reference to an interleaving rule.

The initial data refers to data based on which the trellis encoder 450 provided in the exciter unit 400 initializes internal memories at a proper time. The initial data will be described in detail when the exciter unit 400 is described.

The group formatter 130 may include a group format configuring unit (not shown) to insert various areas and signals into the stream and configure the stream as a group format, and a data deinterleaver to deinterleave the stream configured as the group format.

The data deinterleaver rearranges data in the reverse order of the interleaver 430 located at the rear end with reference to the stream. The stream deinterleaved by the data deinterleaver may be provided to the packet formatter 140.

The packet formatter 140 may remove diverse place holders which are provided to the stream by the group formatter 130, and may add an MPEG header having a packet identifier (PID) of mobile data to the stream. Accordingly, the packet formatter 140 outputs the stream in the unit of a predetermined number of packets for every group. For example, the packet formatter 140 may output 118 TS packets.

The data pre-processor 100 is implemented in various ways as described above to configure mobile data in an appropriate form. For example, in the case that a plurality of mobile services is provided, each element of the data pre-processor 100 may be a plurality of elements.

The multiplexer 200 multiplexes a normal stream processed by the normal processor 320 and a mobile stream processed by the data pre-processor 100, thereby configuring a transport stream. The transport stream output from the multiplexer 200 includes normal data and mobile data and may further include known data to improve reception performance.

The exciter unit 400 performs encoding, interleaving, trellis encoding, and modulation with respect to the transport stream configured by the multiplexer 200, and outputs the processed transport stream. The exciter unit 400 may be referred to as a data post-processor in some exemplary embodiments.

Referring to FIG. 4, the exciter unit 400 includes a randomizer 410, an RS encoder 420, an interleaver 430, a parity replacement unit 440, a trellis encoding unit 450, an RS re-encoder 460, a sync multiplexer 470, a pilot insertion unit 480, an 8-VSB modulator 490, and an RF upconverter 495.

The randomizer 410 randomizes the transport stream output from the multiplexer 200. The randomizer 410 may perform the same function as a randomizer according to the ATSC standard.

The randomizer 410 may perform an XOR operation with respect to the MPEG header of the mobile data and the entire normal data with a pseudo random binary sequence (PRBS) which may be 16 bits long or longer, but may not perform an XOR operation with respect to a payload byte of the mobile data. However, even in this case, a PRBS generator continues to perform shifting of a shift register. That is, the randomizer 410 bypasses the payload byte of the mobile data.

The RS encoder 420 performs RS encoding with respect to the randomized stream.

More specifically, if a portion corresponding to the normal data is input, the RS encoder 420 performs systematic RS encoding in the same way as in a related art ATSC system. That is, the RS encoder 420 adds a parity of 20 bytes to an end of each packet of 187 bytes. On the other hand, if a portion corresponding to the mobile data is input, the RS encoder 420 performs non-systematic RS encoding. In this case, the RS FEC data of 20 bytes, which is obtained by the non-systematic RS encoding, is placed in a predetermined parity byte location within each packet of the mobile data. Accordingly, the data has a compatibility with a receiver according to the related art ATSC standard.

The interleaver 430 interleaves the stream encoded by the RS encoder 420. Interleaving may be performed in the same way as in a conventional ATSC system. That is, the interleaver 430 selects a plurality of channels, which are made up of different numbers of shift registers, in sequence using a switch and performs writing and reading of the data. As a result, a predetermined number of interleavings are performed according to the number of shift registers in a corresponding channel.

The parity replacement unit 440 corrects the parity that is changed as a result of initializing memories by the trellis encoding unit 450 at the rear end of the stream.

That is, the trellis encoding unit 450 receives the interleaved stream and performs trellis encoding. The trellis encoding unit 450 uses 12 trellis encoders in general. Accordingly, the trellis encoding unit 450 may use a demultiplexer to divide the stream into 12 independent streams and output the streams to the trellis encoders and a multiplexer to combine the streams trellis-encoded by the trellis encoders into a single stream.

Each of the trellis encoders uses a plurality of internal memories to perform trellis encoding by performing a logical operation with respect to a newly input value and a value pre-stored in the internal memory.

As described above, the transport stream may include known data. The known data refers to a sequence that is commonly known to the digital broadcast transmitter and the digital broadcast receiver. The digital broadcast receiver checks the state of the received known data and determines a degree of error correction accordingly. The known data may be transmitted in a state as known to the digital broadcast receiver. However, since the value stored in the internal memory provided in the trellis encoder is not known, the internal memories are initialized to an arbitrary value prior to the known data being input to the trellis encoder. Accordingly, the trellis encoding unit 450 initializes the memory prior to trellis encoding the known data. The memory initialization may be referred to as a "trellis reset."

Figure 10:
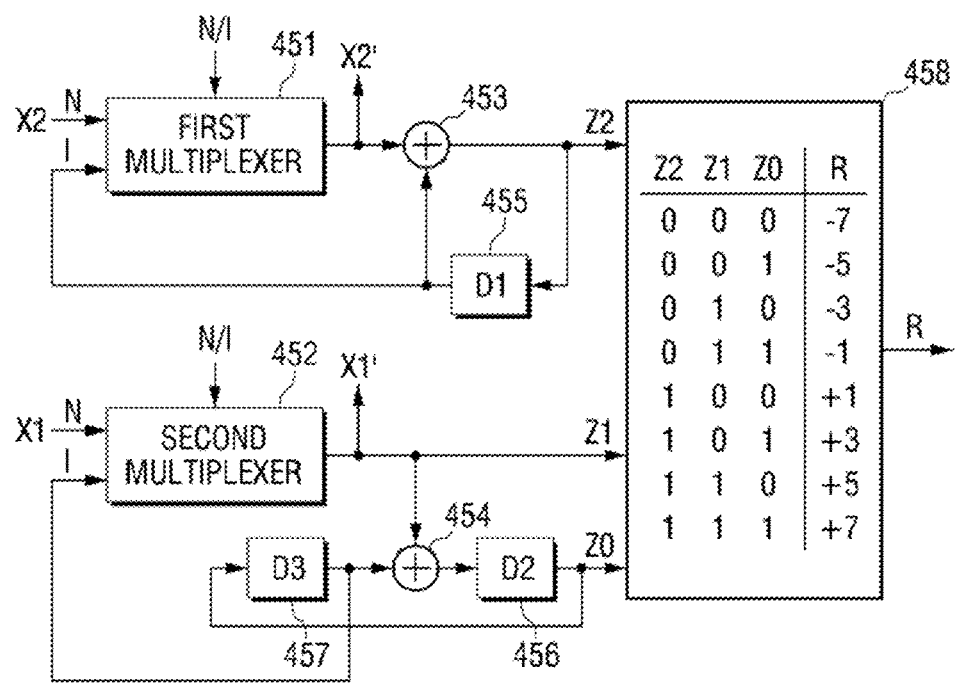
FIGS. 10 to 13 are views illustrating diverse examples of a trellis encoder.

FIG. 10 is view illustrating an example of one of the plurality of trellis encoders provided in the trellis encoding unit 450.

Referring to FIG. 10, the trellis encoder includes a first multiplexer 451, a second multiplexer 452, a first adder 453, a second adder 454, a first memory 455, a second memory 456, a third memory 457, and a mapper 458.

The first multiplexer 451 receives data N of the stream and a value I stored in the first memory 455 and outputs a single value N or I according to a control signal N/I. More specifically, a control signal to select I is applied when a value corresponding to an initialization data section is input so that the first multiplexer 451 outputs I. N is output in the other section. Likewise, the second multiplexer 452 outputs I when a value corresponding to an initialization data section is input.

Accordingly, if a value corresponding to a section other than the initialization data section is input, the first multiplexer 451 outputs the input value to the rear end as is. The output value is input to the first adder 453 along with a value pre-stored in the first memory 455. The first adder 453 performs a logical operation such as XOR with respect to the input values and outputs Z2. In this state, if a value corresponding to the initialization data section is input, the value stored in the first memory 455 is selected by the first multiplexer 451 and output. Accordingly, since the two same values are input to the first adder 453, a value of the logical operation is a constant value. That is, the XOR produces a 0 output. Since the output value from the first adder 453 is input to the first memory 455 as is, the first memory 455 is initialized to a value 0.

If a value corresponding to the initialization data section is input, the second multiplexer 452 selects a value stored in the third memory 457 as is and outputs the value. The output value is input to the second adder 454 along with a value stored in the third memory 457. The second adder 454 performs a logical operation with respect to the two same values and outputs a resulting value to the second memory 456. Since the values input to the second adder 454 are the same, a logical operation value for the same values (for example, a result value 0 of XOR) is input to the second memory 456. Accordingly, the second memory 456 is initialized. On the other hand, the value stored in the second memory 456 is shifted to and stored in the third memory 457. Accordingly, when next initialization data is input, a current value of the second memory 456, that is, a value 0, is input to the third memory 457 as is so that the third memory 457 is also initialized.

The mapper 458 receives the values output from the first adder 453, the second multiplexer 452, and the second memory 456, and maps these values onto a corresponding symbol value R and outputs the mapped values. For example, if Z0, Z1, and Z2 are output as 0, 1, and 0, the mapper 458 outputs a −3 symbol.

Since the RS encoder 420 is located before the trellis encoding unit 450, a parity has already been added to the value input to the trellis encoding 450. Accordingly, the parity is changed according to the change in some value of data caused by the initialization at the trellis encoder 450.

Specifically, the RS reencoder 460 changes the value of the initialization data section using X1' and X2' output from the trellis encoding unit 450, thereby generating a new parity. The RS reencoder 460 may be referred to as a non-systematic RS encoder.

Although in an exemplary embodiment of FIG. 10, the memory is initialized to a value "0," the memory may be initialized to another value in another exemplary embodiment.

Figure 11:
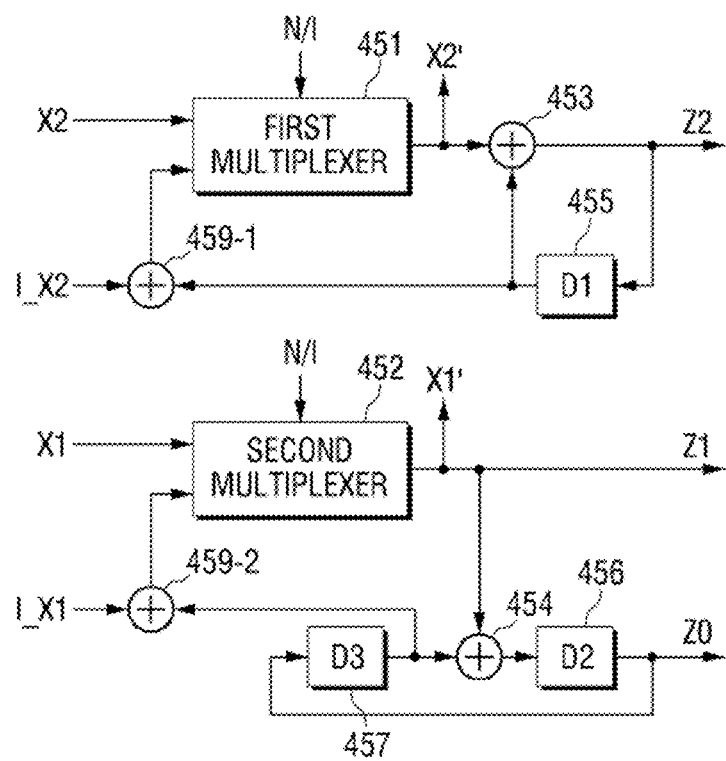

FIG. 11 is a view illustrating a trellis encoder according to another exemplary embodiment.

Referring to FIG. 11, the trellis encoder includes a first multiplexer 451, a second multiplexer 452, first through fourth adders 453, 454, 459-1, 459-2, and first through third memories 455, 456, 457. The mapper 458 is omitted from FIG. 11.

The first multiplexer 451 may output one of a stream input value X2 and a value of the third adder 459-1. The third adder 459-1 receives I_X2 and a storage value of the first memory 455. The I_X2 refers to a memory reset value input from an external source. For example, in order to initialize the first memory 455 to "1," I_X2 is input as "1." If the first memory 455 stores a value "0," the third adder 459-1 outputs a value "1" and, thus, the first multiplexer 451 outputs a value "1." Accordingly, the first adder 453 performs XOR with respect to the output value "1" from the first multiplexer 451 and the storage value "0" in the first memory 455 and stores a resulting value "1" in the first memory 455. As a result, the first memory 455 is initialized to "1."

Likewise, the second multiplexer 452 selects the output value from the fourth adder 459-2 in the initialization data section and outputs the value. The fourth adder 459-2 outputs a resulting value of XOR for a memory reset value I_X1 input from an external source and a value of the third memory 457. Assuming that the second memory 456 and the third memory 457 store values "1" and "0," respectively, and the second memory 456 and the third memory 457 are intended to be initialized to "1" and "1," respectively, the second multiplexer 452 outputs a resulting value "1" of XOR for the value "0" stored in the third memory 457 and the I_X1 value "1." The output value "1' is input to the second adder 454 and the second adder 454 outputs a resulting value "1" of XOR for the value "1" and the value "0" stored in the third memory 457 to the second memory 456. The original value "1" stored in the second memory 456 is shifted to the third memory 457 so that the third memory 457 is initialized to "1." In this state, if the second I_X1 is input as "1" too, a resulting value "0" of XOR for the input value "1" and the value "1" of the third memory 457 is output from the second multiplexer 452. The second adder 454 performs an XOR operation on the value "0" output from the second multiplexer 452 and the value "1" stored in the third memory 457, thereby producing a resulting value "1," and inputs the resulting value "1" to the second memory 456. The value "1" stored in the second memory 456 is shifted to and stored in the third memory 457. As a result, the second memory 456 and the third memory 457 are both initialized to "1."

Figure 12:
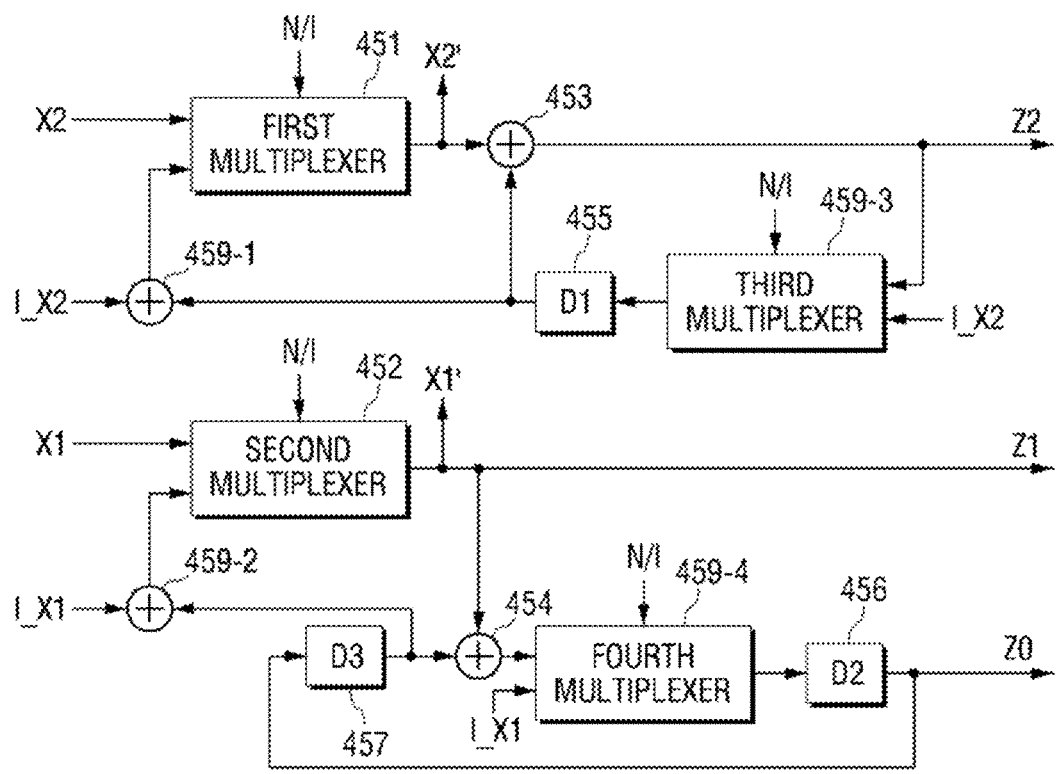
Figure 13:
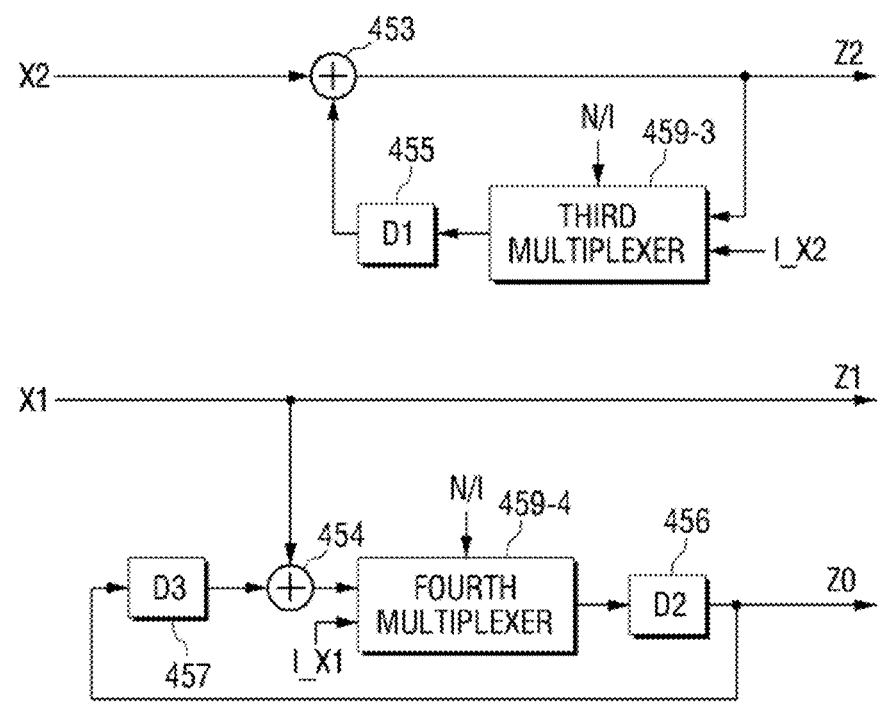

FIGS. 12 and 13 illustrate a trellis encoder according to various exemplary embodiments.

Referring to FIG. 12, the trellis encoder may further include a third multiplexer 459-3 and a fourth multiplexer 459-4 in addition to the configuration of FIG. 11. The third and the fourth multiplexers 459-3 and 459-4 output values output from the first and the second adders 453 and 454 or values I_X2 and I_X1 according to the control signal N/I. Accordingly, the first through the third memories 455, 456, 457 can be initialized to a desired value.

FIG. 13 illustrates a trellis encoder with a more simplified configuration. Referring to FIG. 13, the trellis encoder may include first and second adders 453, 454, first through third memories 455, 456, 457, and third and fourth multiplexers 459-3, 459-4. Accordingly, the first through the third memories 455, 456, 457 are initialized according to the values I_X1 and I_X2 input to the third and the fourth multiplexers 459-3 and 459-4. That is, referring to FIG. 13, the values I_X2 and I_X1 are input to the first memory 455 and the second memory 456 as they are so that the first memory 455 and the second memory 456 are initialized to the values I_X2 and I_X1.

A further detailed description of the trellis encoder of FIGS. 12 and 13 is omitted.

Referring back to FIG. 4, the sync multiplexer 470 adds a field sync and a segment sync to the stream trellis-encoded by the trellis encoding unit 450.

As described above, if the data pre-processor 100 places the mobile data even in the packets allocated to the normal data, the digital broadcast transmitter should inform the digital broadcast receiver that there exists new mobile data. The existence of new mobile data may be informed in various ways, one of which is a method using a field sync. This will be described in detail below.

The pilot insertion unit 480 inserts a pilot into the transport stream that is processed by the sync multiplexer 470, and the 8-VSB modulator 490 modulates the transport stream according to an 8-VSV modulation scheme. The RF upconverter 495 converts the modulated stream into an upper RF band signal for transmission and transmits the converted signal through an antenna.

As described above, the transport stream is transmitted to the receiver with the normal data, the mobile data, and the known data being included therein.

Figure 14:
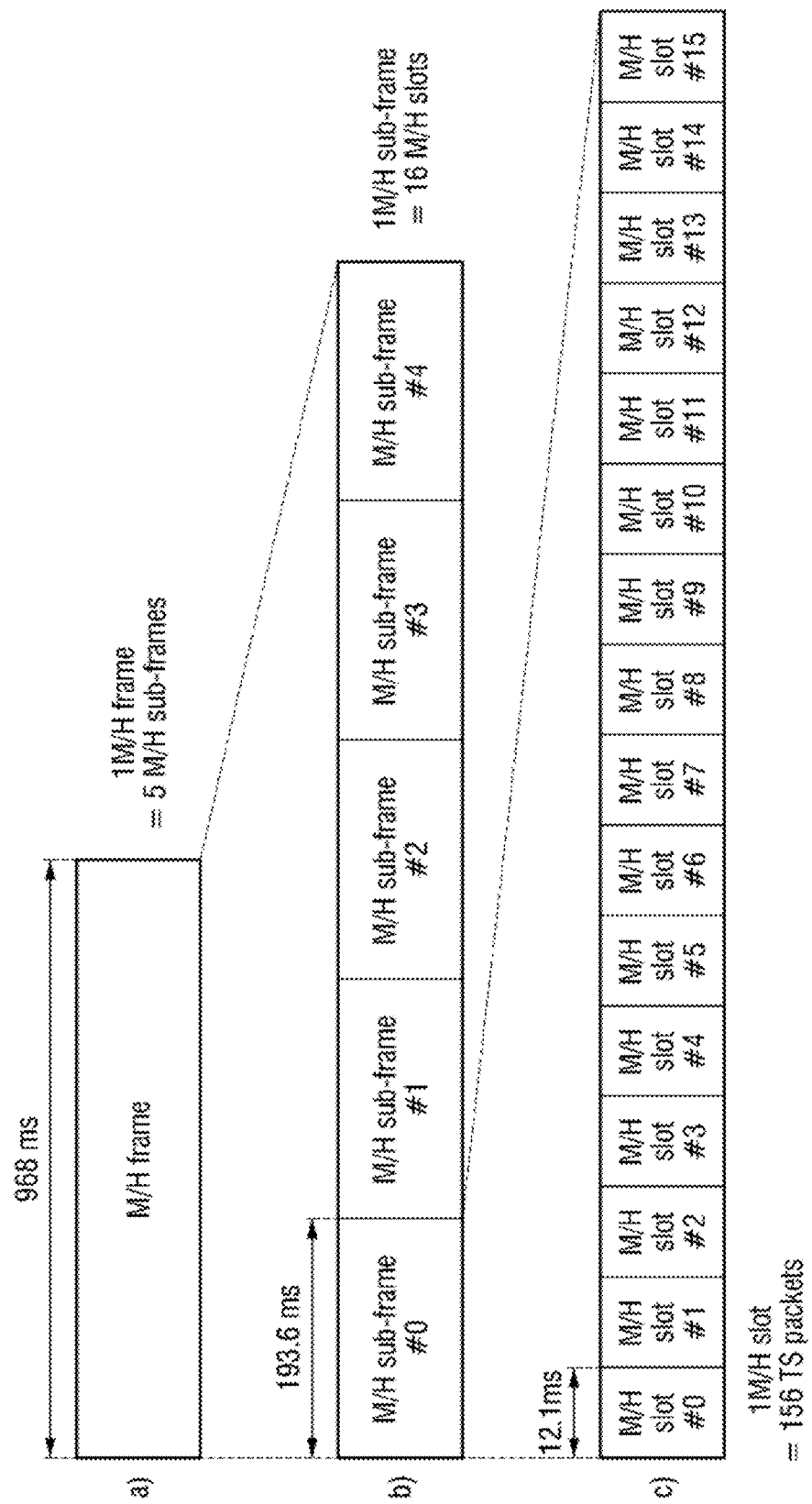
FIG. 14 is a view illustrating an example of a structure of a mobile data frame.

FIG. 14 is a view to explain a unit structure of a mobile data frame, that is, an M/H frame of the transport stream. Referring to a) and b) of FIG. 14, one M/H frame has a size of 968 ms in total in a time unit and is divided into 5 sub-frames. One sub-frame has a time unit of 193.6 ms and is divided into 16 slots as shown in c) of FIG. 14. Each slot has a time unit of 12.1 ms and includes 156 transport stream packets in total. As described above, 38 of these packets are allocated to the normal data and the remaining 118 packets are allocated to the mobile data. That is, one M/H group is made up of 118 packets.

In this state, the data pre-processor 100 places the mobile data and the known data even in the packets allocated to the normal data, thereby improving transmission efficiency of data and reception performance.

[Various Exemplary Embodiments of Changed Transport Stream]

FIGS. 15 to 21 are views illustrating configurations of a transport stream according to various exemplary embodiments.

Figure 15:
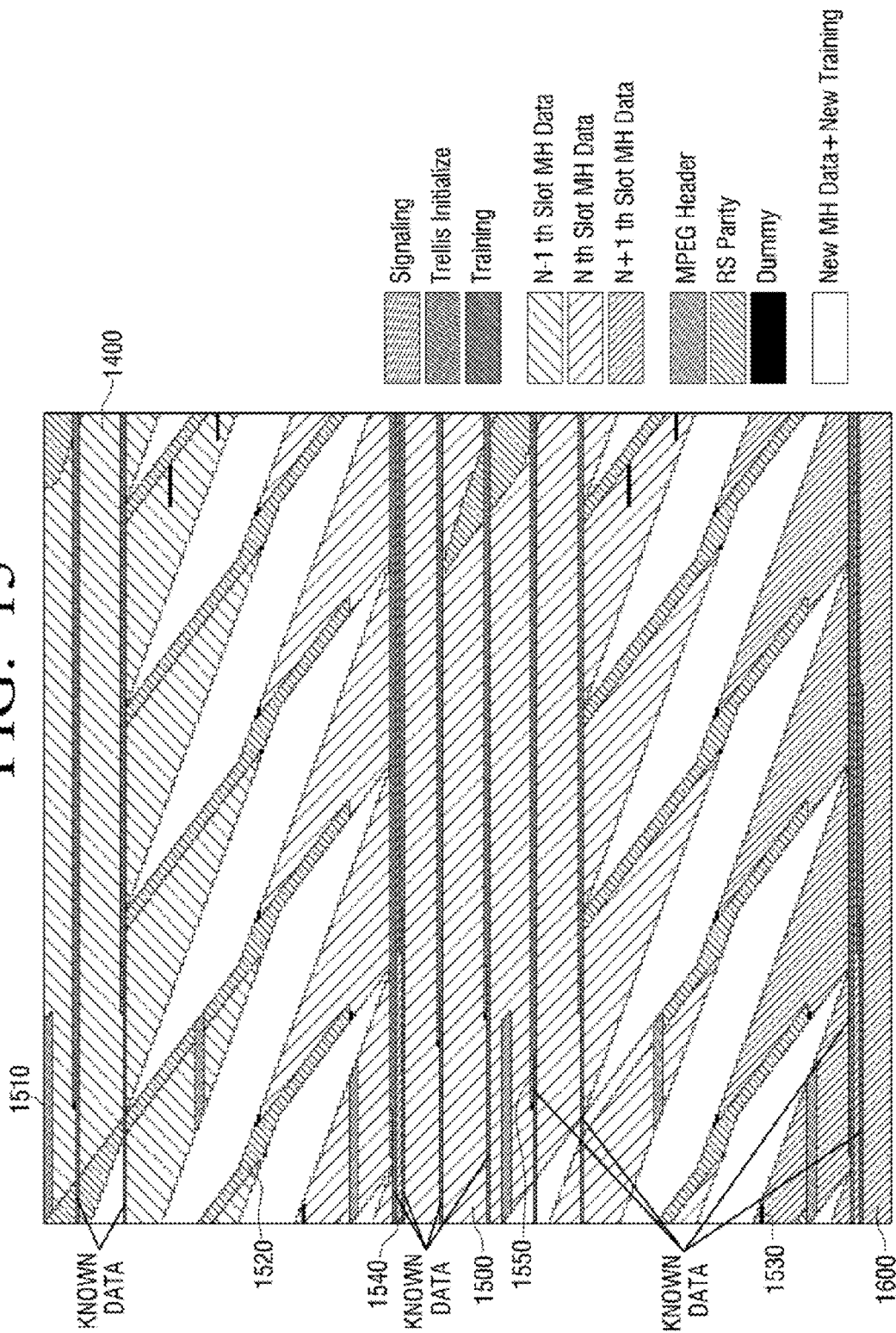
FIGS. 15 to 21 are views illustrating examples of configurations of a stream according to various exemplary embodiments.

FIG. 15 illustrates a simple variation configuration of a transport stream. That is, FIG. 15 illustrates a stream configuration after interleaving in a situation where the mobile data is placed in the packets allocated to the normal data, that is, in the second area. In the stream of FIG. 15, known data is placed in the second area along with the mobile data.

Accordingly, even the portion which is not used for mobile data in the related-art ATSC-MH, that is, 38 packets, may be used for mobile data. Also, since the second area is used independently from the first mobile data area (first area), one or more additional services may be provided. If new mobile data is to be used as the same service as the first mobile data, data transmission efficiency can be further improved.

If the new mobile data and the known data are transmitted together as shown in FIG. 15, the digital broadcast receiver may be notified of the existence or location of the new mobile data and the known data using singling data or field sync.

Placing the mobile data and the known data may be performed by the data pre-processor 100. More specifically, the group formatter 130 of the data pre-processor 100 may place the mobile data and the known data even in the 38 packets.

It can be seen from FIG. 15 that the known data is placed in the body area where the first mobile data are collected in the pattern of 6 long training sequences. Also, the signaling data is located between the first and the second long training sequences for the sake of achieving error robustness of the signaling data. On the other hand, the known data may be placed in the packets allocated to the normal data in a distributed pattern other than the long training sequence pattern.

As shown in FIG. 15, the transport stream may include an MPEG header portion 1510, an RS parity area 1520, a dummy area 1530, signaling data 1540, and initialization data 1550. It can be seen from FIG. 15 that the initialization data is located right before the known data. The initialization data refers to data corresponding to the initialization data section. Also, the transport stream may further include N−$1^{st}$ slot M/H data 1400, Nth slot M/H data 1500, and N+$1^{st}$ slot M/H data 1600.

Figure 16:
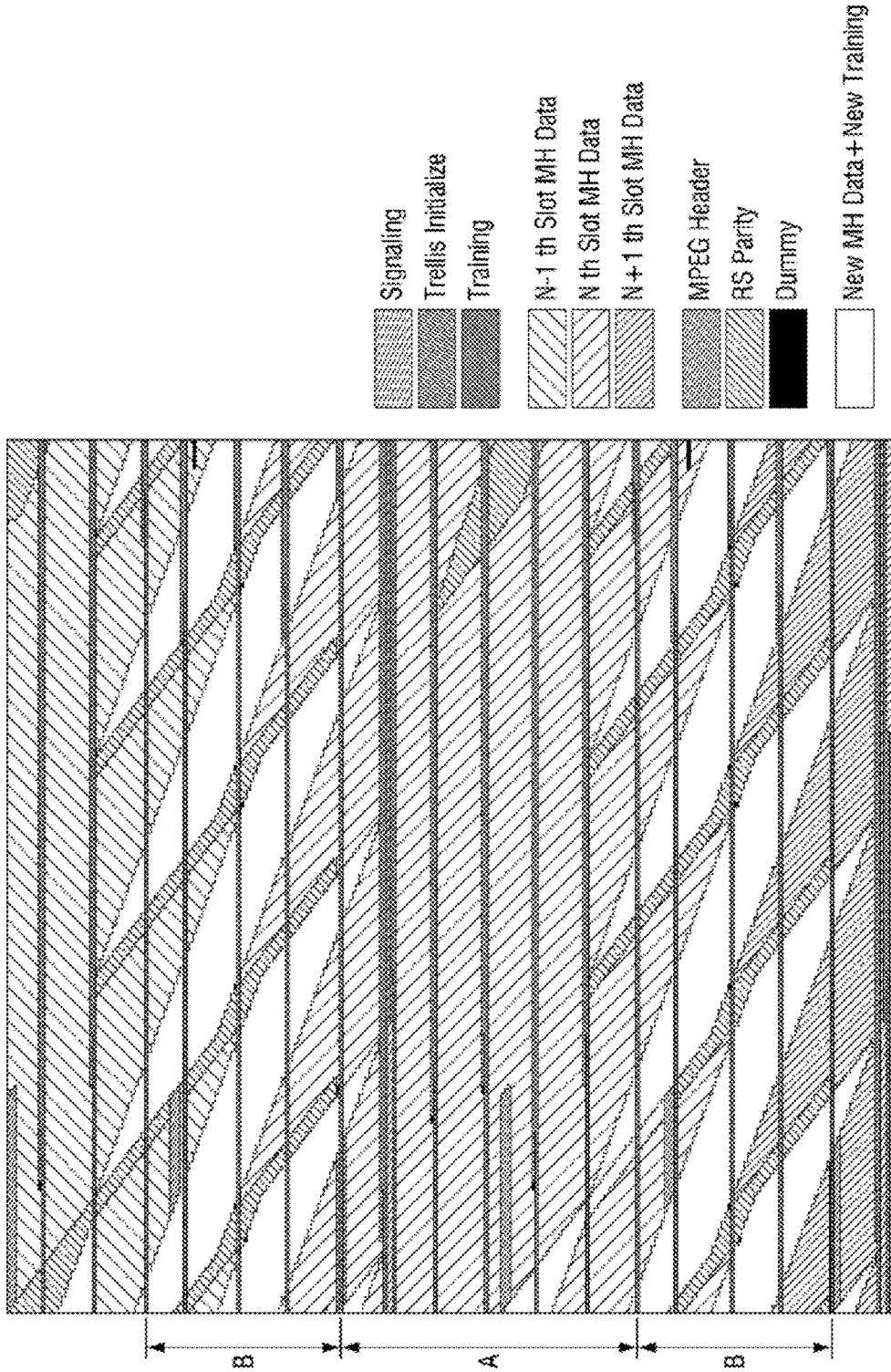

FIG. 16 illustrates a configuration of a transport stream for transmitting the mobile data and the known data using both the packets allocated to the normal data, i.e., the second area, and a part of the first area allocated to the first mobile data.

Referring to FIG. 16, in the area "A," i.e., the body area where the conventional mobile data is collected, the known data is arranged in a pattern of 6 long training sequences. Also, in the area "B," the known data is arranged in a pattern of long training sequences. In order to arrange the known data in the area "B" in the pattern of long training sequences, the known data is included in not only the 38 packets area but also some of 118 packets allocated to the first mobile data. New mobile data is placed in the remaining area of the 38 packets not including the known data. Accordingly, the area "B" shows improved error correction performance.

On the other hand, by newly adding known data to a part of the area for the first mobile data, an additional process such as adding information regarding a location of the new known data to the existing signaling data and configuring a header of the existing mobile packet into which the new known data is inserted in a format that cannot be recognized by a related art mobile data receiver, such as a null packet format, may be performed for the sake of obtaining compatibility with the related art mobile data receiver. Accordingly, the related art mobile data receiver does not malfunction because the related art mobile data receiver does not recognize the newly added known data.

Figure 17:
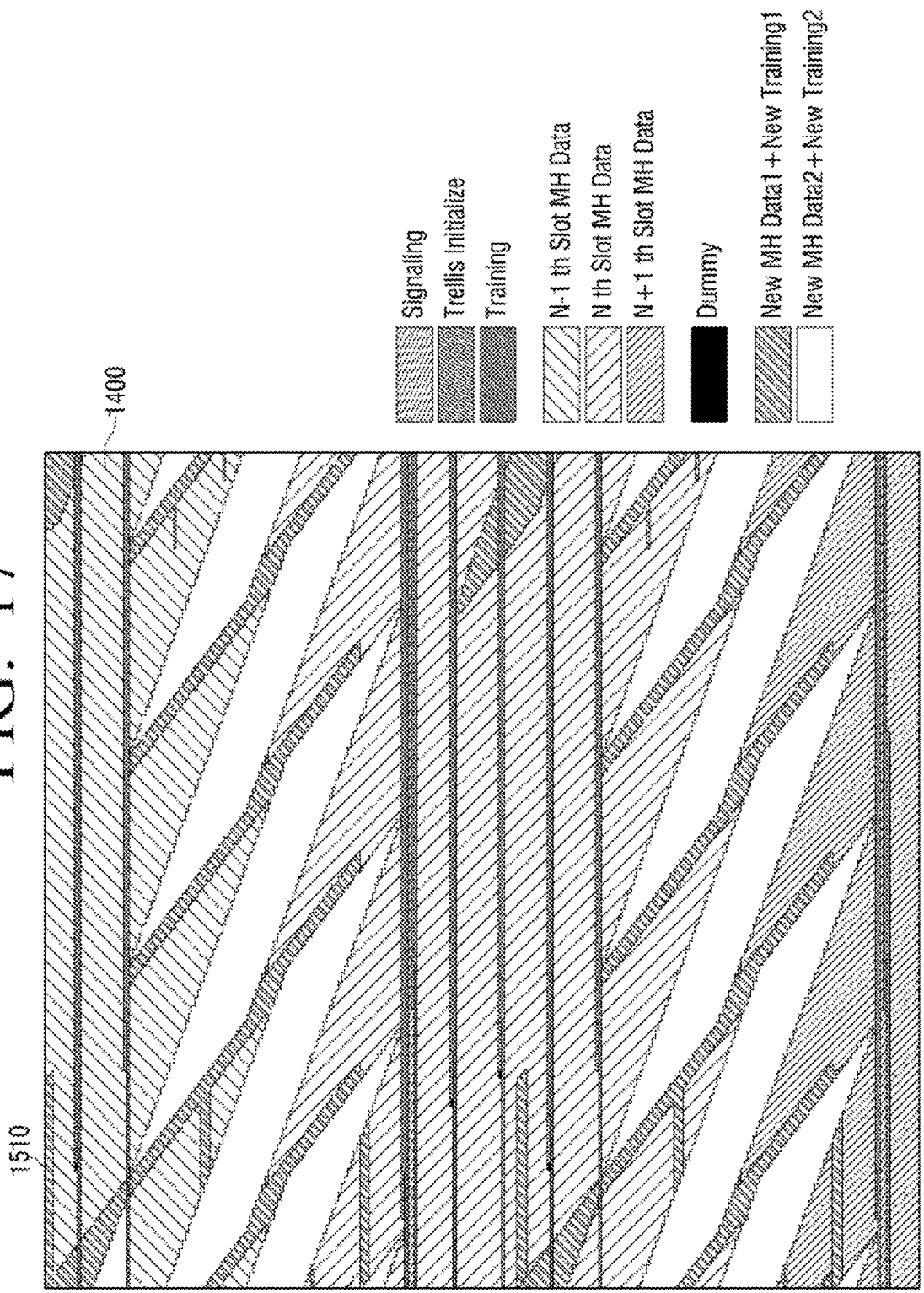

FIG. 17 illustrate a configuration of a stream in which at least one of mobile data and known data is placed even in a location such as the MPEG header, the RS parity, at least a part of the dummy, and the existing M/H data. In this case, a plurality of new mobile data can be placed according to locations.

That is, it can be seen from FIG. 17 that new mobile data and new known data are placed in the MPEG header, the RS parity, and a part of the dummy. The mobile data inserted in the aforementioned location may be different from or the same as the mobile data inserted into the normal data packet.

The new mobile data may be located in all of the first mobile data area in addition to the aforementioned location.

The stream shown in FIG. 17 contributes to a high transmission efficiency of the mobile data and the known data compared to those of FIGS. 15 and 16. In particular, the stream of FIG. 17 makes it possible to provide a plurality of mobile data.

Also, in the case of the stream of FIG. 17, it can be notified whether new mobile data is added or not by including new signaling data to the new mobile data area using existing signaling data or field sync.

Figure 18:
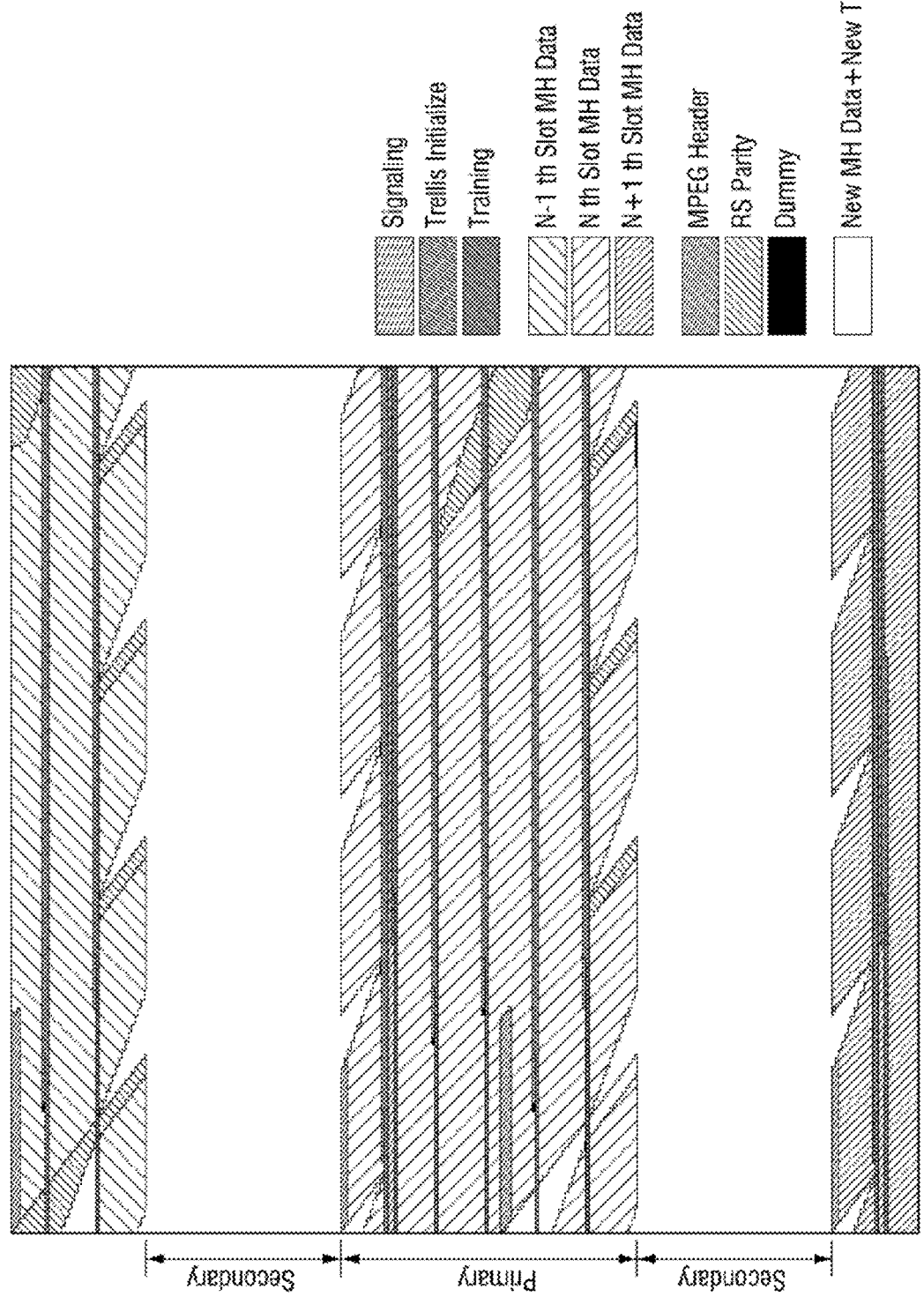

FIG. 18 illustrates a configuration of a stream in which new mobile data and new known data are inserted into the area "B," that is, the first area corresponding to the secondary service area, in addition to the second area.

As shown in FIG. 18, the entire stream is divided into primary service areas and secondary service areas. The primary service area may be referred to as a body area and the secondary service area may be referred to as a head/tail area. Since the head/tail area does not include known data and includes data of different slots in a distributed pattern, the head/tail area shows poor performance compared to the body area. Accordingly, new mobile data and new known data may be inserted into the head/tail area. The known data may be arranged in a pattern of long training sequences like in the body area, though it is understood that another exemplary embodiment is not limited thereto. That is, the known data may be arranged in a distributed pattern or in a combination of the pattern of long training sequences and the distributed pattern.

On the other hand, as the first mobile data area is used as an area for new mobile data, it is possible to maintain the compatibility with a receiver conforming to the related art ATSC-MH standard by configuring a header of the packet of the area including the new mobile data or the new known data of the existing mobile data area in a format that cannot be recognized by the receiver.

Also, the existence of the new mobile data and the known data may be notified using signaling data.

Figure 19:
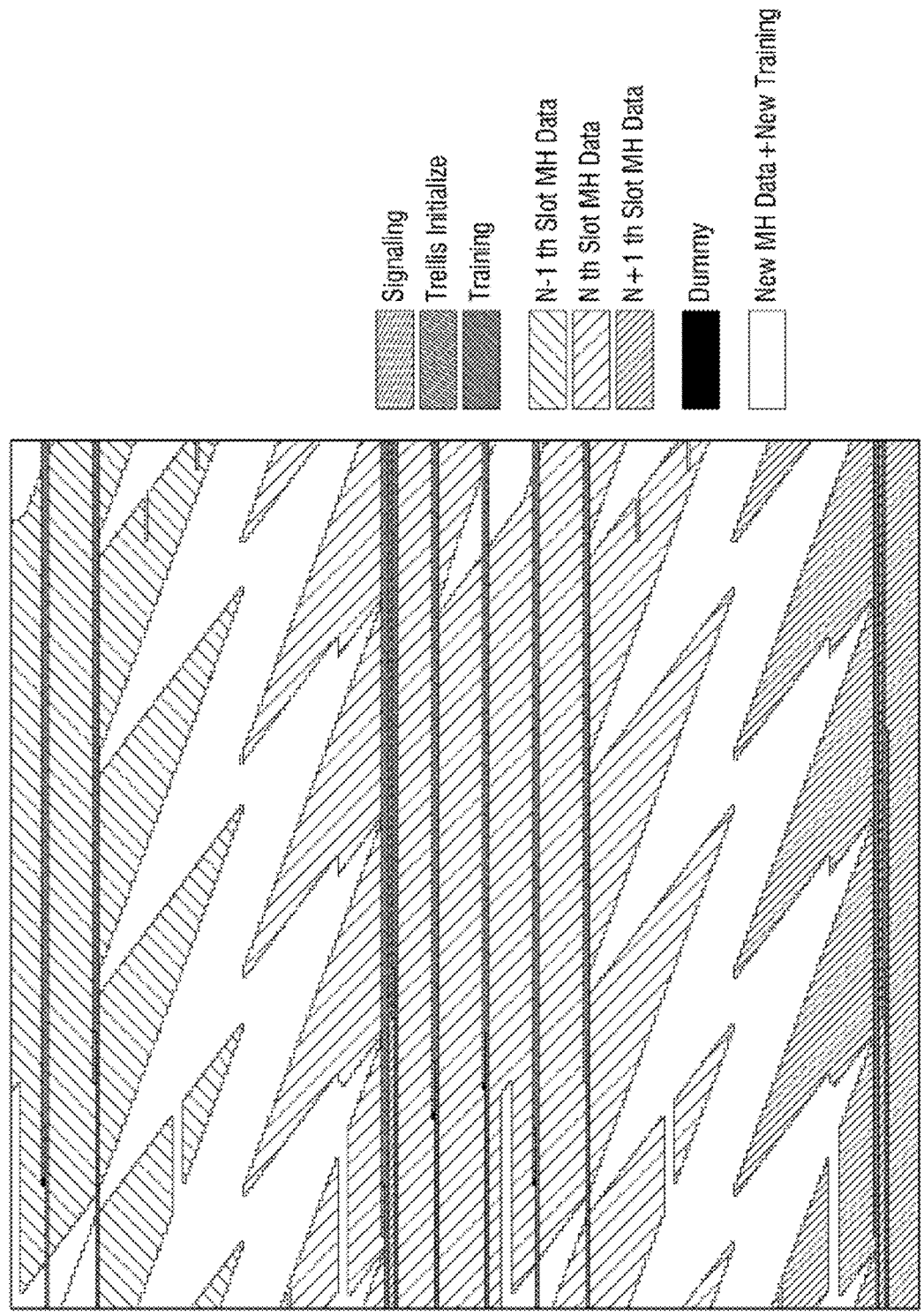

FIG. 19 illustrates an example of a transport stream for transmitting new mobile data and known data using all of the related art normal data area, the MPEG header, the RS parity area, at least a part of the dummy of the first mobile data, and the first mobile data area. FIG. 17 illustrates a case where another new mobile data different from the new mobile data located in the normal data area is transmitted using the aforementioned areas, but FIG. 19 illustrates a case where the same new mobile data is transmitted using all of the aforementioned portions and the normal data area.

Figure 20:
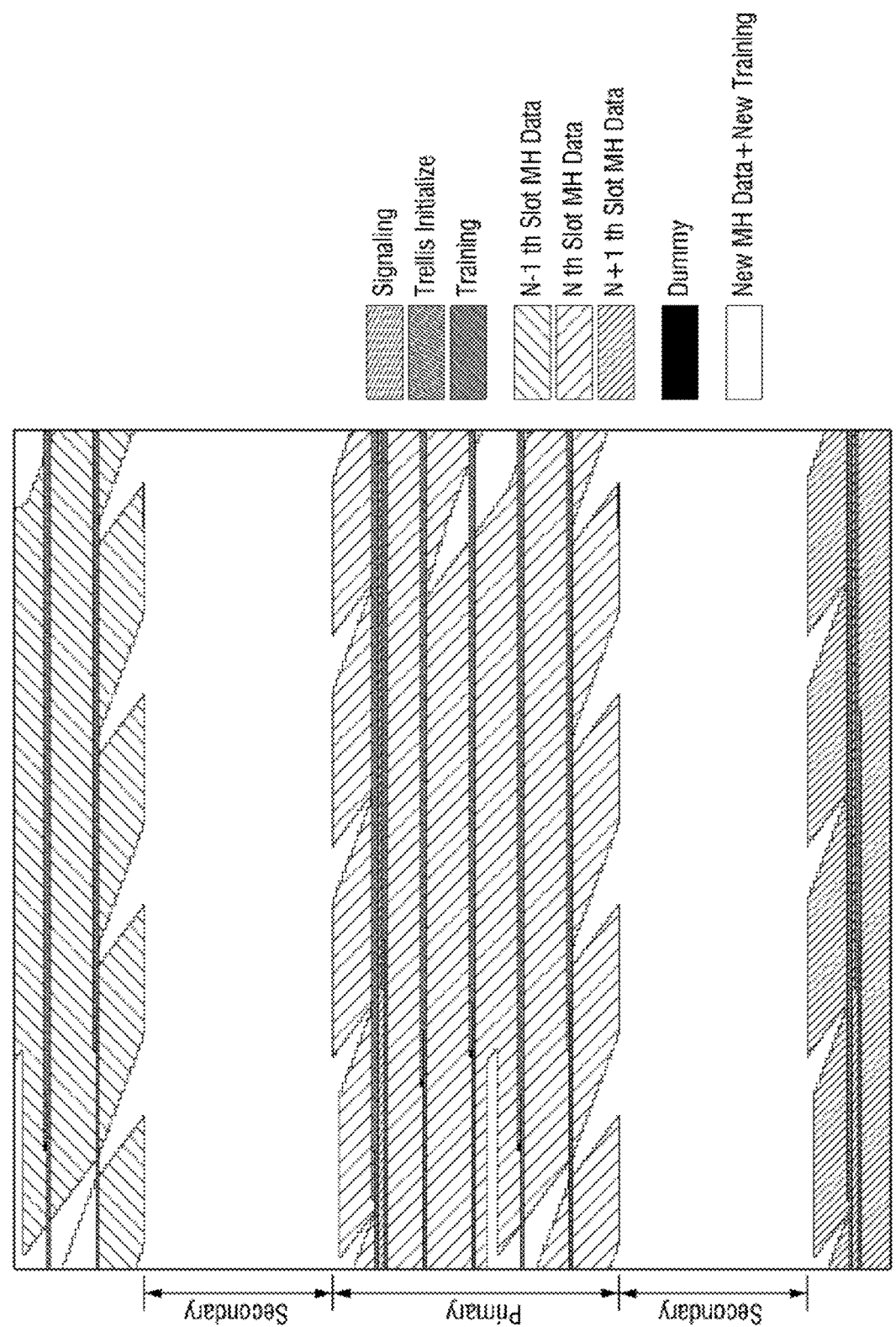

FIG. 20 illustrates an example of a transport stream in the case that new mobile data and known data are transmitted using all of the entire area "B," the normal data area, the MPEG header, the RS parity area, and at least a part of the dummy of the first mobile data.

Like in the above-described case, the portion including the new mobile data and the known data may be made unrecognized by the receiver for the sake of achieving the compatibility with the related art receiver.

Figure 21:
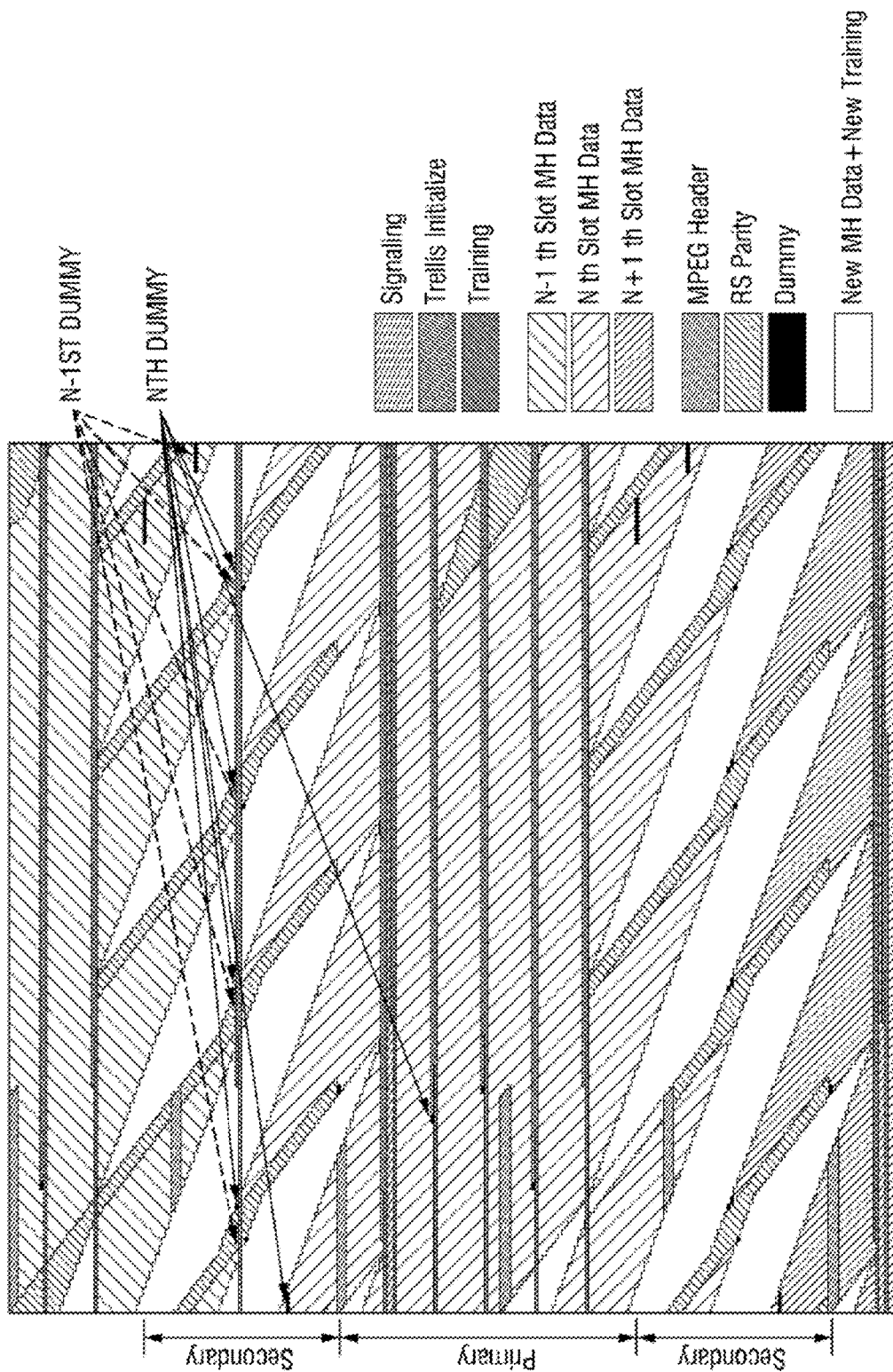

FIG. 21 illustrates configuration of a transport stream in the case that the dummy of the area used for the first mobile data is replaced with a parity or an area for new mobile data and the mobile data and the known data are placed using the replaced dummy and normal data area. Referring to FIG. 21, a dummy of an N−$1^{st}$ slot and a dummy of an Nth slot are illustrated.

As described above, FIGS. 15 to 21 illustrate the stream after interleaving. The data pre-processor 100 places the mobile data and the known data in appropriate locations so as to have the stream configuration of FIGS. 15 to 21 after interleaving.

More specifically, the data pre-processor 100 places the mobile data in the normal data area, that is, in the 38 packets in a predetermined pattern in the stream shown in a) of FIG. 1. In this case, the mobile data may be placed in the entire payload of the packet or in some area of the packet. Also, the mobile data may be placed in an area which corresponds to a head or a tail of the existing mobile area after interleaving.

The known data may be placed in the mobile data packet or the normal data packet. In this case, the known data may be arranged continuously or intermittently in a vertical direction as in a) of FIG. 1 so that the known data is arranged in the pattern of long training sequences or similar long training sequences in a horizontal direction after interleaving.

Also, the known data may be placed in a distributed pattern other than the pattern of long training sequences. Hereinafter, various examples of arrangements of the known data will be described.

[Arrangement of Known Data]

As described above, the known data is placed in an appropriate location by the group formatter 130 of the data pre-processor 100 and is then interleaved by the interleaver 430 of the exciter unit 400 along with a stream. FIGS. 22 to 28 are views to explain how to place known data according to various exemplary embodiments.

Figure 22:
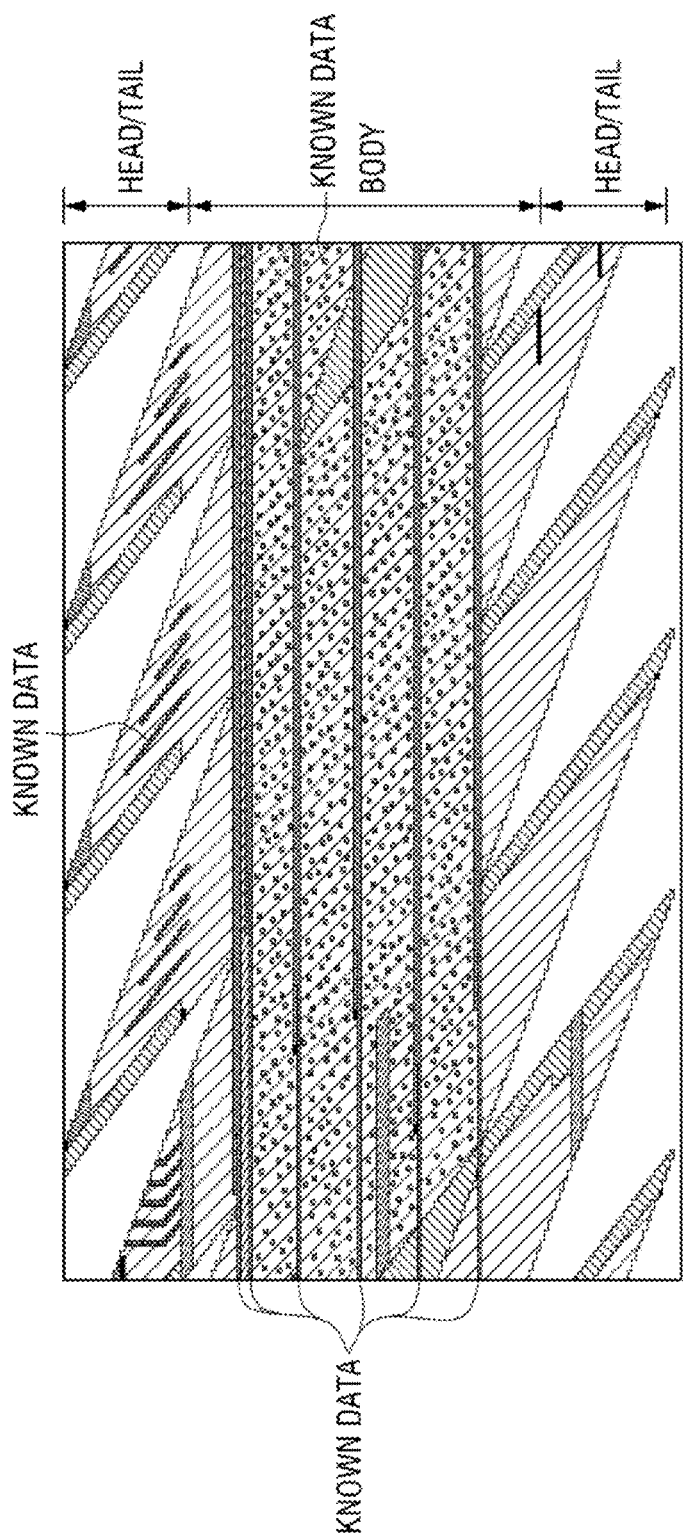
FIGS. 22 to 28 are views illustrating configurations of a known data insertion pattern according to various exemplary embodiments.

FIG. 22 illustrates known data that is additionally placed in a conical part within the head/tail area along with distributed-type known data being placed in the body area along long training sequences. By newly adding known data while maintaining related art known data as is, synchronization, channel estimation performance, and equalization performance can be improved.

Placing the known data as shown in FIG. 22 is performed by the group formatter 130. The group formatter 130 may determine a location where the known data is to be inserted in consideration of an interleaving rule of the interleaver 430. Different interleaving rules may be applied according to various exemplary embodiments, and the group formatter 130 can determine an appropriate location of the known data according to the interleaving rule. For example, if known data of a predetermined size is inserted into a part of payload or a separate field every $4^{th}$ packet, the known data distributed in a uniform pattern may be obtained by interleaving.

Figure 23:
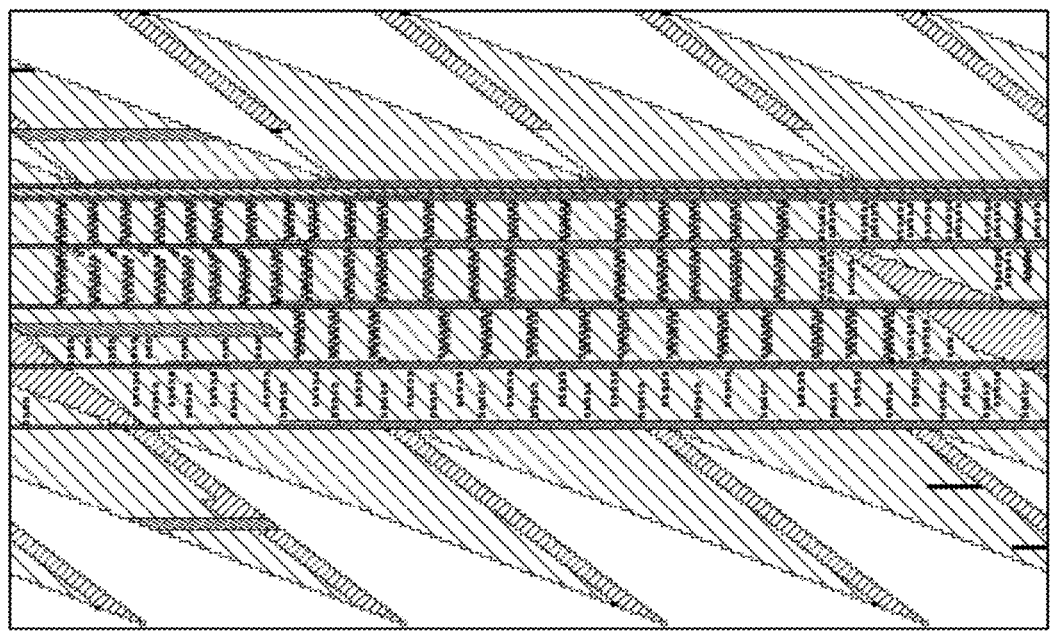

FIG. 23 illustrates a configuration of a stream in which known data is inserted in a different way according to another exemplary embodiment.

Referring to FIG. 23, distributed known data is not placed in the conical area but is placed only in the body area along with long training sequences.

Figure 24:
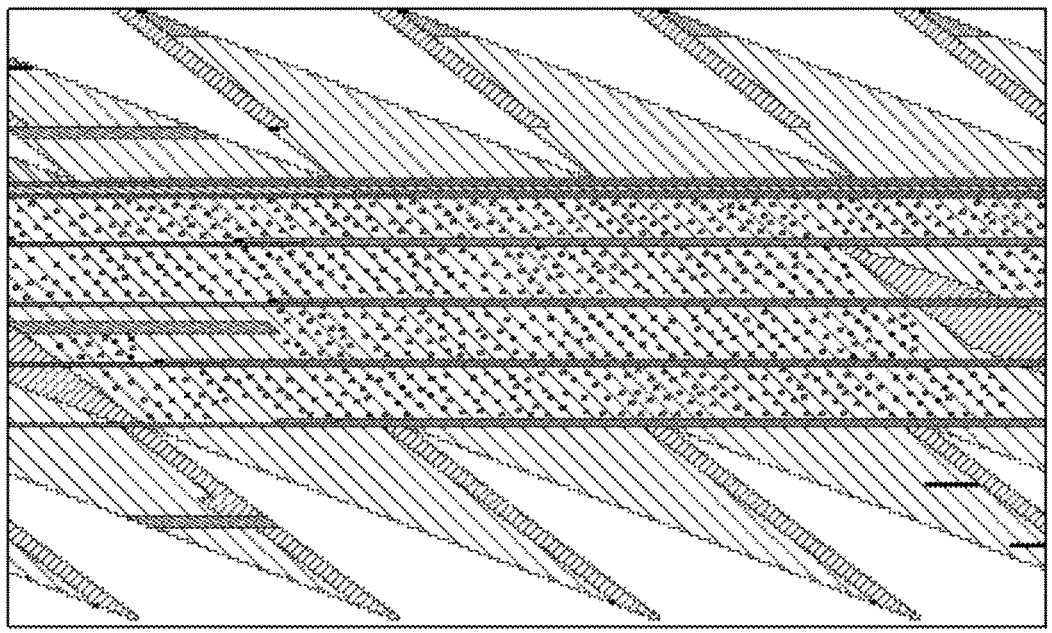

FIG. 24 illustrates a configuration of a stream in which the length of the long training sequence is reduced compared to that of FIG. 23 and distributed known data is placed as much as the number of reduced long training sequences. Accordingly, the data transmission efficiency remains the same and Doppler tracking performance is improved.

Figure 25:
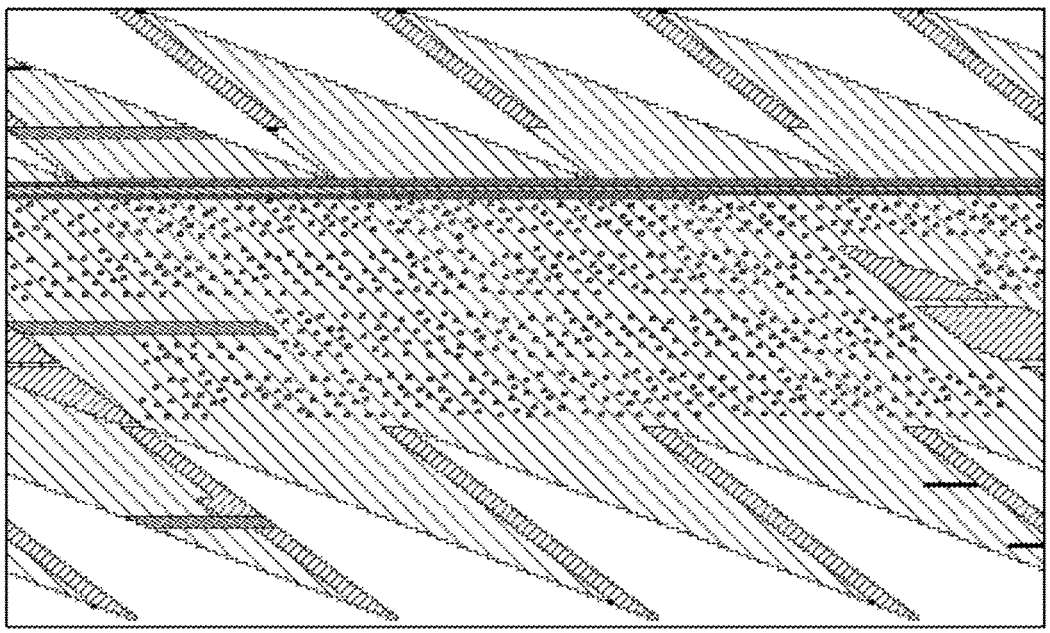

FIG. 25 illustrates a configuration of a stream in which known data is inserted in another different way according to another exemplary embodiment.

Referring to FIG. 25, a first one of 6 long training sequences in the body area remains as is and the remaining sequences are replaced for distributed known data. Accordingly, initial synchronization and channel estimation performance can be maintained due to the first long training sequence from which the body area starts and also the Doppler tracking performance can be improved.

Figure 26:
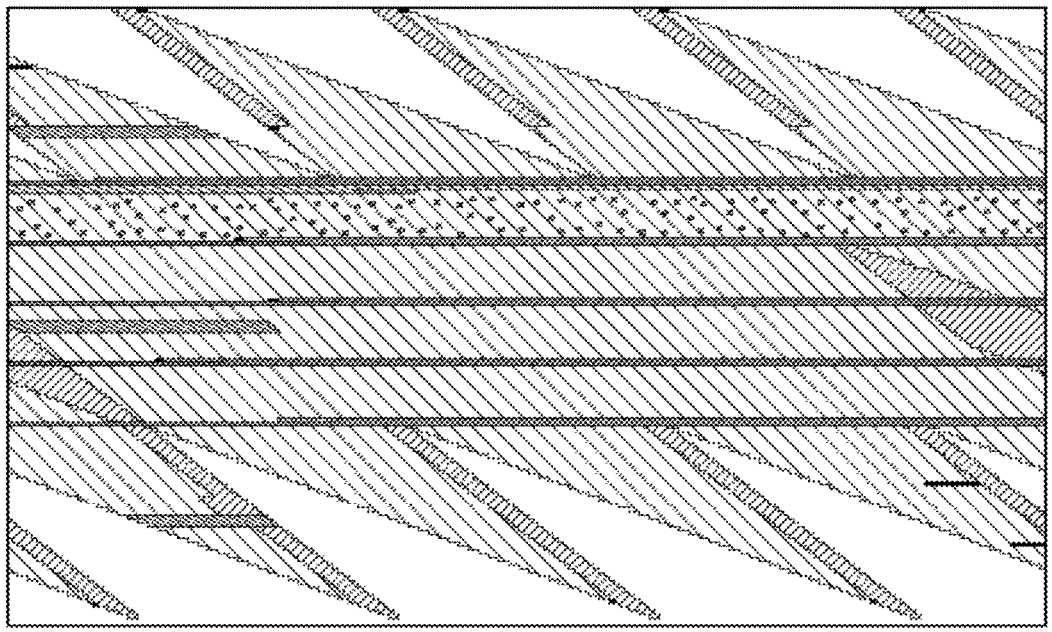

FIG. 26 illustrates a configuration of a stream in which known data is inserted in still another different way according to another exemplary embodiment. Referring to FIG. 26, a second one of 6 long training sequence is replaced for distributed known data.

Figure 27:
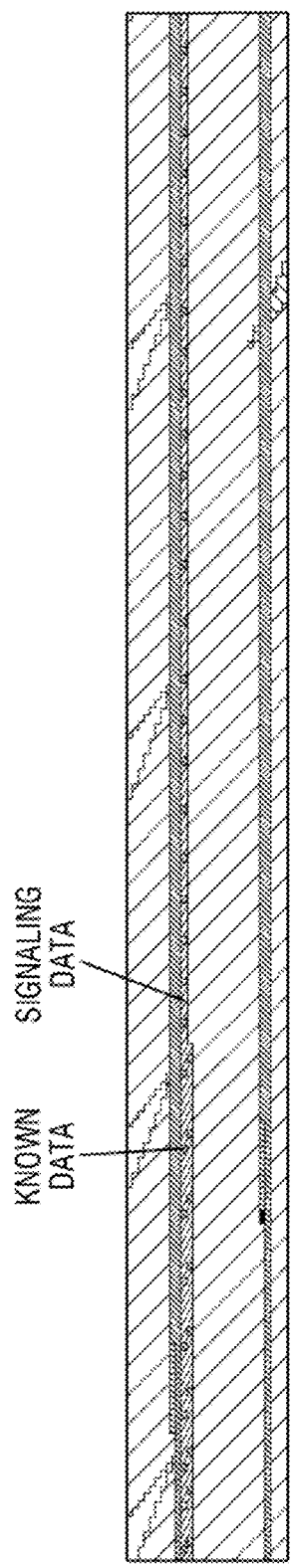

FIG. 27 illustrates a stream in which distributed known data placed in the stream of FIG. 26 and signaling data are alternately arranged.

Figure 28:
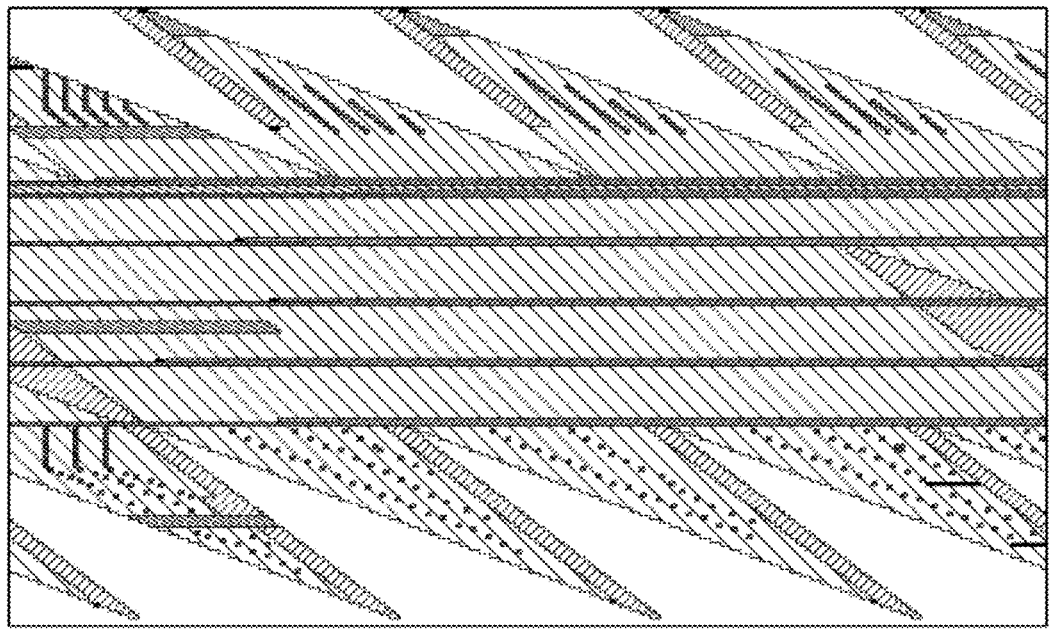

FIG. 28 illustrates a stream in which distributed known data is added to not only a head area but also a tail area.

According to various exemplary embodiments, the known data is placed in various ways as described above.

On the other hand, if mobile data is newly allocated to packets allocated to normal data, the allocating pattern may vary. Hereinafter, a configuration of a transport stream including mobile data which is placed in various ways according to a mode will be explained.

[Placement of Mobile Data]

The data pre processor 100 checks a setting condition of a frame mode. A variety of frame modes may be provided. For example, a first frame mode refers to a mode in which packets allocated to normal data are used for normal data and only packets allocated to mobile data are used for mobile data, and a second frame mode refers to a mode in which even at least one of the packets allocated to normal data is used for the mobile data. Such a frame mode may be arbitrarily set in consideration of an intention of a digital broadcast transmitter enterpriser and a transmission and reception environment.

If it is determined that the first frame mode is set in order to place normal data in all of the packets allocated to the normal data, the data pre-processor 100 places the mobile data only in the packets allocated to the mobile data in the same way as in a related art ATSC-MH system.

On the other hand, if it is determined that the second frame mode is set, the data pre-processor 100 determines the setting condition of the mode again. The mode is determined by a user regarding in what pattern and in how many packets the mobile data is placed among the packets allocated to the normal data, that is, in the second area. A variety of modes may be provided according to various exemplary embodiments.

More specifically, the mode may be set to one of a mode in which the mobile data is placed in some of the packets allocated to the normal data, a mode in which the mobile data is placed in all of the packets allocated to the normal data, and an incompatible mode in which the mobile data is placed in all of the packets allocated to the normal data and is also placed in an RS parity area and a header area which are provided for the sake of compatibility with a receiver to receive the normal data. The mode in which the mobile data is placed in some of the packets may be divided into a mode in which the mobile data is placed in a data area of some packets, that is, an entire payload area, and a mode in which the mobile data is placed in a part of the payload area.

More specifically, if 38 packets correspond to the second area allocated to the normal data, the mode may be set to one of the following modes:

1) a first mode in which the new mobile data is placed in 11 packets of the 38 packets allocated to the normal data;

2) a second mode in which the new mobile data is placed in 20 packets of the 38 packets allocated to the normal data;

3) a third mode in which the new mobile data is placed in 29 packets of the 38 packets allocated to the normal data;

4) a fourth mode in which the new mobile data is placed in all of the 38 packets allocated to the normal data; and 5) a fifth mode in which the new mobile data is placed in all of the 38 packets and also placed in an area corresponding to the MPEG header and the parity among the areas allocated to the existing mobile data.

As described above, the fifth mode may be referred to as an incompatible mode and the first through the fourth modes may be referred to as compatible modes. Types of the compatible modes and the number of packets in each mode may vary in other exemplary embodiments.

Figure 29:
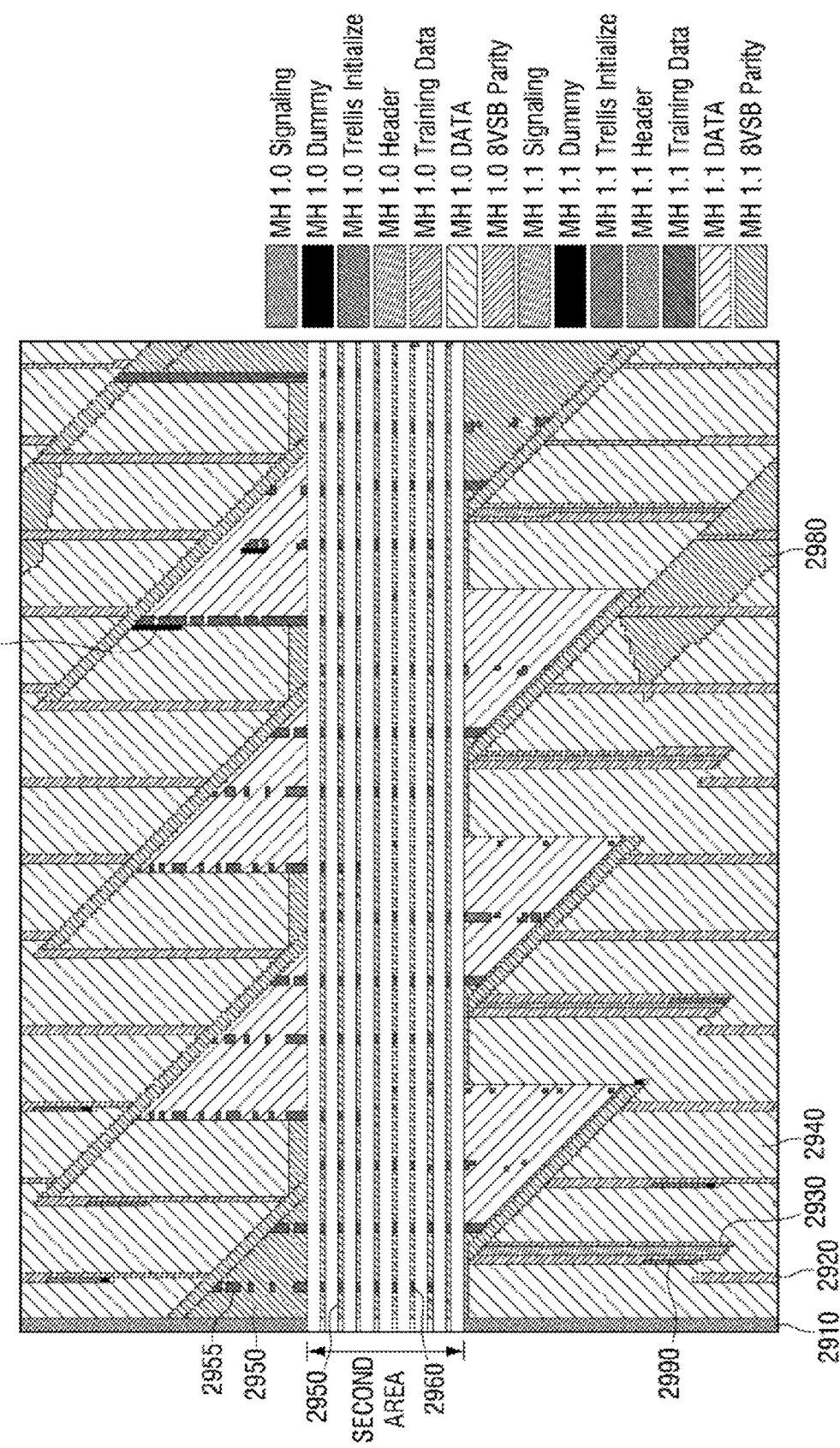
FIG. 29 is a view illustrating a pattern in which mobile data is placed in a normal data area according to a first mode.

FIG. 29 illustrates a configuration of a stream when the group formatter 130 places mobile data and known data according to the first mode in an exemplary embodiment where new mobile data is to be transmitted using the second area and the head/tail area.

Referring to FIG. 29, new mobile data 2950 and known data 2960 are placed in the second area in a predetermined pattern and are also placed in a portion 2950 corresponding to the head/tail area 2950.

Also, it can be seen that an MPEG header 2910, known data 2920, signaling data 2930, first mobile data 2940, and a dummy 2970 are arranged in a vertical direction in the stream. If encoding and interleaving are performed after an empty space of the second area is filled with normal data, a stream as shown in FIG. 30 is generated.

Figure 30:
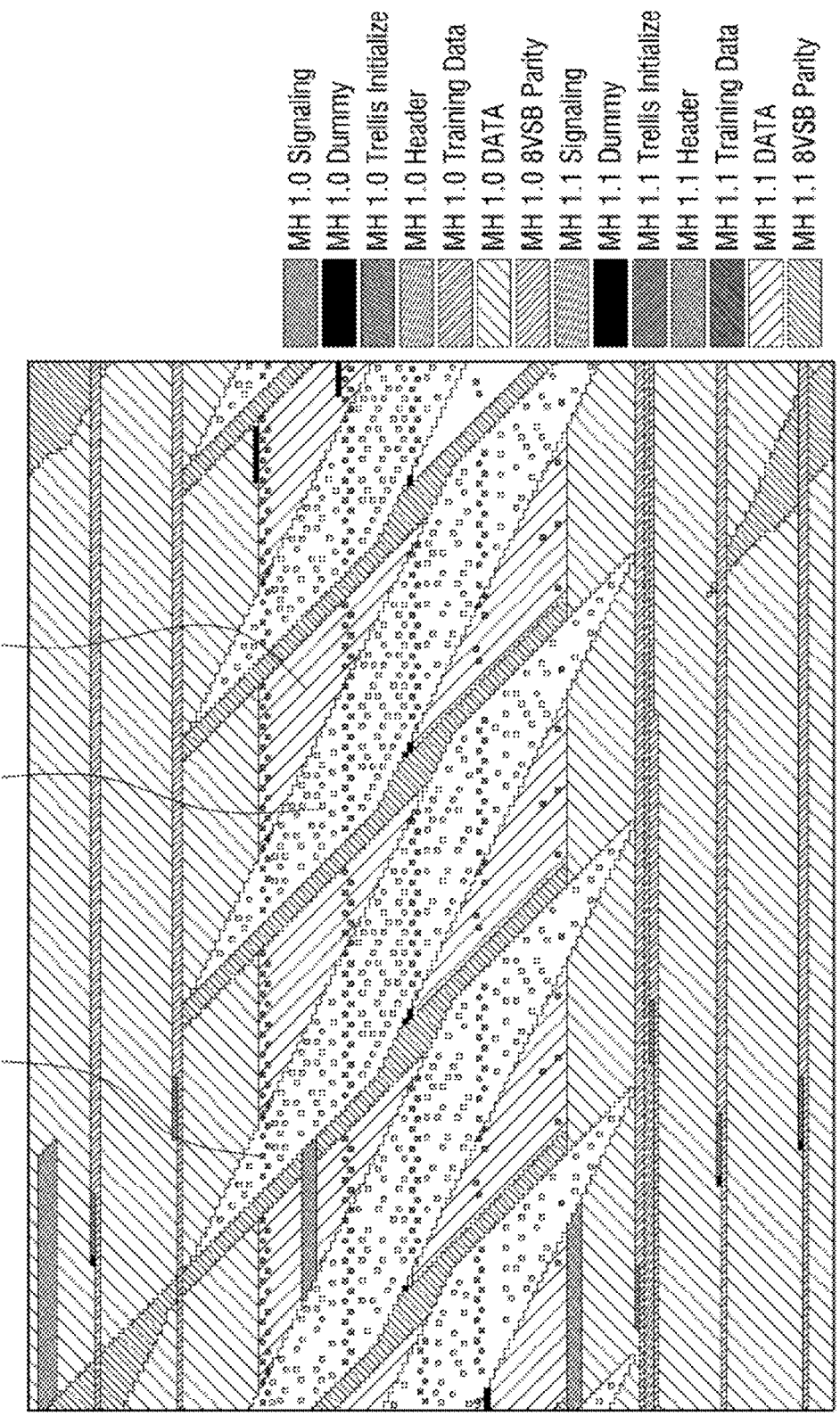
FIG. 30 is a view illustrating the stream of FIG. 29 after interleaving.

FIG. 30 illustrates a configuration of a stream after interleaving in the first mode.

Referring to FIG. 30, new mobile data 3010 and known data 3030 are placed in a part of a packet area allocated to normal data. In particular, the known data is arranged discontinuously in the second area, thereby forming long training sequences similar to the long training sequences of the body area.

The mobile data 2950 of FIG. 29, which is placed in the portion corresponding to the head/tail area, corresponds to the mobile data 3020 of FIG. 30, which is placed in the head/tail area. Furthermore, the known data 2955 placed along with the mobile data 2950 forms the known data 3030 of similar long training sequences along with the known data in the second area.

Figure 31:
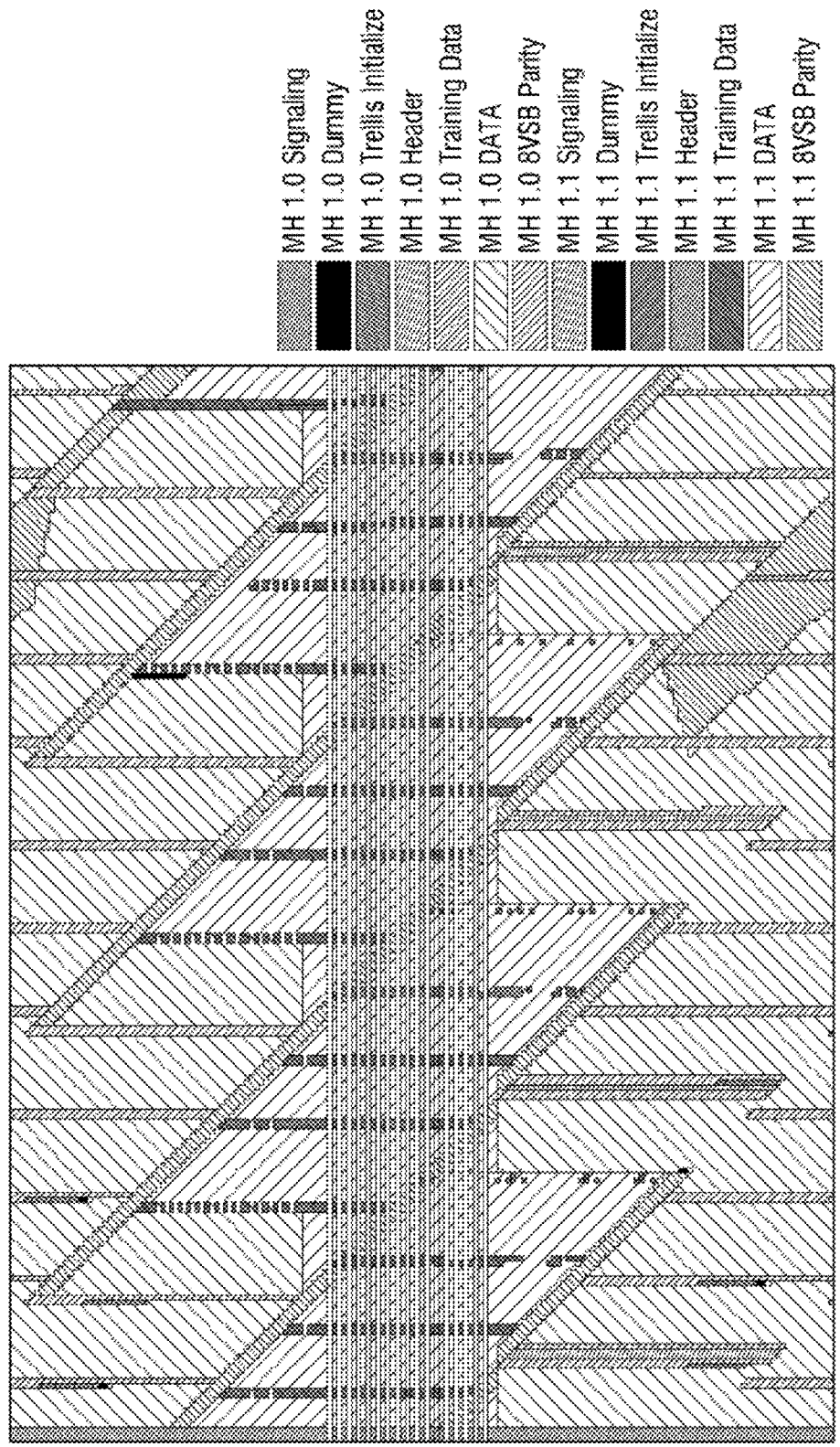
FIG. 31 is a view illustrating a pattern in which mobile data is placed in a normal data area according to a second mode.

FIG. 31 illustrates a configuration of a stream when the group formatter 130 places mobile data and known data according to the second mode in an exemplary embodiment where new mobile data is to be transmitted using the second area and the head/tail area.

In FIG. 31, the proportion of the mobile data included in the second area is greater than in FIG. 29. Compared to FIG. 29, the space occupied by the mobile data and the known data increases in FIG. 31.

Figure 32:
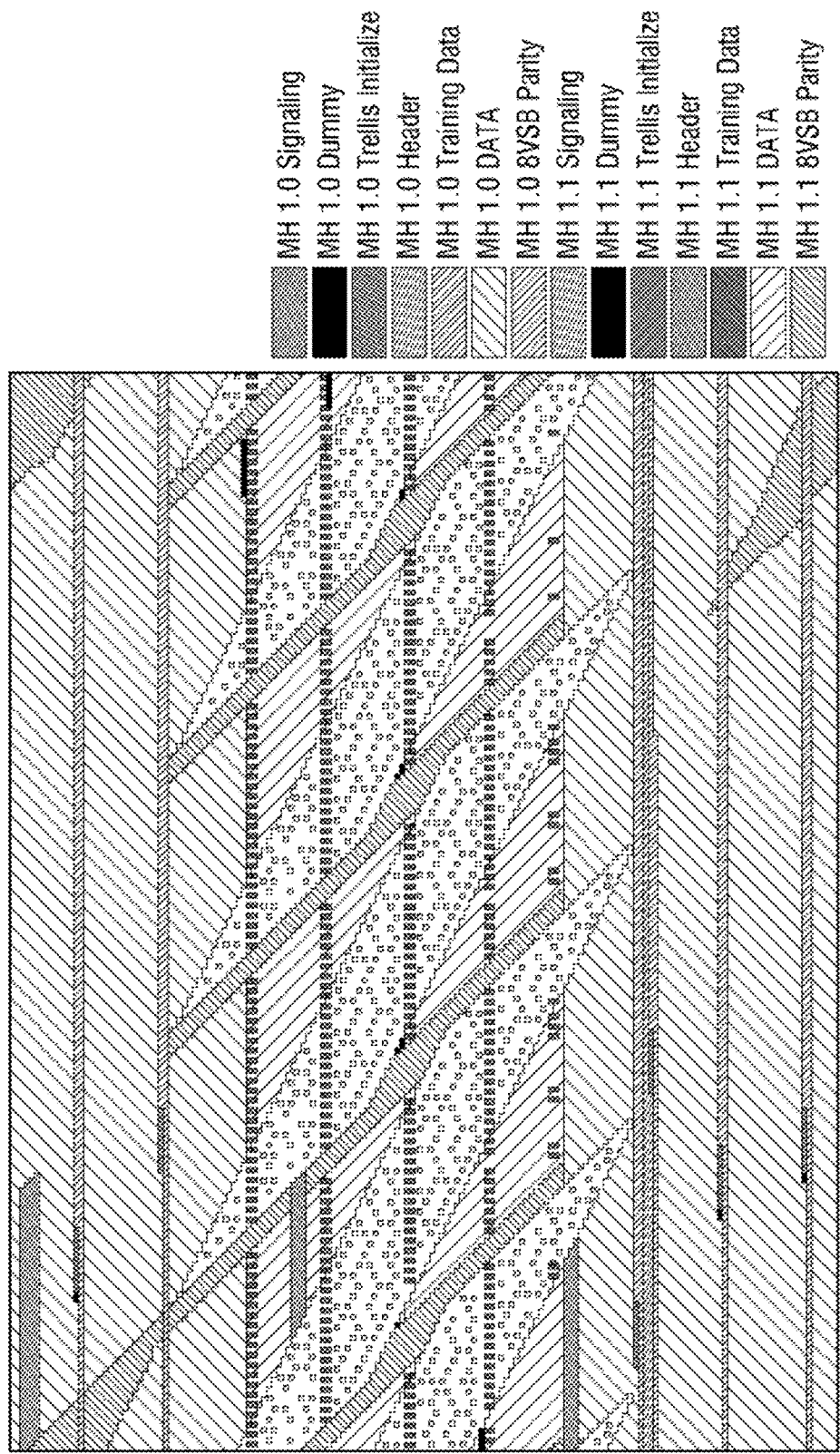
FIG. 32 is a view illustrating the stream of FIG. 31 after interleaving.

FIG. 32 illustrates the stream of FIG. 31 after interleaving. Referring to FIG. 32, the known data in the second area forms similar long training sequence more densely than the known data in the second area of FIG. 30.

Figure 33:
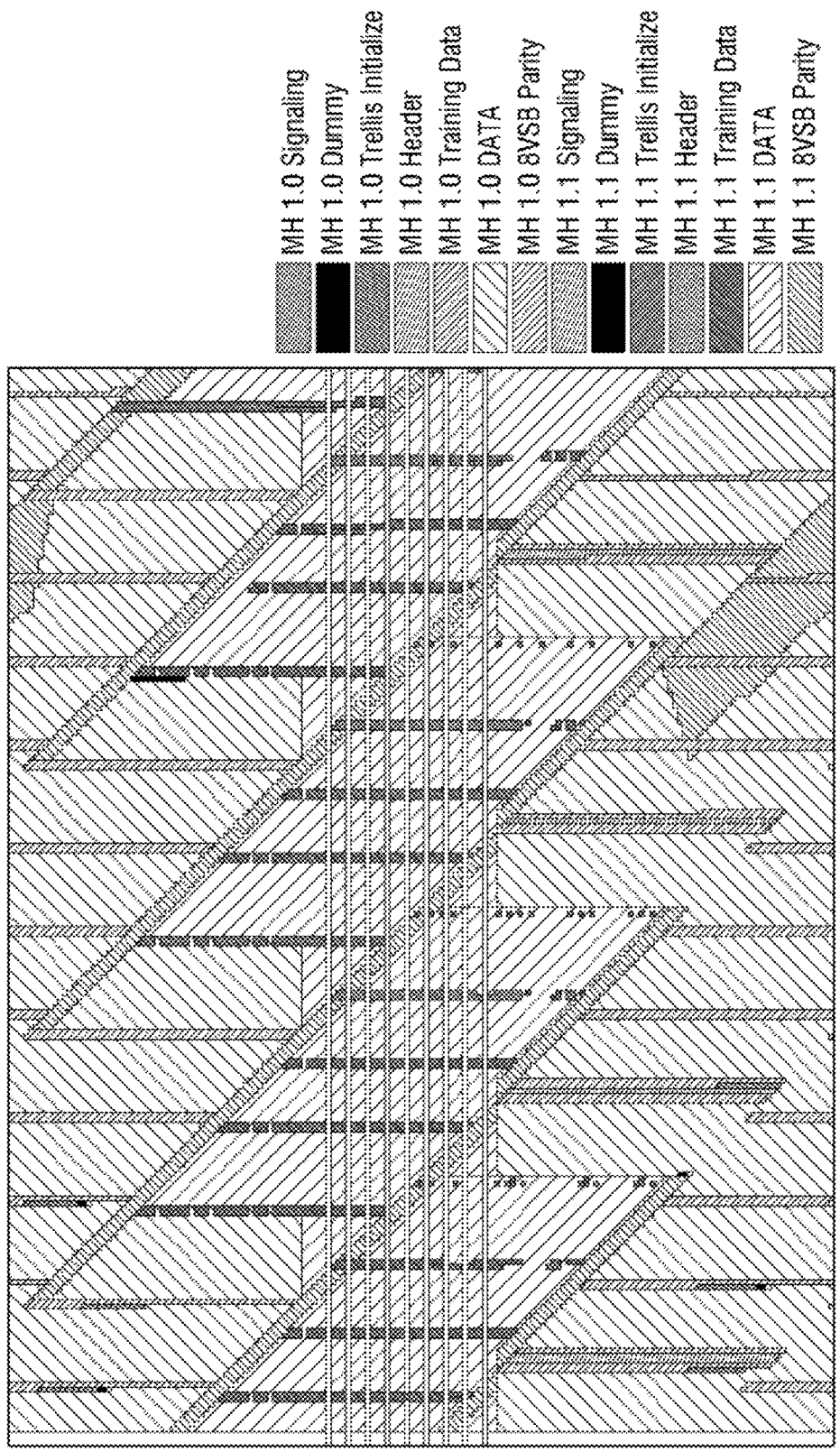
FIG. 33 is a view illustrating a pattern in which mobile data is placed in a normal data area according to a third mode.
Figure 34:
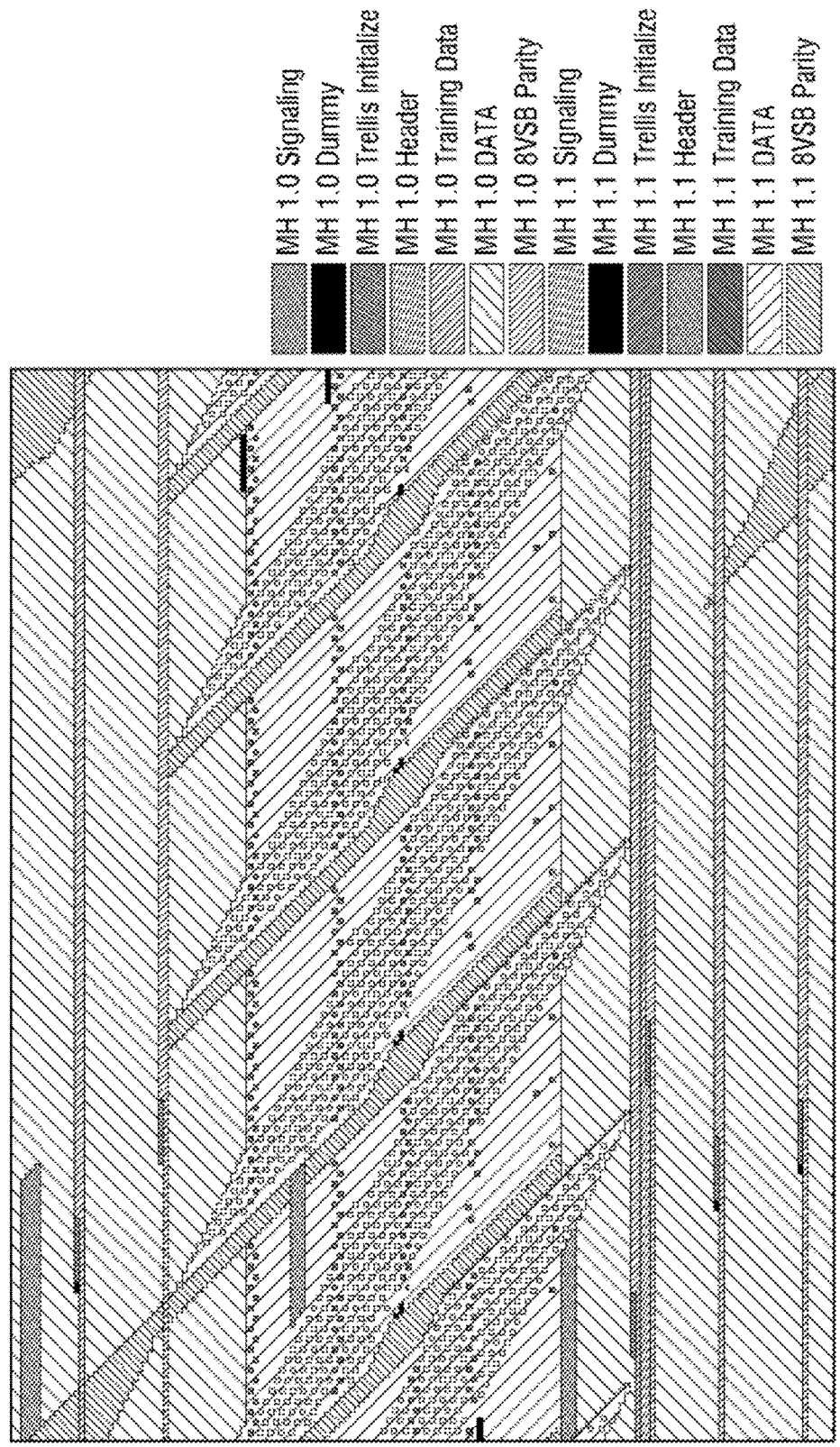
FIG. 34 is a view illustrating the stream of FIG. 33 after interleaving.

FIG. 33 illustrates a configuration of a stream when the group formatter 130 places mobile data and known data according to the third mode in an exemplary embodiment where new mobile data is to be transmitted using the second area and the head/tail area. FIG. 34 illustrates the stream of FIG. 33 after interleaving.

The placement of the mobile data and the known data of FIGS. 33 and 34 is the same as in the first mode and the second mode except for that the density in the arrangement of the mobile data and the known data increases.

Figure 35:
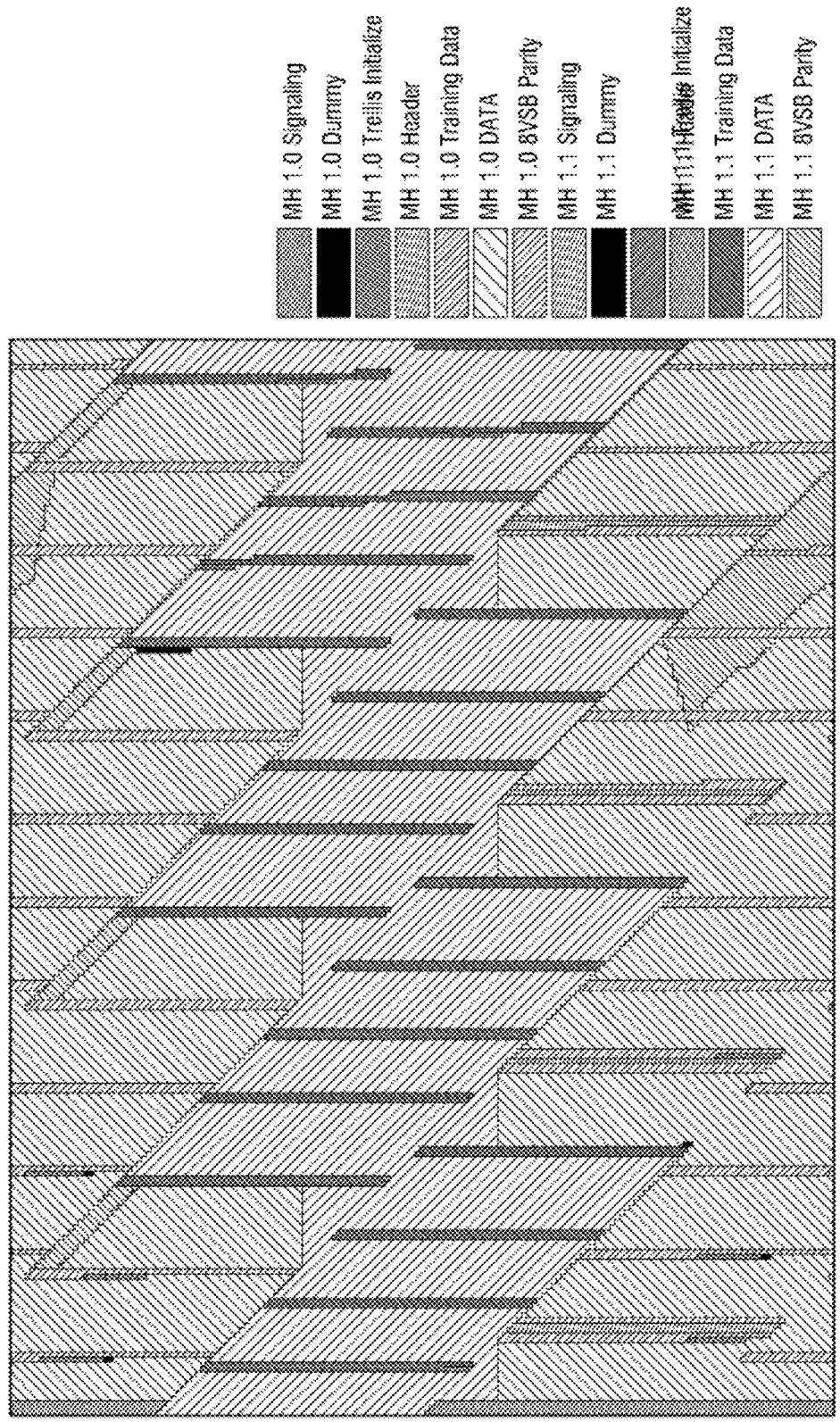
FIG. 35 is a view illustrating a pattern in which mobile data is placed in a normal data area according to a fourth mode.

FIG. 35 illustrates a configuration of a stream according to the fourth mode using the entire normal data area in an exemplary embodiment where all of the packets allocated to the normal data and the packet area allocated the first mobile data, which corresponds to the head/tail area, is used.

Referring to FIG. 35, in the second area and a surrounding area thereof, the known data is arranged in a vertical direction and the remaining area is occupied by new mobile data.

Figure 36:
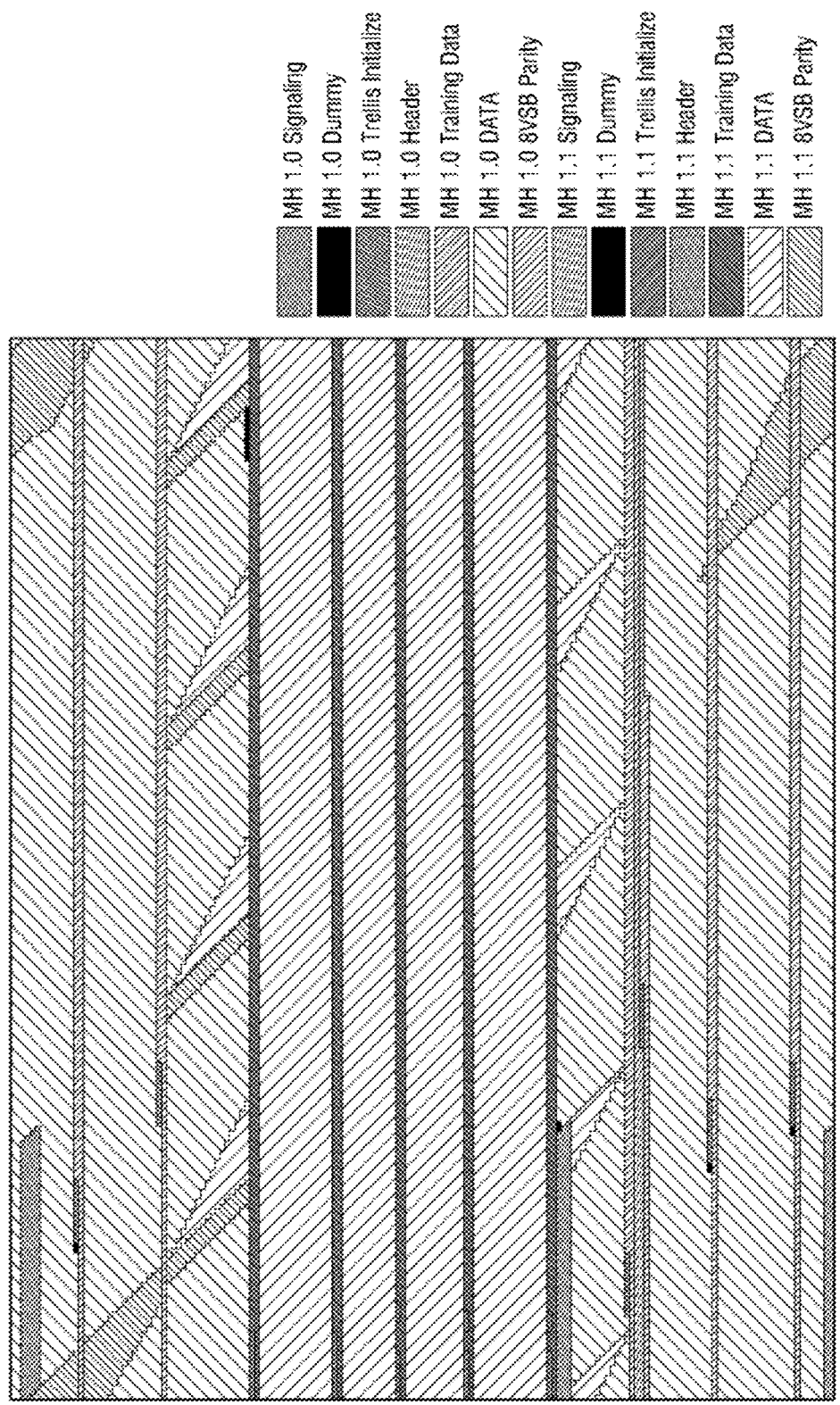
FIG. 36 is a view illustrating the stream of FIG. 35 after interleaving.

FIG. 36 illustrates the stream of FIG. 35 after interleaving. Referring to FIG. 36, the head/tail area and the entire normal data area are filled with new mobile data and the known data, and in particular, the known data is placed in the pattern of long training sequences.

In these areas, known data is inserted into a small unit repeatedly according to a plurality of pattern periods such that distributed known data is realized after interleaving.

Figure 37:
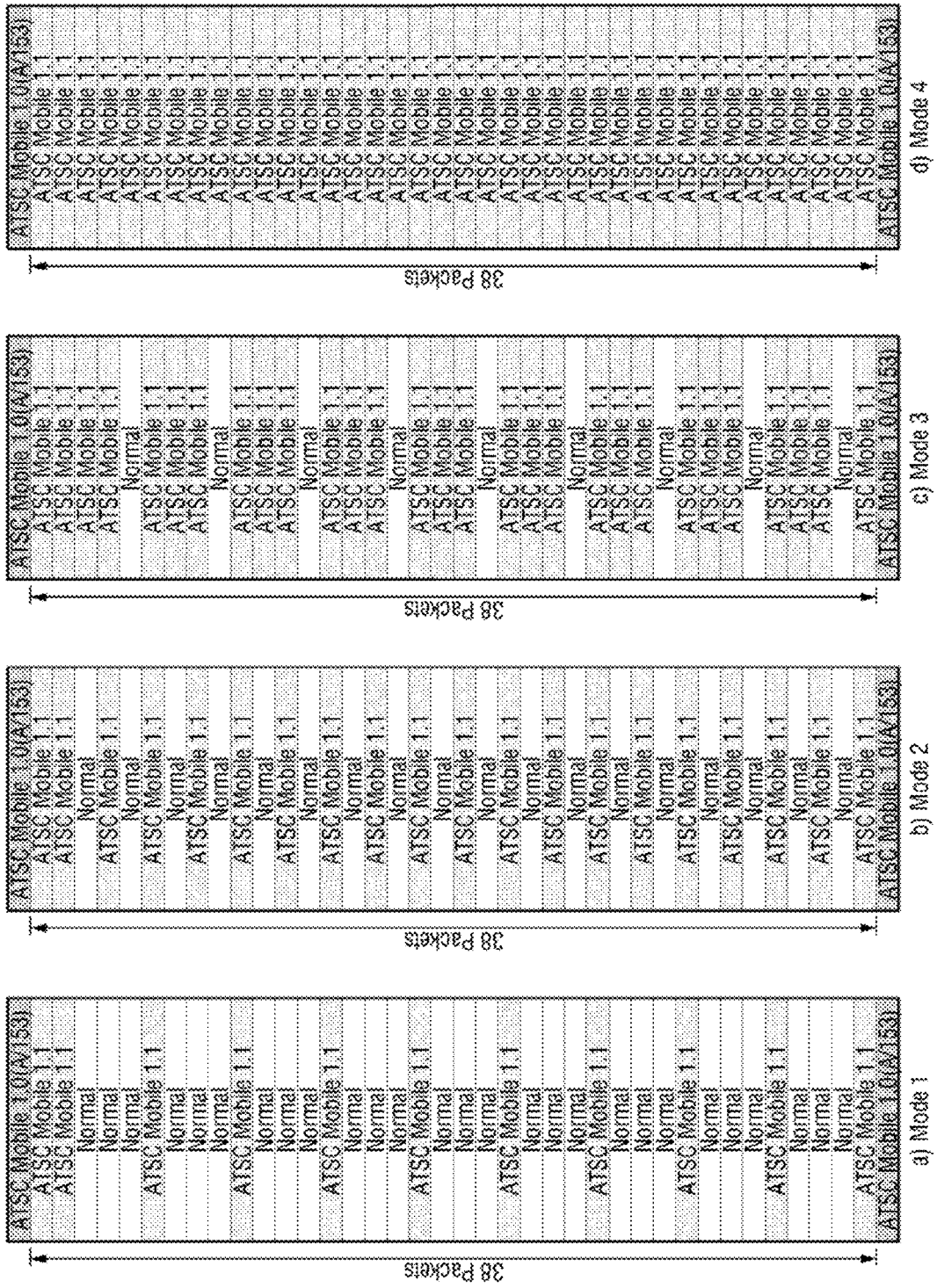
FIGS. 37 to 40 are views illustrating a pattern in which mobile data is placed according diverse modes according to various exemplary embodiments.

FIG. 37 is a view to explain how to insert new mobile data into the second area, that is, the packets (for example, 38 packets) allocated to normal data in diverse modes. Hereinafter, new mobile is referred to as ATSC mobile 1.1 data (or 1.1 version data) and first mobile data is referred to as ATSC mobile 1.0 data (or 1.0 version data) for the sake of convenience.

In the first mode a), the 1.1 version data is placed in each of first and final packets, and one 1.1 packet and 3 normal data packets are repeatedly inserted into the packets between the first and the final packets. Accordingly, 11 packets in total can be used to transmit the 1.1 version data, that is, the new mobile data.

Likewise, in the second mode b), the 1.1 version data is placed in each of the first and the final packets and one 1.1 packet and one normal data packet are placed in packets between the first and the final packets alternately and repeatedly. Accordingly, 20 packets in total can be used to transmit the 1.1 version data, that is, the new mobile data.

Likewise, in the third mode c), the 1.1 version data is placed in each of the first and the final packets, and three 1.1 packets and one normal data packet are repeatedly placed in the packets between the first and the final packets.

In the fourth mode d), all of the packets corresponding to the second area may be used to transmit the 1.1 version data.

The fourth mode recited herein may be a compatible mode in which only all of the packets corresponding to the second area are used to transmit the 1.1 version data or an incompatible mode in which not only the packets corresponding to the second area but also the MPEG header and the parity area provided for the sake of compatibility with a normal data receiver are filled with the 1.1 version data. Alternatively, the incompatible mode may be provided as a separate fifth mode.

Although the first through the fourth modes correspond to the cases using 1/4, 2/4, 3/4, and 4/4 of the entire packets of the second area to transmit the mobile data, respectively, the total number of packets is 38, which is not a multiple of 4. Accordingly, some packets (2 packets in FIG. 37) may be fixed as a packet for transmitting the new mobile data or the normal data and the remaining packets may be classified according to the aforementioned ratio. That is, referring to a), b), and c) of FIG. 37, 1.1 packets may be included in the ratio of 1/4, 2/4, and 3/4 of 36 packets except for 2 packets among 38 packets.

Figure 38:
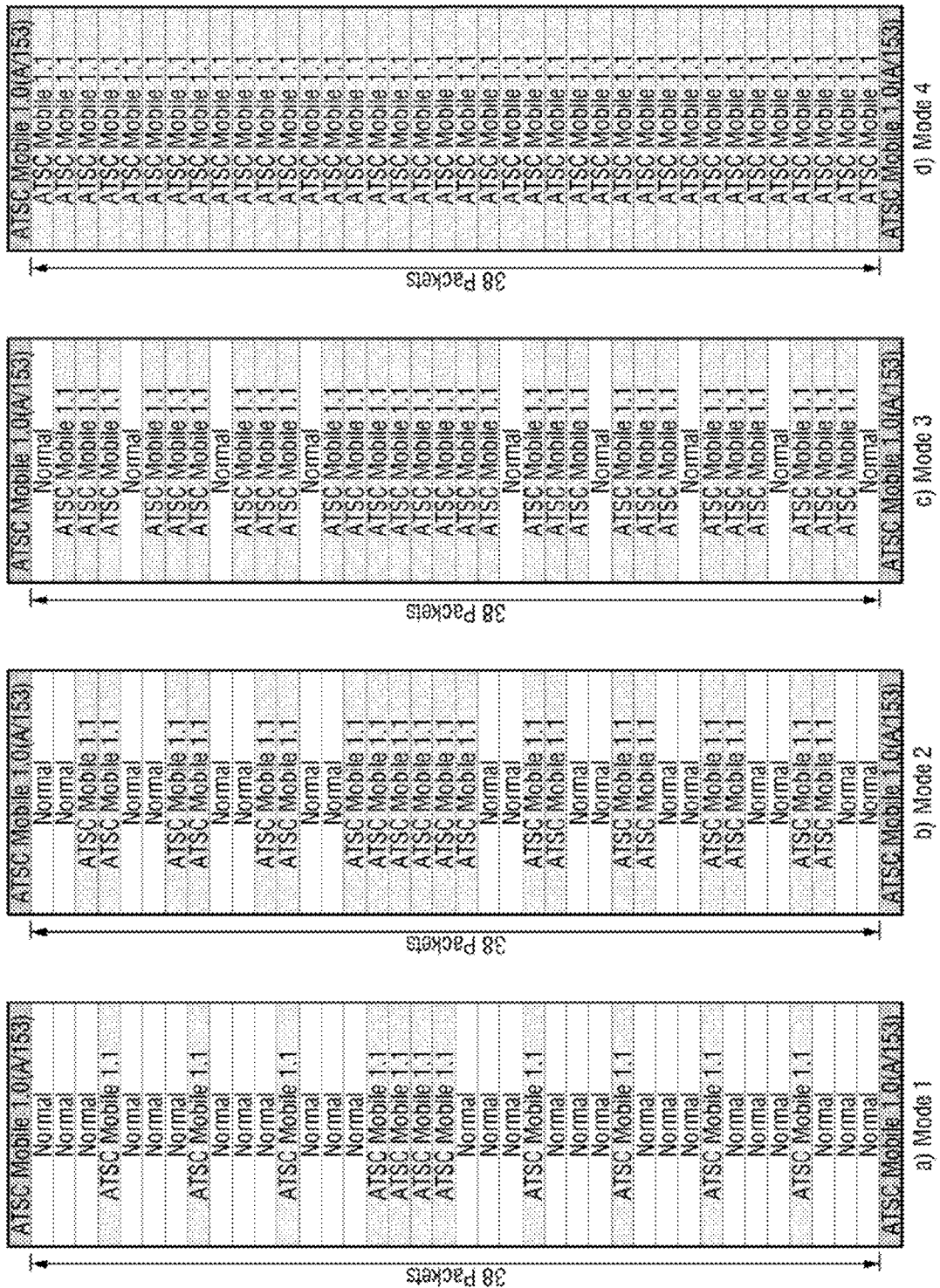

FIG. 38 is a view to explain a pattern in which mobile data is placed in a different mode.

Referring to FIG. 38, two 1.1 version data are placed in a center packet that is located at the center of the stream among the total packets in the second area, that is, 38 packets, and 1.1 version data and normal data are placed in the other packets according to a predetermined ratio in each mode.

More specifically, in the first mode a), the mobile data is placed in packets other than the 2 center packets such that 3 normal data packets and one 1.1 version data packet are repeatedly placed in the upper portion and one 1.1 version data packet and 3 normal data packets are repeatedly placed in the lower portion.

In the second mode b), the mobile data is arranged in the packets other than the two center packets such that two normal data packets and two 1.1 version data packets are repeatedly placed in the upper portion and two 1.1 version data packets and two normal data packets are repeatedly placed in the lower portion.

In the third mode c), the mobile data is arranged in the packets other than the two center packets such that one normal data packet and three (3) 1.1 version data packets are repeatedly placed in the upper portion and three (3) 1.1 version data packets and one normal data packet are repeatedly placed in the lower portion.

In the fourth mode d), all of the packets are filled with the 1.1 version data, which is the same as the fourth mode of FIG. 37.

Figure 39:
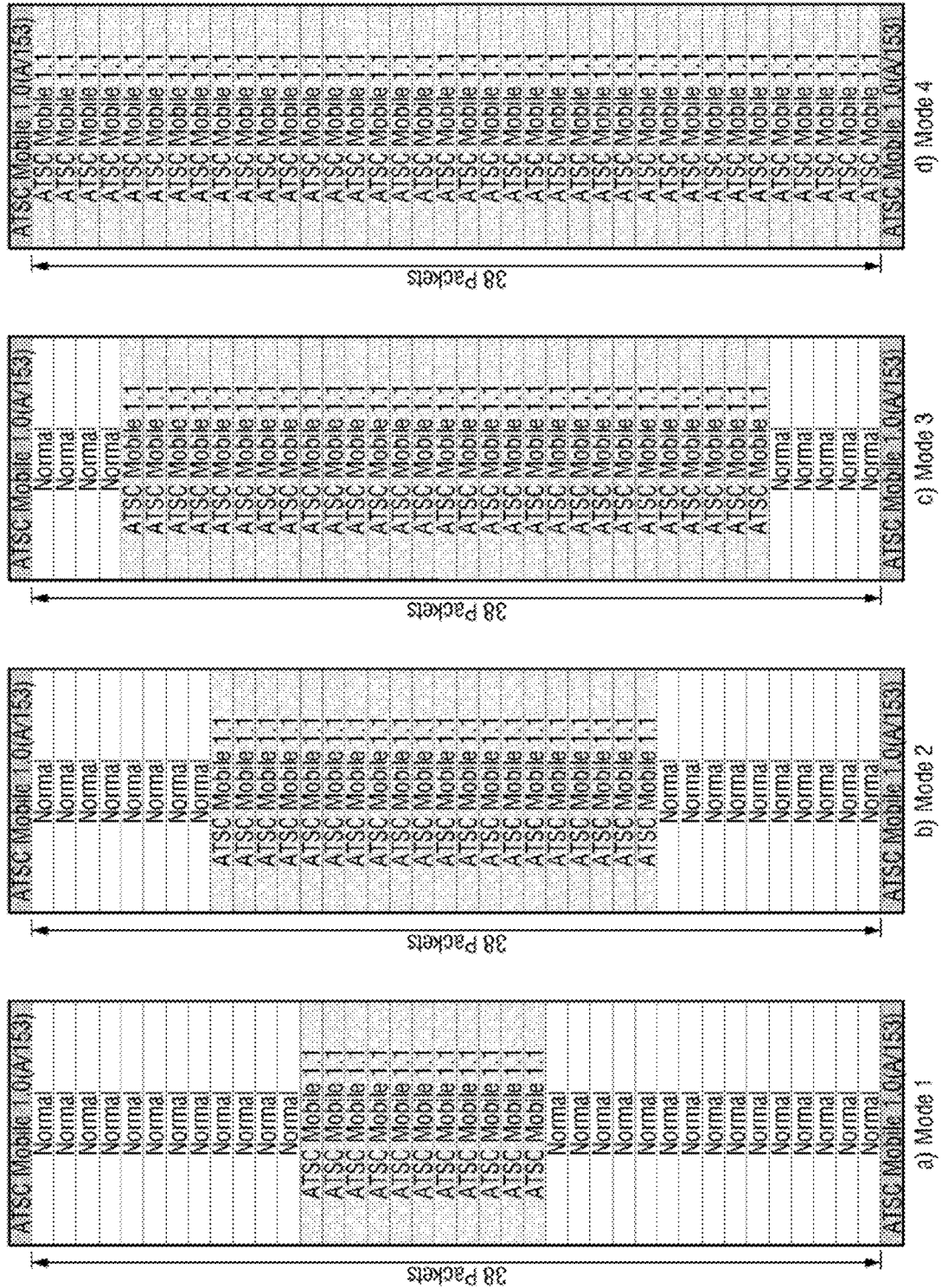

FIG. 39 illustrates placing 1.1 version data from the center packet to the upper portion and the lower portion in sequence with reference to the location on the stream.

In the first mode a) of FIG. 39, 11 packets are placed in sequence toward the upper and lower packets from the center of the total packets of the second area in a vertical direction.

In the second mode b) of FIG. 39, 20 packets in total are placed in sequence in a vertical direction from the center, and in the third mode c) of FIG. 39, 30 packets in total are placed in sequence in a vertical direction from the center. In the fourth mode of d) of FIG. 39, the entire packets are filled with 1.1 version data.

Figure 40:
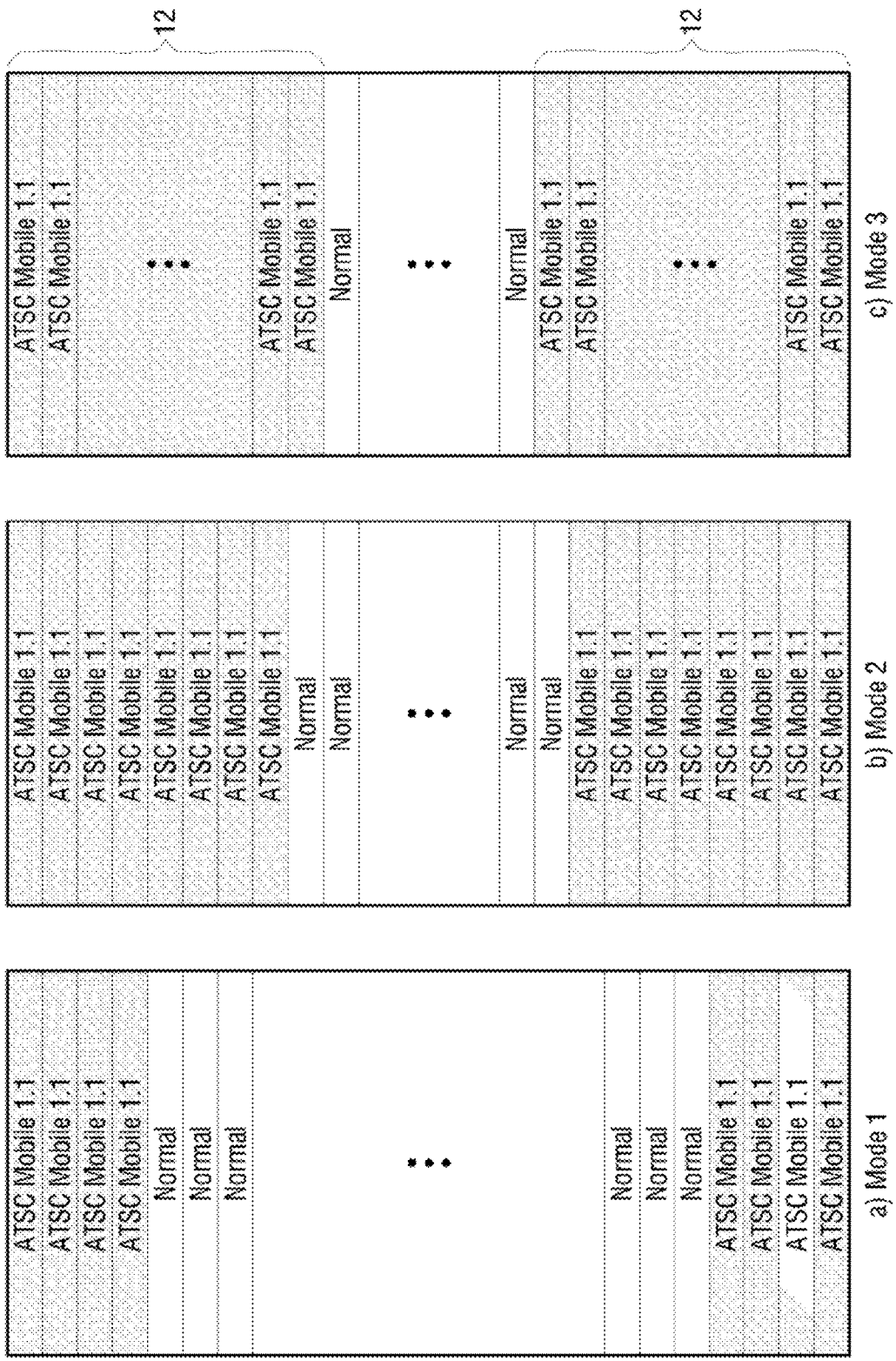

FIG. 40 illustrates a stream configuration in which the mobile data is placed from top and bottom packets to a center packet in the reverse order of FIG. 39. The number of new mobile data packets in the first through the fourth modes in FIG. 40 is different from that in the above-described exemplary embodiments.

More specifically, in the first mode a) of FIG. 40, four 1.1 version data packets are placed from the top packet in a downward direction, and four 1.1 version data packets are placed from the bottom packet in an upward direction. In other words, eight 1.1 version data packets in total are placed.

In the second mode b) of FIG. 40, eight 1.1 version data packets are placed from the top packet in a downward direction and eight 1.1 version data packet are placed from the bottom packet in an upward direction. In other words, sixteen 1.1 version data packets in total are placed.

In the third mode c), twelve 1.1 version data packets are placed from the top packet in a downward direction and twelve 1.1 version data packets are placed from the bottom packet in a upward direction. In other words, twenty four 1.1 version data packets in total are placed.

The remaining packets are filled with normal data. The placing pattern of packets in the fourth mode is the same as in FIGS. 37, 38, and 39 and is thus omitted herein.

In the fifth mode, that is, the incompatible mode, the new mobile data is additionally placed in the RS parity area and the header area in the existing mobile data area rather than the normal data area, and thus the fifth mode is not illustrated in FIGS. 37 to 40.

Although the above-described fifth mode may be provided as a new mode separate from the fourth mode, the fourth mode or the fifth mode may be incorporated into the first through the third modes, and as a result, four modes in total may be provided.

That is, FIGS. 37 to 40 illustrates a method of inserting new mobile data into the second area, that is, the packets allocated to the normal data (for example, 38 packets) in various modes. The method of placing the new mobile data in the packets allocated to the normal data according to a pre-set mode in FIGS. 37 to 40 may be different as in the first through the fourth modes described above. The fourth mode may be a mode in which all of the 38 packets are filled with the new mobile data or a mode in which not only the 38 packets but also the RS parity area and the header area are filled with the new mobile data. Also, as described above, the mode may include all of the first through the fifth modes.

If a mode to determine how many packets the new mobile data is allocated to among the 38 packets and also determine how a block is configured in the M/H group is a scalable mode, a) a scalable mode 00, b) a scalable mode 01, c) a scalable mode 10, and d) a scalable mode 11 may be defined using a two-bit signaling field as shown in FIG. 37. Even if all of the 38 packets are allocated to the new mobile data as in d) of FIG. 37, 118 packets which are the existing mobile data area and the 38 packets to which the new mobile data is allocated may configure one M/H group.

In this case, two scalable modes may be defined according to how a block is configured in this group. In the case that all of the transmission data rates of 19.4 Mbps are allocated to the mobile data or not, M/H groups having different block configurations may be generated even if all of the 38 packets in one slot are allocated to the mobile data.

All of the existing transmission data rates of 19.4 Mbps are allocated to the mobile data, if the normal data rate is 0 Mbps. In this case, a broadcast provider may provide a service considering only a mobile data receiver without considering a normal data receiver. In this case, an area where a placeholder exists for the MPEG header and the RS parity, which remain for the sake of compatibility with an existing normal data receiver, is defined as an area for the mobile data, and the transmission capacity of the mobile data is increased up to about 21.5 Mbps.

In order to allocate all of the existing transmission data rates of 19.4 Mbps to the mobile data, 156 packets of each of all of the M/H slots configuring the M/H frame should be allocated to the mobile data. In other words, all of the 16 slots in each M/H sub-frame are set to the scalable mode 11. In this case, all of the 38 packets, which are the normal data area, are filled with the mobile data, and a block SB5 corresponding to the area where the placeholder exists for the MPEG header and the RS parity existing in the body area may be additionally derived. If the 16 slots in the M/H sub-frame are set to the scalable mode 11 and the RS frame mode is "00" (single frame mode), block SB5 does not exist separately and the placeholder corresponding to block SB5 is absorbed into the M/H blocks B4, B5, B6, and B7. If the 16 slots in the M/H sub-frame are all set to the scalable mode 11 and the RS frame mode is "01" (dual frame mode), the placeholder located in block SB5 configures block SB5. Besides the body area, a placeholder area for the RS parity existing in a head/tail is filled with the mobile data and is absorbed into a block to which a segment in which the placeholder for the RS parity exists belongs. The placeholder located in corresponding segments of the M/H blocks B8 and B9 is absorbed into block SB1. The placeholder located in the first 14 segments of the M/H block B10 is absorbed into block SB2. The placeholder located in the final 14 segments of the M/H block B1 of the following slot is absorbed into block SB3. The placeholder located in corresponding segments of the M/H blocks B2 and B3 of the following slot is absorbed into block SB4. It can be seen that an area for the MPEG header and the RS parity does not exist in the group format after interleaving, as shown in FIG. 20. On the other hand, all of the existing transmission data rates of 19.4 Mbps are not allocated to the mobile data, if the normal data rate is not 0 Mbps. In this case, the broadcast provider provides the service considering both the normal data receiver and the mobile data receiver. In this case, the MPEG header and the RS parity cannot be re-defined as mobile data in order to maintain the compatibility with the existing normal data receiver and should be transmitted as they are. In other words, as in the above-described compatible mode, some of the 38 packets are filled with the new mobile data or the MPEG header and the RS parity area are not filled with the new mobile data even if all of the 38 packets are filled with the new mobile data. Accordingly, even if all of the 38 packets, which are a normal data area in a certain slot, are filled with the mobile data, block SB5 corresponding to the area where the MPEG header and the RS parity existing in the body area exist is not derived.

Figure 56:
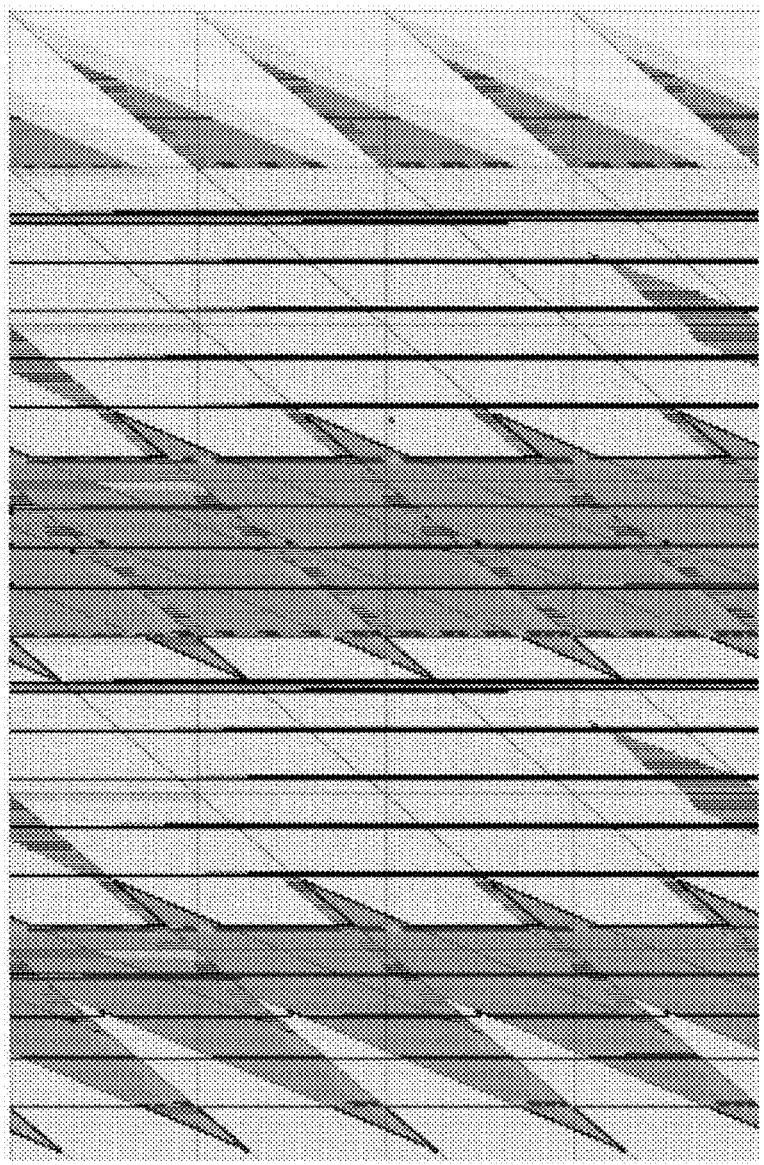
Figure 57:
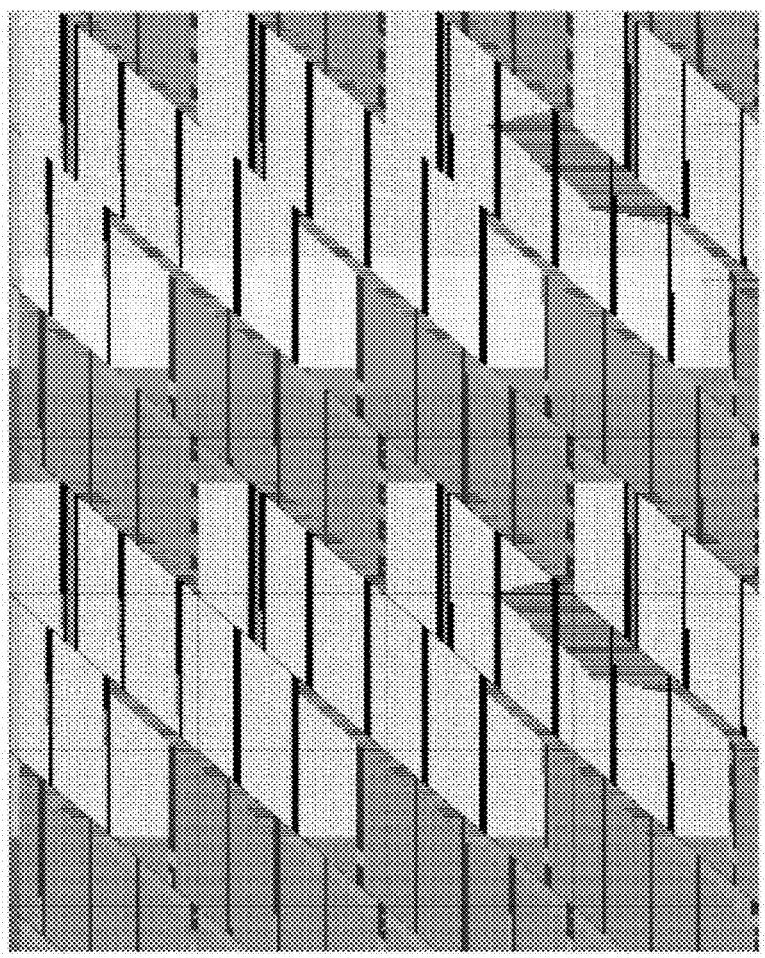

FIG. 57 illustrates a packet unit group format before interleaving considering compatibility, if all of the 38 packets, which is the normal data area, are filled with the mobile data. As in FIGS. 37 to 40, all of the 38 packets are allocated to the mobile data, but, the area where the MPEG header and the RS parity exist is maintained in a segment unit group format after interleaving and block SB5 is not derived as shown in FIG. 56. Such a group format may be defined as a group format corresponding to the fourth mode or the scalable mode 11. Alternatively, the fourth mode in which only the 38 packets are filled with the new mobile data considering compatibility may be referred to as a scalable mode 11a.

If the scalable mode 11, which is the incompatible mode, is used, the slot cannot be used along with a slot filled with the new mobile data in a different mode. That is, all of the slots, i.e., all of the 0th through the fifteenth slots, should be filled with the new mobile data according to the scalable mode 11. On the other hand, the slots may be used in combination in the first through the fourth modes.

As described above, the normal data area of each slot may be filled with mobile data in various ways. Accordingly, the shape of the slot may vary depending on the setting condition of the frame mode and the mode.

If the four modes are provided as described above, the slots in which the mobile data is placed according to the first through the fourth modes may be referred to as first through fourth type slots.

The digital broadcast transmitter may configure the same type of slot at every slot. Conversely, a stream may be configured such that different types of slots are repeated in the unit of a predetermined number of slots.

That is, as shown in FIG. 41, the data pre-processor 100 may place the mobile data so that one first type slot and three 0 type slots are repeatedly arranged. The 0 type slot refers to a slot in which normal data is allocated to the packet allocated to the normal data.

Such a slot type may be defined using existing signaling data, such as a specific portion of a TPC or a FIC.

As described above, in the case that the frame mode is set to "1," the mode may be set to one of a plurality of modes, for example, the first through the fourth modes. The fourth mode may be the above-described scalable mode 11 or may be the scalable mode 11a. Also, the mode may be one of the five modes including the scalable modes 11 and 11a. The mode may be divided into the at least one compatible mode and the incompatible mode, that is, the scalable mode 11.

If the modes are realized as the first through the fourth modes, slots corresponding to each of the modes may be called 1-1, 1-2, 1-3, and 1-4 type slots.

That is, the 1-1 type slot refers to a slot in which the 38 packets are allocated in the first mode, the 1-2 type slot refers to a slot in which the 38 slots are allocated in the second mode, the 1-3 type slot refers to a slot in which the 38 packets are allocated in the third mode, and the 1-4 type slot refers to a slot in which the 38 packets are allocated to the fourth mode.

FIG. 42 illustrates examples of a stream in which diverse types of slots described above are repeatedly arranged.

Referring to example 1 of FIG. 42, a stream in which the 0 type slot and the 1-1, 1-2, 1-3, 1-4 type slots are repeatedly arranged in sequence is illustrated.

Referring to example 2 of FIG. 42, a stream in which the 1-4 type slot and the 0 type slot are alternated is illustrated. As described above, since the fourth mode is a mode in which the entire normal data area is filled with mobile data, example 2 indicates a situation where a slot used for mobile data and a slot used for normal data alternate in the entire normal data area.

As shown in examples 3, 4, and 5, diverse types of slots are repeatedly arranged in various ways. In particular, all of the slots are combined into a single type slot as shown in example 6.

Figure 43:
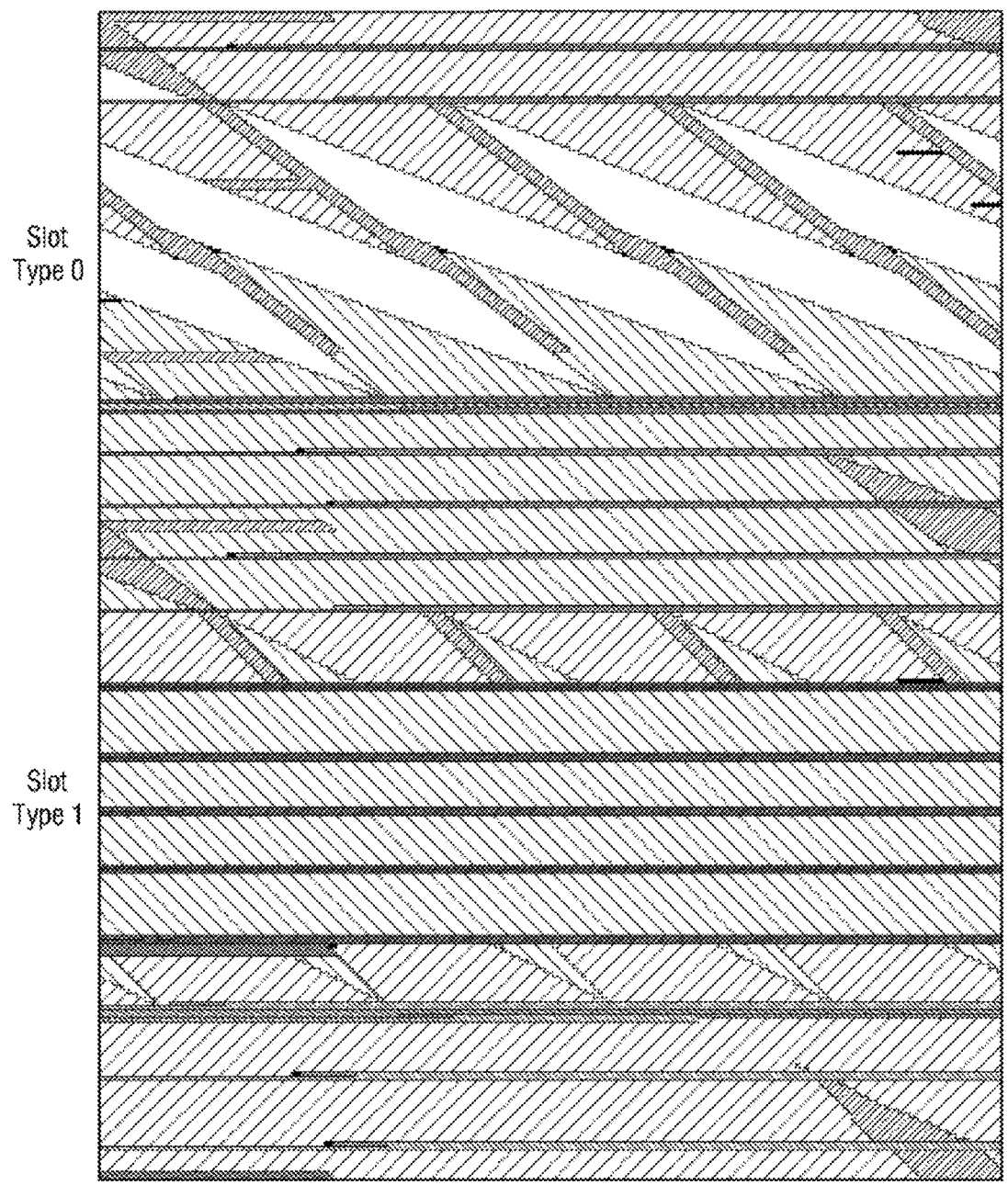

FIG. 43 is a view illustrating a configuration of the stream according to example 2 of FIG. 42. In FIG. 43, the normal data area is used for normal data at the 0 type slot, but the entire normal data area is used for mobile data and simultaneously the known data is placed in the pattern of long training sequences at the 1 type slot. As described above, a slot type may be implemented in various way as described above.

FIGS. 44 to 47 illustrate configurations of streams to explain a method for allocating blocks in the first through the fourth modes. As described above, the first area and the second area are each divided into a plurality of blocks.

The data pre-processor 100 performs block-coding on a block basis or on a block group basis according to a predetermined block mode.

Figure 44:
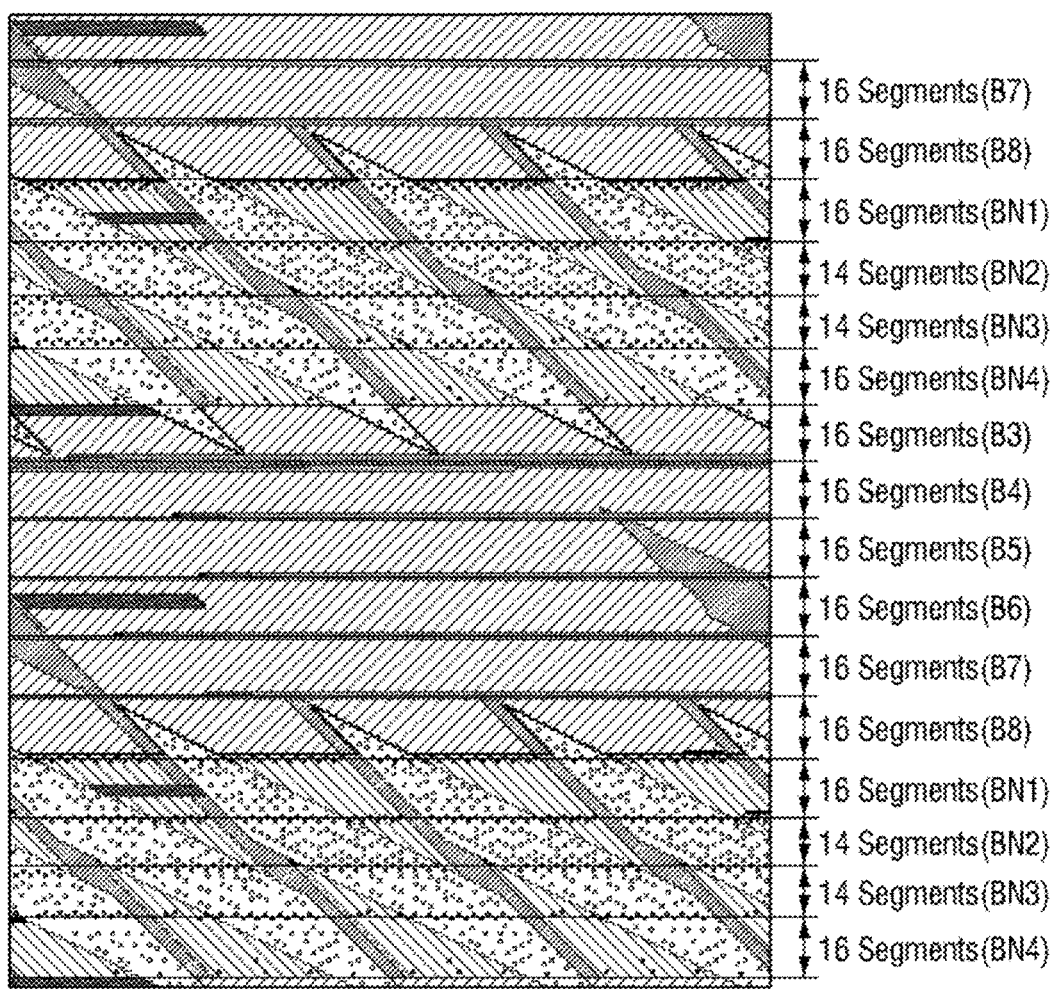
FIGS. 44 to 47 are views illustrating a block allocating method according to various exemplary embodiments.

FIG. 44 illustrates blocks being divided in a first mode. Referring to FIG. 44, the body area is divided into blocks B3-B8 and the head/tail area is divided into blocks BN1-BN4.

Figure 45:
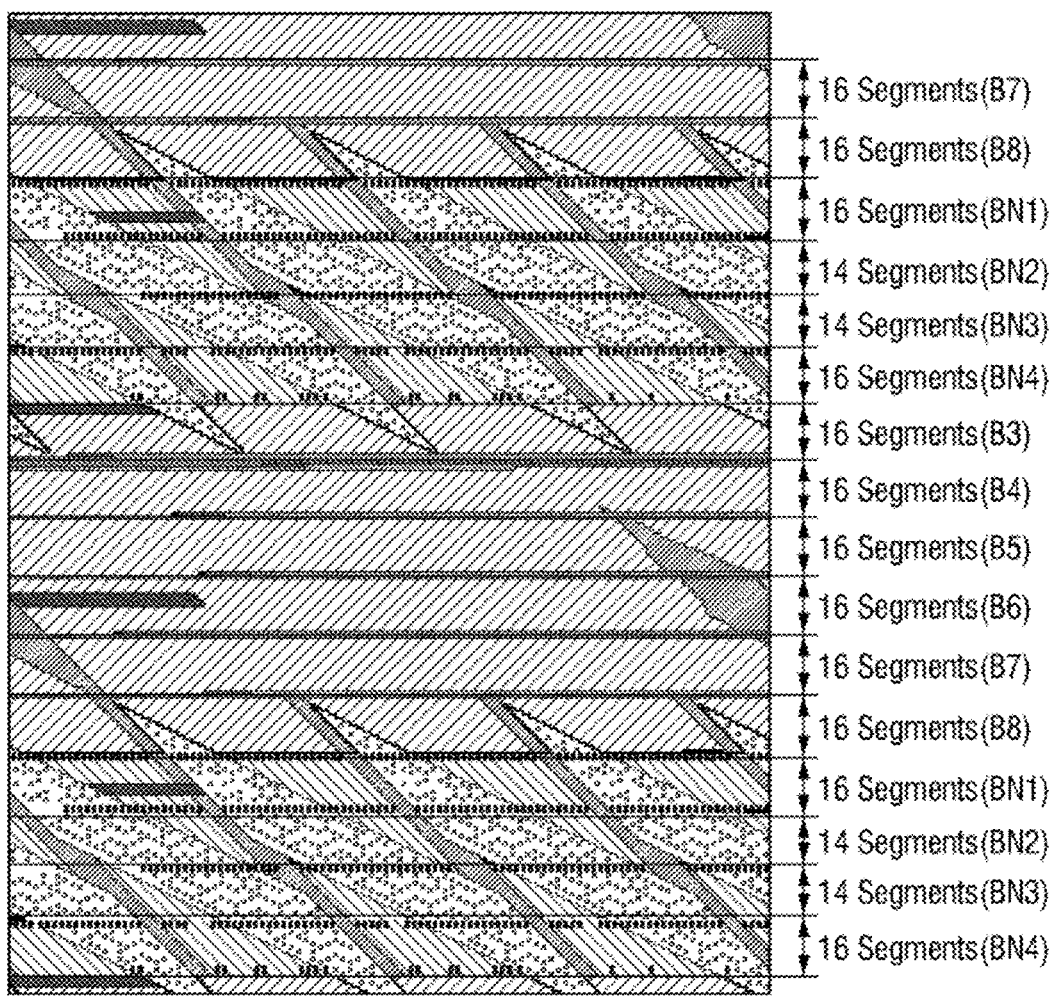
Figure 46:
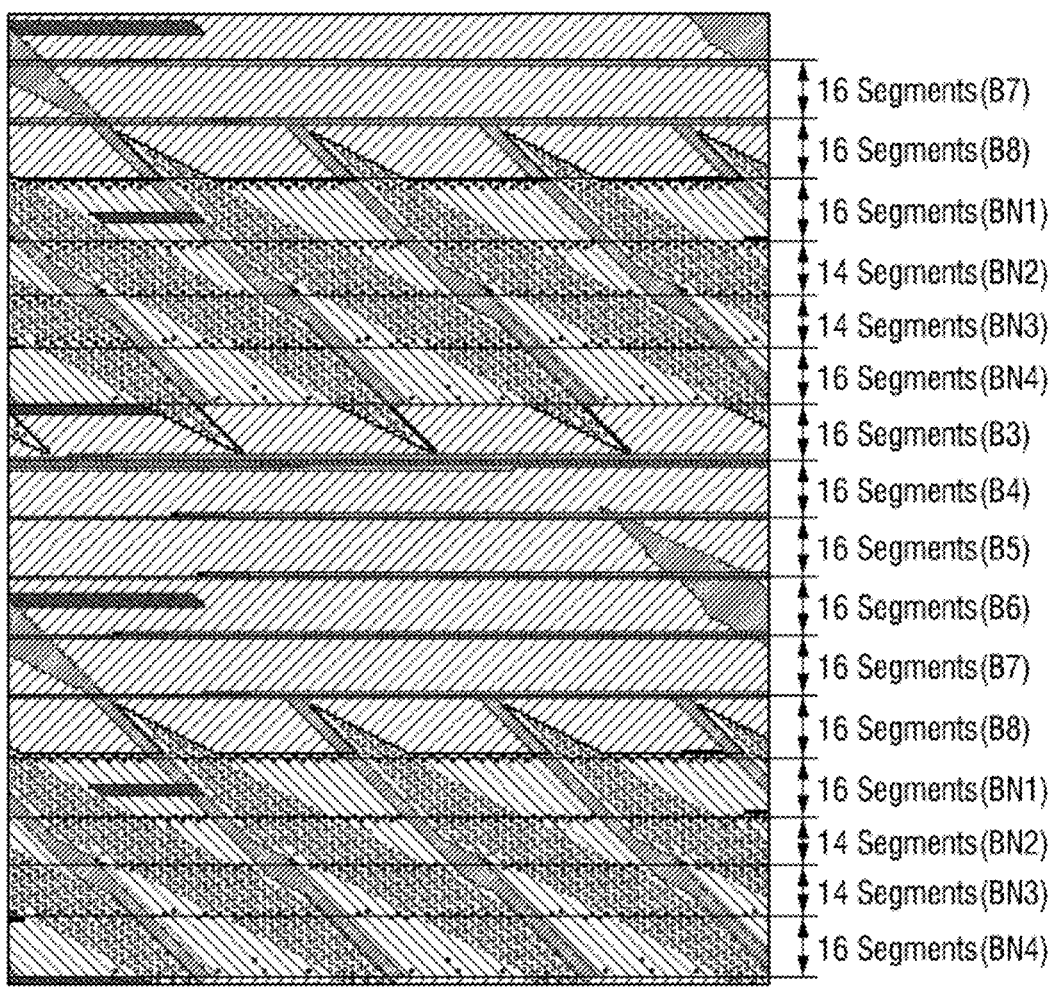

FIGS. 45 and 46 illustrate blocks being divided in a second mode and a third mode, respectively. Likewise, each of the body area and the head/tail area are divided into a plurality of b locks.

Figure 47:
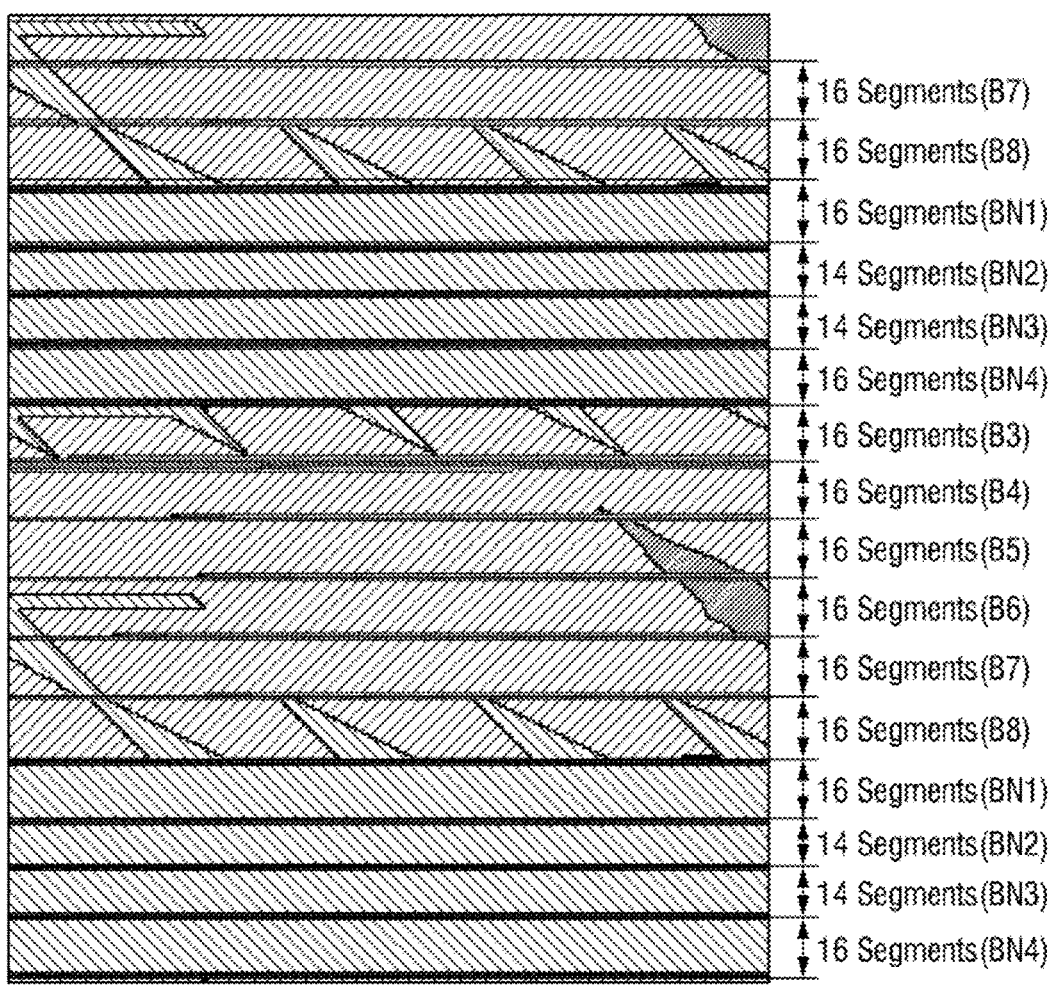

FIG. 47 illustrates blocks being divided in a fourth mode in which the head/tail area is completely filled with mobile data. As the normal data area is completely filled with the mobile data, the MPEG header of the body area and the parity portion of the normal data may not be necessary and thus they are denoted by block BN5 in FIG. 47. A BN5 portion is filled with the new mobile data in the incompatible mode and is used as the header and the parity in the compatible mode. Unlike in FIGS. 44 to 46, the head/tail area is divided into blocks BN1-BN5 in FIG. 47.

As described above, the block processor 120 of the data pre-processor 100 divides an RS frame into blocks and processes the blocks. That is, as shown in FIG. 7, the block processor 120 includes a first converter 121 which combines the mobile data in the RS frame according to a predetermined block mode, thereby outputting a serially concatenated convolutional code (SCCC) block.

The block mode may be set diversely in various exemplary embodiments.

For example, if the block mode is set to "0," each block such as BN1, BN2, BN3, BN4, and BN5 is output as a single SCCC block and serves as a unit for SCCC coding.

On the other hand, if the block is set to "1," the blocks are combined to configure a SCCC block. More specifically, BN1+BN3=SCBN1, BN2+BN4=SCBN2, and BN5 solitarily becomes SCBN3.

In addition to the mobile data placed in the second area, the first mobile data placed in the first area may be block-coded by being combined into a single block or a block group of a plurality of blocks according to the block mode. This operation is the same as in the related-art ATSC-MH and a detailed description thereof is omitted.

Information regarding the block mode may be included in existing signaling data or may be included in an area provided in new signaling data to be notified to the digital broadcast receiver. The digital broadcast receiver identifies the information regarding the block mode and decodes the data appropriately, thereby recovering the original stream.

Also, the RS frame may be configured by combining data to be block-coded as described above. That is, the frame encoder 110 of the data pre-processor 100 combines frame potions appropriately to generate an RS frame, so that the block processor 120 performs block-coding appropriately.

More specifically, an RS frame 0 is configured by combining blocks SCBN1 and SCBN2, and an RS frame 1 is configured by combining blocks SCBN3 and SCBN4.

Also, the RS frame 0 may be configured by combining blocks SCBN1, SCBN2, SCBN3, and SCBN4, and the RS frame 1 may be configured by block SCBN 5.

Also, a single RS frame may be configured by combining blocks SCBN1, SCBN2, SCBN3, SCBN4, and SCBN5.

Otherwise, an RS frame may be configured by combining a block corresponding to first mobile data and newly added blocks SCBN1~SCBN5.

Figure 48:
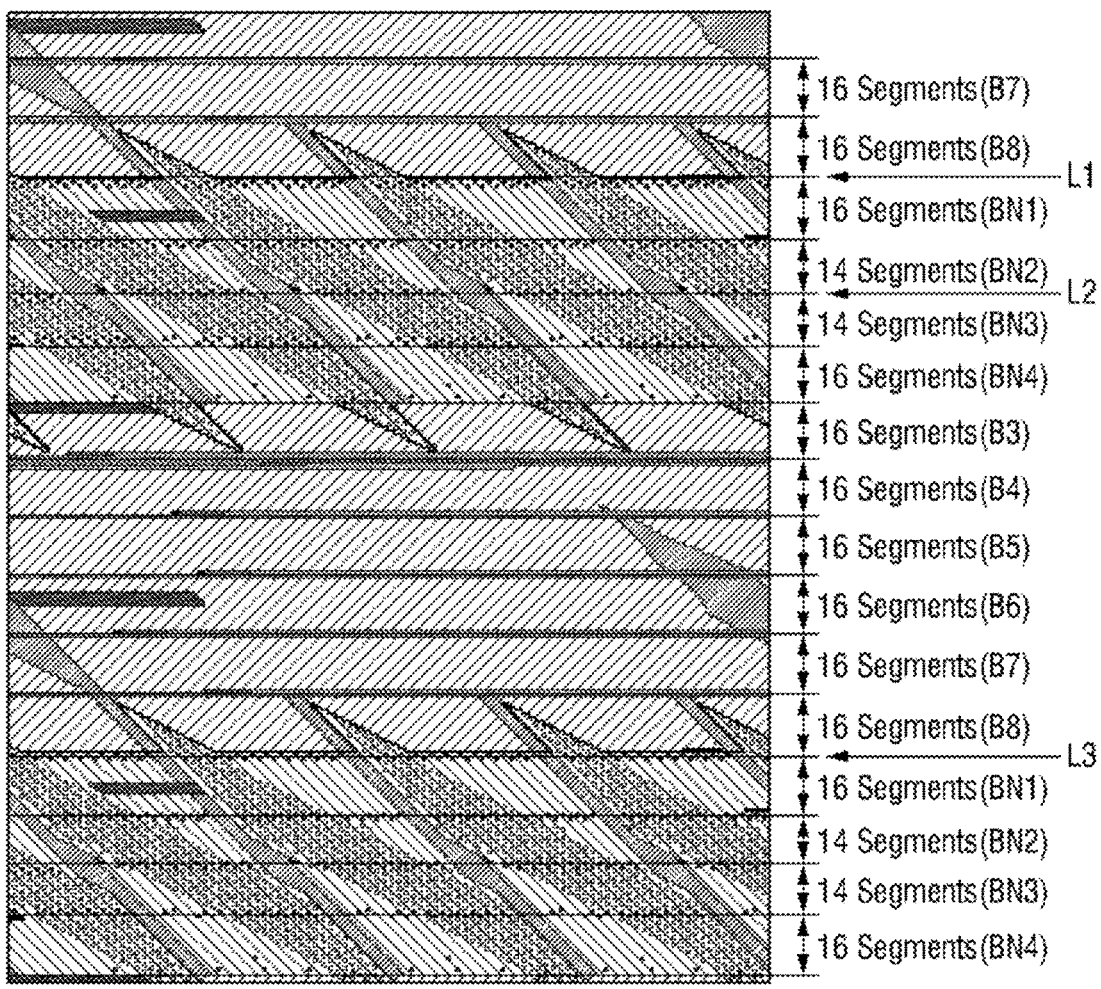
FIG. 48 is a view to explain diverse starting points of an RS frame according to various exemplary embodiments.

FIG. 48 is a view to explain various methods for defining a starting point of an RS frame. Referring to FIG. 48, a transport stream is divided into a plurality of blocks. In the related-art ATSC-MH, an RS frame is discriminated between blocks BN2 and BN3. However, the RS frame may start from various points as the mobile data and the known data are inserted into the normal data area.

For example, the RS frame may start from a boundary between BN1 and B8, may start from a boundary between BN2 and BN3, similar to a current reference point, or may start from a boundary between B8 and BN1. The starting point of the RS frame may be determined according to the combination condition of the block coding.

Configuration information of the RS frame may be included in the existing signaling data or an area provided in the new signaling data to be provided to the digital broadcast receiver.

As described above, since the new mobile data and the known data are inserted into both the area allocated to the original normal data and the area allocated to the first mobile data, diverse information for notifying the digital broadcast receiver of the existence of the new mobile data and the known data may be implemented. Such information may be transmitted using a reserved bit in a TPC area of the related-art ATSC-MH standard or may be transmitted as new signaling data contained in a new signaling data area newly provided in the stream according to an aspect of an exemplary embodiment. The new signaling data area is located in the head/tail portion since it should be in the same location irrespective of the mode.

Figure 49:
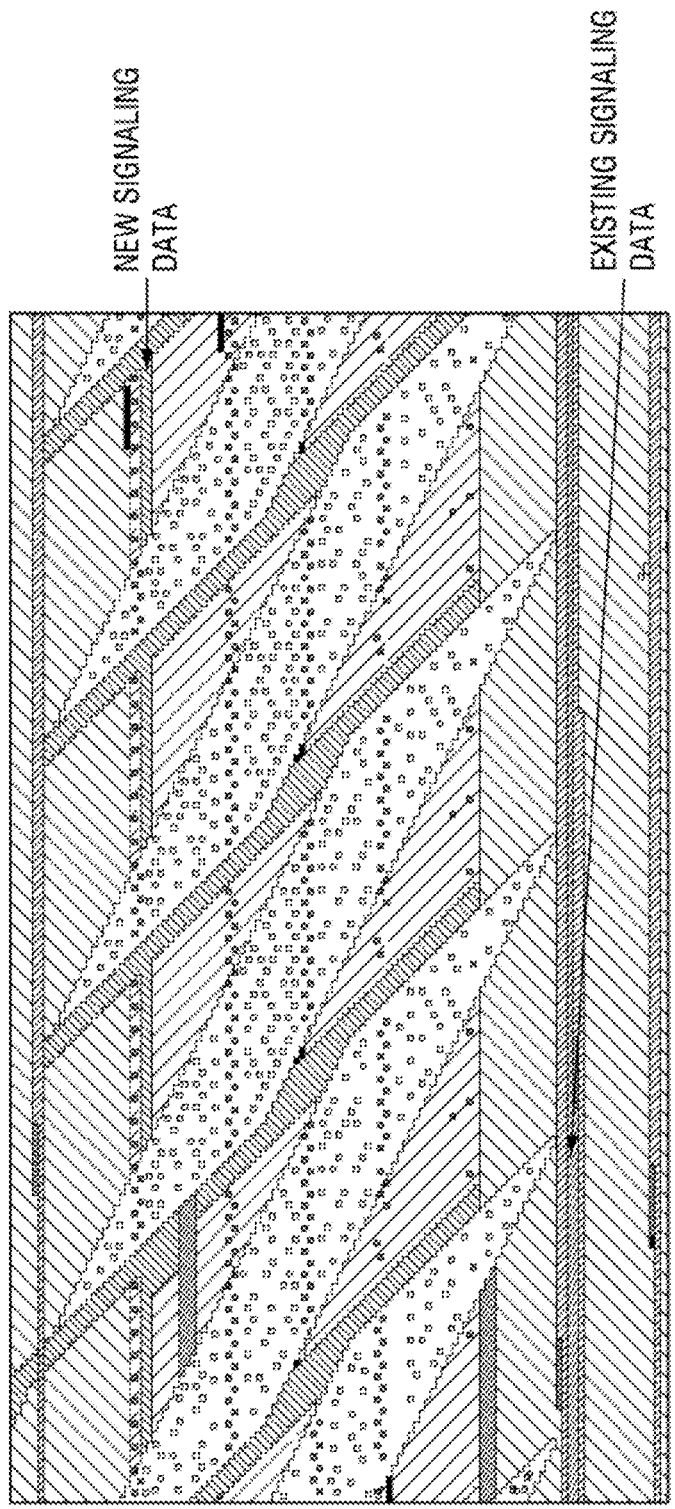
FIG. 49 is a view to explain a location where signaling data is inserted.

FIG. 49 illustrates a configuration of a stream indicating the location of related art signaling data and the location of new signaling data.

Referring to FIG. 49, the related art signaling data is located between long training sequences of the body area, and the new signaling data is located in the head/tail area. The new signaling data encoded by the signaling encoder 150 is inserted into the same predetermined location as in FIG. 49 by the group formatter 130.

The singling encoder 150 may use a code different from that of a related-art signaling encoder or perform coding at a different code rate, thereby improving performance. For example, a 1/8 PCCC code may be used in addition to an existing RS code. Alternatively, the same data is transmitted two times using a RS+1/4 PCCC code, so that the same effect as when using the 1/8 rate PCCC code can be obtained.

Also, since the known data is included in the transport stream as described above, the memory of the trellis encoder may be initialized before the known data is trellis-encoded.

If the long training sequences are provided as in the fourth mode, there is no serious problem since a corresponding sequence can be processed by a single initialization operation. However, if the known data is placed discontinuously as in the other modes, there is a problem that the initialization operation may be performed several times. Also, if the memory is initialized to 0, it may be difficult to make a symbol as in the fourth mode.

Accordingly, in the first through the third modes, a trellis encoder memory value (that is, a register value) of the mode 4 at the same location without trellis reset may be loaded directly onto the trellis encoder so as to make a same or almost same symbol as in the mode 4. To achieve this, memory storage values of the trellis encoder in the mode 4 are recorded and stored in the form of a table so that the memory storage values can be trellis encoded into values of corresponding locations of the table. Also, an additional trellis encoder operating in the mode 4 may be provided and, thus, a value obtained from the additional trellis encoder is utilized.

As described above, the mobile data can be provided diversely by utilizing the normal data area and the existing mobile data area in the transport stream. Accordingly, as compared to the related-art ATSC standard, a stream more suitable for the transmission of the mobile data can be provided.

[Signaling]

Also, a technique of notifying the digital broadcast receiver that the new mobile data and the known data are added to the transport stream in order for the receiver to process the data as described above is implemented. The notification may be made in various ways.

More specifically, in a first method, the presence/absence of the new mobile data may be notified using a data field sync which is used for transmitting existing mobile data.

Figure 50:
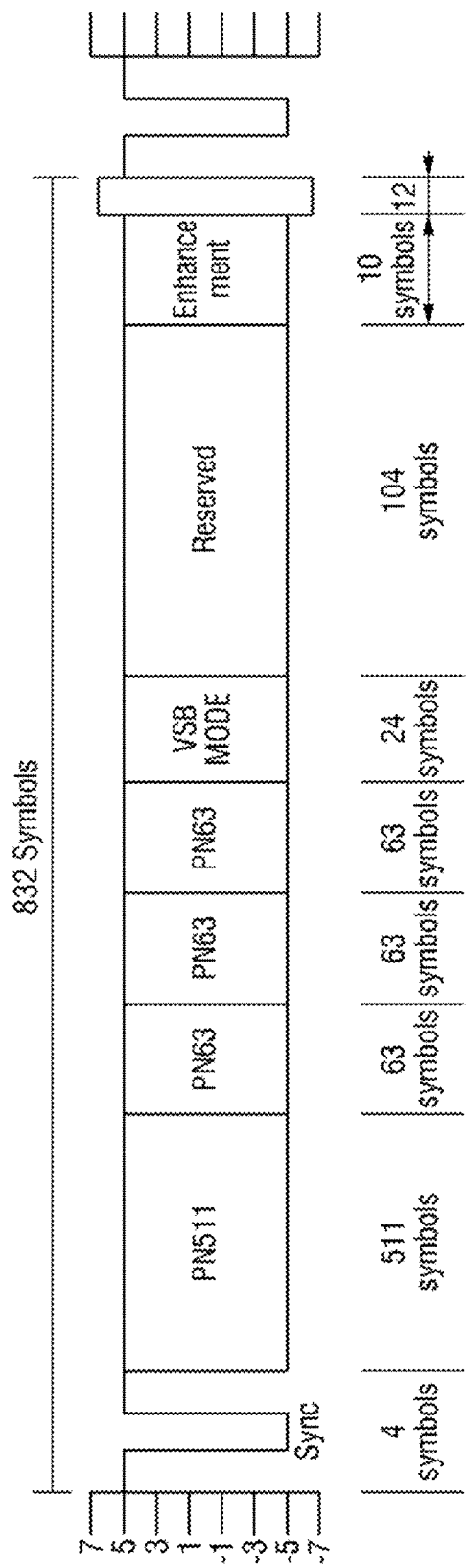
FIG. 50 is a view illustrating an example of a data field sync configuration for transmitting signaling data.

FIG. 50 is a view illustrating an example of a data field sync configuration. Referring to FIG. 50, data field sync includes 832 symbols in total, 104 symbols of which correspond to a reserved area. The $83^{rd}$ to $92^{nd}$ symbols, that is, 10 symbols in the reserved area, correspond to an enhancement area.

If only 1.0 version data is included, in the odd numbered data field, the $85^{th}$ symbol is +5 and the remaining symbols, that is, the $83^{rd}$, $84^{th}$, $86^{th}$~$92^{nd}$ symbols are −5. In the even numbered data field, the reverse sign of the symbol of the odd numbered data field is applied.

If 1.1 version data is included, in the odd numbered data field, the $85^{th}$ and $86^{th}$ symbols are +5 and the remaining symbols, that is, the $83^{rd}$, $84^{th}$, $87^{th}$, $92^{nd}$ symbols are −5. In the even numbered data field, the reverse sign of the symbol of the odd numbered data field is applied. That is, whether the 1.1 version data is included or not is determined using the $86^{th}$ symbol.

Also, whether the 1.1 version data is included or not is notified using another symbol in the enhancement area. That is, by setting one or a plurality of symbols except for the $85^{th}$ symbol to +5, it is determined whether the 1.1 version data is included or not. For example, the $87^{th}$ symbol may be used.

The data filed sync may be generated by the controller of FIG. 3, a signaling encoder, or a field sync generator additionally provided, may be provided to the sync multiplexer 470 of FIG. 4, and may be multiplexed into a stream by the sync multiplexer 470.

In a second method, the presence/absence of 1.1 version data may be notified using a TPC. The TPC includes syntax as in, for example, the following table:

TABLE 1

| Syntax | No. of Bits | Format |
|---|---|---|
| TPC_data { | | |
|   sub-frame_number | 3 | uimsbf |
|   slot_number | 4 | uimsbf |

TABLE 1-continued

| Syntax | No. of Bits | Format |
|---|---|---|
| parade_id | 7 | uimsbf |
| starting_group_number | 4 | uimsbf |
| number_of_groups_minus_1 | 3 | uimsbf |
| parade_repetition_cycle_minus_1 | 3 | uimsbf |
| rs_frame_mode | 2 | bslbf |
| rs_code_mode_primary | 2 | bslbf |
| rs_code_mode_secondary | 2 | bslbf |
| sccc_block_mode | 2 | bslbf |
| sccc_outer_code_mode_a | 2 | bslbf |
| sccc_outer_code_mode_b | 2 | bslbf |
| sccc_outer_code_mode_c | 2 | bslbf |
| sccc_outer_code_mode_d | 2 | bslbf |
| fic_version | 5 | uimsbf |
| parade_continuity_counter | 4 | uimsbf |
| total_number_of_groups | 5 | uimsbf |
| reserved | 21 | bslbf |
| tpc_protocol_version | 5 | bslbf |
| } | | |

The TPC information includes a reserved area. Accordingly, whether or not mobile data is included in the packets allocated to normal data, that is, in the second area packets, the location of the mobile data, whether new known data is added or not, and the location of added known data can be signaled using one or a plurality of bits in the reserved area.

Inserted information can be expressed, for example, as follows:

TABLE 2

| NECESSARY FIELD | Bits(Variable) |
|---|---|
| 1.1 FRAME MODE | 3 |
| 1.1 MOBILE MODE | 2 |
| 1.1 SCCC BLOCK MODE | 2 |
| 1.1 SCCCBM1 | 2 |
| 1.1 SCCCBM2 | 2 |
| 1.1 SCCCBM3 | 2 |
| 1.1 SCCCBM4 | 2 |
| 1.1 SCCCBM5 | 2 |

In Table 2, a 1.1 frame mode is information indicating whether the packet allocated to the normal data is used for normal data or used for new mobile data, that is, 1.1 version data.

A 1.1 mobile mode is information indicating in what pattern the mobile data is placed in the packets allocated to the normal data. That is, the 1.1 mobile mode is expressed by either one of "00," "01," "10," and "11" using 2 bits, thereby indicating one of the above described first to fourth modes. Accordingly, the stream is configured in various ways as in FIGS. 29, 31, 33, 35, 37, 38, 39, and 40, and the digital broadcast receiver identifies the mobile mode information to know the location of the mobile data.

A 1.1 SCCC block mode is information indicating a block mode of the 1.1 version data. The other modes 1.1 SCCCBM1~SCCCBM5 are information indicating a coding unit of the 1.1 version data.

In addition to the information described in Table 2, diverse information may be further provided so as to allow the digital broadcast receiver to detect and decode new mobile data appropriately. The number of bits allocated to each information may be changed if necessary and a location of each field may be arranged in an order different from table 2.

The presence/absence of new mobile data may be notified to the digital broadcast receiver using FIC information.

That is, a 1.1 version receiver which receives and processes new mobile data may be able to process 1.0 service information and 1.1 service information simultaneously. Conversely, a 1.0 version receiver may be able to disregard the 1.1 service information.

Accordingly, by changing existing FIC segment syntax, an area for notifying the presence/absence of 1.1 version data can be prepared.

The existing FIC segment syntax is configured, for example, as follows:

TABLE 3

| Syntax | No. of Bits | Format |
|---|---|---|
| FIC_segment_header() { | | |
|     FIC_segment_type | 2 | uimsbf |
|     reserved | 2 | '11' |
|     FIC_chunk_major_protocol_version | 2 | uimsbf |
|     current_next_indicator | 1 | bslbf |
|     error_indicator | 1 | bslbf |
|     FIC_segment_num | 4 | uimsbf |
|     FIC_last_segment_num | 4 | uimsbf |
| } | | |

The FIC segment of Table 3 may be changed, for example, as follows to be able to notify the presence/absence of 1.1 version data.

TABLE 4

| Syntax | No. of Bits | Format |
|---|---|---|
| FIC_segment_header() { | | |
|     FIC_segment_type | 2 | uimsbf |
|     current_next_indicator | 1 | bslbf |
|     error_indicator | 1 | bslbf |
|     FIC_chunk_major_protocol_version | 2 | uimsbf |
|     FIC_segment_num | 5 | uimsbf |
|     FIC_last_segment_num | 5 | uimsbf |
| } | | |

Referring to Table 4, FIC_segment_num and FIC_last_segment_num are extended to 5 bits instead of the reserved area.

In Table 4, by adding 01 to FIC_segement_type, the presence/absence of 1.1 version data can be notified. That is, if FIC_segment_type is set to 01, the 1.1 version receiver decodes FIC information and processes the 1.1 version data. In this case, the 1.0 version receiver cannot detect FIC information. Conversely, if FIC_segement_type is set to 00 or null segment, the 1.0 version receiver decodes the FIC information and processes the existing mobile data.

The presence/absence of 1.1 version data may be notified using some area of the FIC chunk syntax without changing the original FIC syntax, for example, using a reserved area.

The FIC may include 16 bits or more when configuring the maximum FIC chunk. By changing some of syntax for the FIC chunk, the status of the 1.1 version data can be notified.

More specifically, "MH 1.1 service_status" may be added to the reserved area of a service ensemble loop, for example, as follows:

TABLE 5

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       MH1.1_service_status | 2 | uimsbf |
|       reserved | 1 | '1' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

Referring to Table 5, MH 1.1_service_status may be displayed using 2 bits of the 3 bits in the reserved area. MH 1.1_service_status may be data indicating whether 1.1 version data is present or not in the stream.

In addition to MH1.1_service_status, MH1.1_ensemble_indicator may be added. That is, the syntax of the FIC chunk may be configured, for example, as follows:

TABLE 6

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     MH1.1_ensemble_indicator | 1 | bslbf |
|     reserved | 2 | '11' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       MH1.1_service_status_extension | 2 | uimsbf |
|       reserved | 1 | '1' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

Referring to Table 6, 1 bit of the 3 bits in the first reserved area is allocated to MH1.1_ensemble_indicator. MH1.1_ensemble_indicator is information regarding an ensemble which is a service unit of 1.1 version data. In Table 6, MH1.1_service_status_extension may be displayed using 2 bits of the 3 bits in the second reserved area.

In a case that a 1.1 version service is provided by changing an ensemble protocol version as in, for example, the following Table 7, the 1.1 version service is clearly presented using a value allocated to a reserved area of 1.0 version.

TABLE 7

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       reserved | 3 | '11' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

Also, signaling data may be transmitted by changing the ensemble loop header extension length of the syntax field of the FIC chunk header, adding an ensemble extension to the syntax field of the FIC chunk payload, and adding MH1.1_service_status to service loop reserved 3 bits of the syntax of the FIC chunk payload, as in, for example, the following Table 8:

TABLE 8

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     reserved | 3 | uimsbf |
|     ensemble extension | 5 | |
|     num_MH_services | 8 | uimsbf |
|     for (j=0; j<num_MH_services; j++){ | | |
|       MH_service_id | 16 | uimsbf |
|       MH_service_status_extention | 2 | |
|       reserved | 1 | |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

Also, MH_service_loop_extension_length of the syntax field of the FIC chunk header may be changed and an information field regarding MH1.1_service status of the payload field of the FIC chunk may be added, as in, for example, the following Table 9:

TABLE 9

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|       reserved | 5 | uimsbf |
|       MH1.1_Detailed_service_Info | 3 | uimsbf |
|     } | | |
|   } | | |
|   FIC_chunk_stuffing( ) | | var |
| } | | |

As described above, the signaling data may be provided to the digital broadcast receiver using diverse areas such as field sync, TPC information, and FIC information.

Also, the signaling data may be inserted into an area other than these areas. That is, the signaling data may be inserted into a packet payload portion of existing data. In this case, the presence of 1.1 version data or the location of signaling data is simply recorded using FIC information shown in Table 5, and signaling data for a 1.1 version is additionally provided so that the 1.1 version receiver detects corresponding signaling data and uses it.

The signaling data may be configured as a separate stream and may be transmitted to the digital broadcast receiver using a separate channel from a stream transmission channel.

Also, the signaling data may further include information capable of signaling at least one of presence/absence of first or new mobile data, location of mobile data, addition of known data, location of added known data, placing pattern of mobile data and known data, block mode, coding unit, and so on.

The digital broadcast transmitter using the signaling data may be implemented with a configuration including a data pre-processor to place at least one of mobile data and known data in at least one portion of a normal data area among all packets of a stream, and a multiplexer to generate a transport stream including the mobile data and the signaling data. A detailed configuration of the data pre-processor may be implemented according to one of the aforementioned exemplary embodiments or another exemplary embodiment, for example, where some element may be omitted, added or changed. In particular, the signaling data may be generated by a signaling encoder, controller, or a filed sync generator (not shown) additionally provided and may be inserted into the transport stream by the multiplexer or the sync multiplexer. In this case, the signaling data is information indicating at least one of the presence/absence of the mobile data and the placing pattern, and, as described above, may be implemented as data field sync or TPC or FIC information.

As described above, if the scalable mode 11a other than the scalable mode 11 exists, e.g., if the first through the fifth modes exist, a method of representing a mode in signaling data may be different.

According to an exemplary embodiment, a signaling field name in a TPC field may be set to a scalable mode and two bits are allocated so that four modes "00", "01", "10" and "11" are defined as in FIGS. 37 to 40. In this case, the fourth mode has the same bit value of "11" regardless of whether the fourth mode is the compatible mode or the incompatible mode. However, since the MPEG header and the parity area may or may not be used depending on the two modes, the group format may be different.

A receiver checks not only a TPC of a slot including an M/H group of an M/H parade to be received but also TPCs of other slots. If all of the slots are the scalable mode 11 and a Core Mobile Mode (CMM) slot does not exist, that is, if a normal data rate is 0 Mpbs, the receiver determines a bit value of 11 as the scalable mode 11.

On the other hand, if all of the slots are not the scalable mode 11 or if the CMM slot exists, that is, if the normal data rate is not 0 Mbps, the receiver determines the bit value of 11 as the scalable mode 11a because compatibility should be considered.

According to another exemplary embodiment, the signaling field name in the TPC field may be set to the scalable mode and three bits are allocated to that field. Accordingly, five group formats in total including the three group formats corresponding to a) to c) of FIGS. 37 to 40, that is, the first through the third modes, and the two group formats corresponding to d) of FIGS. 37 to 39, that is, the fourth mode and the fifth mode, may be signaled.

That is, as described above, the mode may include:
a first mode in which the new mobile data is placed in 11 packets of the 38 packets allocated to the normal data;
a second mode in which the new mobile data is placed in 20 packets of the 38 packet allocated to the normal data;
a third mode in which the new mobile data is placed in 29 packets of the 38 packets allocated to the normal data;
a fourth mode in which the new mobile data is placed in all of the 38 packets allocated to the normal data; and
a fifth mode in which the new mobile data is placed in all of the 38 packets allocated to the normal data and also placed in the area corresponding to the MPEG header and the parity among the areas allocated to the existing mobile data.

The first mode is defined as a scalable mode "000," the second mode is defined as a scalable mode "001," and the third mode is defined as a scalable mode "010." The fourth mode in which the 38 packets are filled with the mobile data and which should consider the compatibility is defined as a scalable mode "011," and the fifth mode in which the 38 packets are filled with the mobile data and which does not have to consider the compatibility is defined as a scalable mode "111."

In addition, in order to define an additional group format, a bit value of the scalable mode may be allocated or a signaling bit may be added.

According to the various exemplary embodiments described above, the digital broadcast transmitter may place the existing mobile data, the new mobile data, and the normal data in the stream in various ways according to the modes, and may transmit the data.

For example, as in the embodiment of FIG. 4, the stream configuration unit, that is, the group formatter 130 disposed in the data pre-processor 100, adds the known-data, the signaling data, and the initialization data to the stream processed by the block processor 120, thereby formatting the stream in a group unit.

Accordingly, if the packet formatter 140 performs packet formatting, the multiplexer 200 performs multiplexing. In this case, the multiplexer 200 multiplexes the normal data processed by the normal processor 320 in the first through the third modes. On the other hand, in the fourth and the fifth modes, the normal processor 320 does not output normal data and thus the multiplexer 200 outputs the stream provided by the packet formatter 140 as it is.

[Digital Broadcast Receiver]

As described above, the digital broadcast transmitter may transmit new mobile data using part or all of the packets allocated to normal data and part or all of the packets allocated to existing mobile data in a stream configuration.

The digital broadcast receiver which receives the above stream may receive and process at least one data from among first mobile data, normal data, and new mobile data depending on its version.

That is, once the above-mentioned streams in various configurations are received, a related art digital broadcast receiver for processing normal data may detect and decode normal data by identifying signaling data. As described above, if the received stream is in a mode which does not include normal data at all, the receiver for processing normal data may not provide a normal data service.

However, if the above-mentioned streams in various configurations are received in a 1.0 version digital broadcast receiver, the receiver may detect and decode first mobile data based on signaling data. If 1.1 version mobile data is located in entire area, the 1.0 version digital broadcast receiver may not provide a mobile service, either.

On the other hand, a 1.1 version digital broadcast receiver may detect and process not only 1.1 version data but also 1.0 version data. In this case, if a decoding block for processing normal data is formed, normal data service may be supported.

Figure 51:
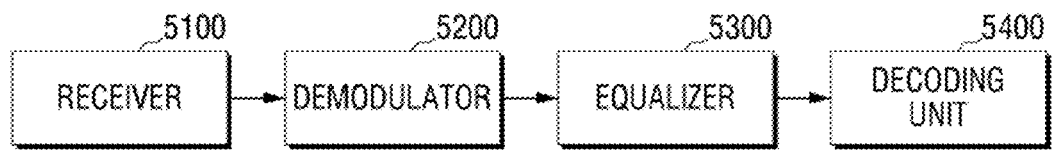
FIGS. 51 to 53 are views illustrating a digital broadcast receiver according to various exemplary embodiments.

FIG. 51 is a block diagram illustrating an example of a configuration of a digital broadcast receiver according to an exemplary embodiment. According to some, though not all, exemplary embodiments, the digital broadcast receiver may have a configuration in which elements correspond to various elements of the digital broadcast transmitter in FIGS. 2 to 4 are located reversely. Accordingly, in the exemplary embodiment in FIG. 51, only essential elements are illustrated for convenience of description.

Referring to FIG. 51, the digital broadcast receiver includes a receiver 5100, a demodulator 5200, an equalizer 5300, and a decoder 5400.

The receiver 5100 receives a transport stream transmitted from the digital broadcast transmitter via an antenna or a cable.

The demodulator 5200 demodulates the transport stream received via the receiver 5100. The frequency, clock signal, etc. of the signal received via the receiver 5100 are synchronized with the digital broadcast transmitter as they go through the demodulator 5200.

The equalizer 5300 equalizes the demodulated transport stream.

The demodulator 5200 and the equalizer 5300 may perform synchronization and equalization using known data included in the transport stream, for example, known data which is added along with new mobile data.

The decoder 5400 detects mobile data from the equalized transport stream and decodes the data.

The location where the mobile data and known data are inserted and the volume of the mobile data and known data may be notified by signaling data included in the transport stream or by signaling data received via a separate channel.

The decoder 5400 may determine a location of mobile data suitable for the digital broadcast receiver using signaling data, detect mobile data from the determined location, and decode the mobile data.

The configuration of the decoder 5400 may vary according to various exemplary embodiments.

That is, the decoder 5400 may include two decoders of a trellis decoder (not shown) and a convolution decoder (not shown). The two decoders may enhance performance by exchanging information on decoding reliability with each other. The output of the convolution decoder may be identical or similar to the input of the RS encoder of the transmitter.

Figure 52:
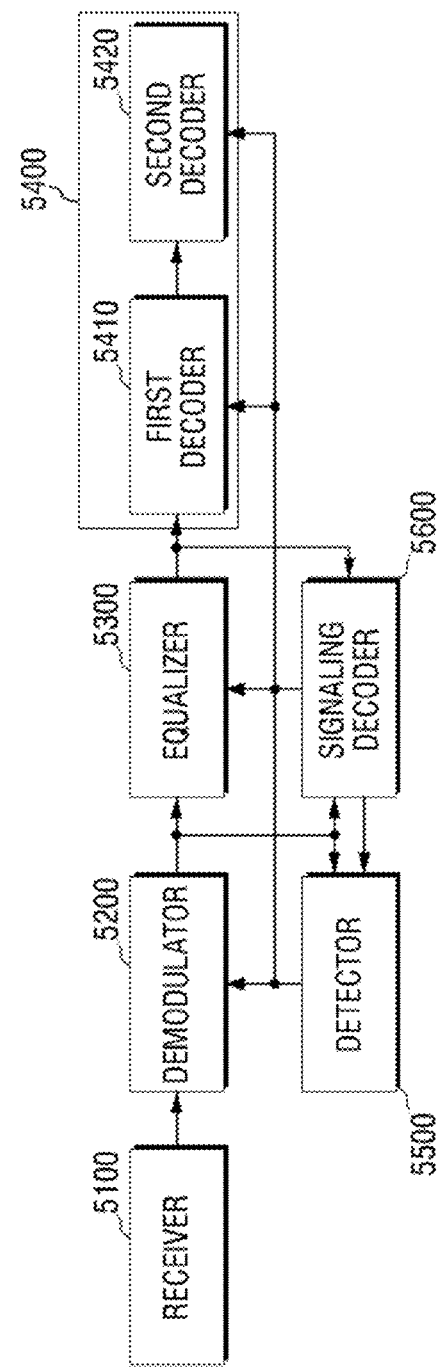

FIG. 52 is a block diagram illustrating an example of a detailed configuration of a digital broadcast receiver according to an exemplary embodiment.

Referring to FIG. 52, the digital broadcast receiver may include the receiver 5100, the demodulator 5200, the equalizer 5300, the decoder 5400, a detector 5500, and a signaling decoder 5600.

Since operations of the receiver 5100, the demodulator 5200, the equalizer 5300 are the same or similar to those in FIG. 51, explanations thereof will not be provided herein.

The decoder 5400 may include a first decoder 5410 and a second decoder 5420.

The first decoder 5410 decodes at least one of first mobile data and new mobile data. The first decoder 5410 may perform SCCC decoding which decodes data by block.

The second decoder 5420 performs RS decoding on the stream that has been decoded by the first decoder 5410.

The first and second decoders 5410, 5420 may process mobile data using the output value of the signaling decoder 5600.

That is, the signaling decoder 5600 may detect signaling data included in the stream and decode the data. Specifically, the signaling decoder 5600 de-multiplexes a reserved area in field sync data, or a TPC information area and an FIC information area from the transport stream. Accordingly, the de-multiplexed portion is convolutional decoded and RS decoded, and derandomized so that signaling data may be recovered. The recovered signaling data is provided to each element of the digital broadcast receiver, that is, the demodulator 5200, the equalizer 5300, the decoder 5400, and the detector 5500. The signaling data may include information that is used by each element, such as block mode information, mode information, known data insertion pattern information, and RS frame mode information. The types and functions of such information have been explained above, so further explanation regarding them is not provided herein.

A variety of information such as a coding rate of mobile data, a data rate, an inserting location, a type of used error correction code, information on a primary service, information used to support time slicing, a description regarding mobile data, information relating to the mode information conversion, and information used to support an internet protocol (IP) service may be provided to the receiver in the form of signaling data or additional data.

The signaling data may be included in the stream in FIG. 52. However, if a signaling data signal is transmitted through a separate channel, the signaling decoder 5600 decodes such a signaling data signal and provides the above information.

The detector 5500 may detect known data from the stream using the known data insertion pattern information provided by the signaling decoder 5600. In this case, known data that is inserted together with the first mobile data may be processed in addition to the known data that is inserted together with the new mobile data.

Specifically, the known data may be inserted into at least one of the body area and the head/tail area of the mobile data in various locations and various patterns as shown in FIGS. 22 to 36. The information on the insertion pattern of the known data, for example, at least one of the location, the starting point, the length may be included in the signaling data. The detector 5500 may detect known data from an appropriate location according to the signaling data, and provide the demodulator 5200, the equalizer 5300, and the decoder 5400 with the detected known data.

Figure 53:
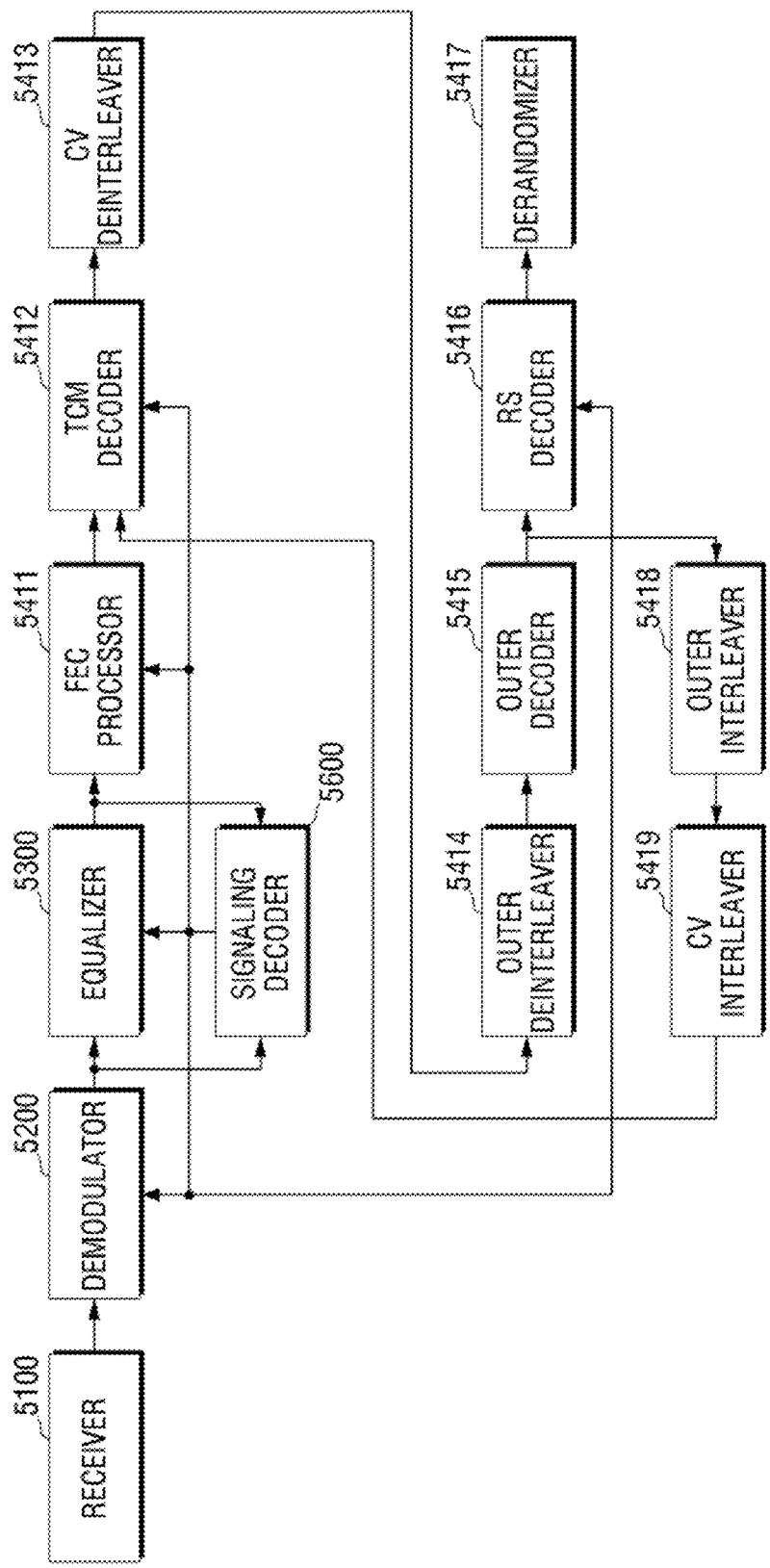

FIG. 53 is a view illustrating a detailed configuration of a digital broadcast receiver according to yet another exemplary embodiment.

Referring to FIG. 53, the digital broadcast receiver may include a receiver 5100, a demodulator 5200, an equalizer 5300, an FEC processor 5411, a TCM decoder 5412, a CV deinterleaver 5413, an outer deinterleaver 5414, an outer decoder 5415, an RS decoder 5416, a derandomizer 5417, an outer interleaver 5418, a CV interleaver 5419, and a signaling decoder 5600.

Since the operations or similar operations of the receiver 5100, the demodulator 5200, the equalizer 5300, and the signaling decoder 5600 have been described with reference to FIG. 52, overlapping explanations are not provided herein. Unlike in FIG. 52, the detector 5500 is not illustrated in FIG. 53. Each element may directly detect known data using the signaling data which is decoded by the signaling decoder 5600 as in the exemplary embodiment illustrated in FIG. 53.

The FEC processor 5411 may perform a forward error correction for the transport stream that is equalized by the equalizer 5300. The FEC processor 5411 may detect the known data from the transport stream using the information on the known data location or the insertion pattern among the information provided by the signaling decoder 5600 in order to use the known data in performing the forward error correction. Alternatively, an additional reference signal may not be used for the forward error correction according to another exemplary embodiment.

In FIG. 53, each element is placed in a configuration of decoding the mobile data after the FEC processing. That is, the FEC processing is performed for the entire transport stream. Alternatively, the elements may be implemented in a configuration of detecting the mobile data from the transport stream and then performing the FEC for only the mobile data.

The TCM decoder 5412 detects the mobile data from the transport stream output from the FEC processor 5411, and performs trellis decoding for the mobile data. In this case, if the FEC processor 5411 has already detected the mobile data, and performed the forward error correction for only the mobile data, the TCM decoder 5412 may immediately perform the trellis decoding for the input data.

The CV deinterleaver 5413 performs convolution de-interleaving for the trellis decoded data. As described above, since the configuration of the digital broadcast receiver may correpsond to the configuration of the digital broadcast transmitter which configures and processes the transport stream, the CV de-interleaver 5413 may not be used or included according to the configuration of the transmitter.

The outer de-interleaver 5414 performs outer de-interleaving for the convolution de-interleaved data. After this, the outer decoder 5415 decodes the outer de-interleaved data in order to remove a parity that is inserted into the mobile data.

In some situations, the digital broadcast receiver may improve a performance in receiving the mobile data by repeating the operations from the TCM decoder 5412 to the outer decoder 5415 one or more times. For the repeated operations, the data decoded by the outer decoder 5415 may be provided to the TCM decoder 5412 passing through the outer interleaver 5418 and the CV interleaver 5419. In this situation, the CV interleaver 5419 may not be used or included according to the configuration of the transmitter.

The trellis decoded data may be provided to the RS decoder 5416. The RS decoder 5416 may perform RS decoding for the provided data, and the derandomizer 5417 may perform derandomizing for the provided data. The operations may allow the stream of the mobile data, in particular, newly defined 1.1 version mobile data to be processed.

As described above, if a 1.1 version digital broadcast receiver is provided, 1.0 version data may also be processed in addition to 1.1 version data.

That is, at least one of the FEC processor 5411 and the TCM decoder 5412 detects the entire mobile data except for the normal data, and processes the detected data.

Alternatively, if a common digital broadcast receiver is provided, the common digital broadcast receiver may include a block for processing the normal data, a block for processing the 1.0 version data, and a block for processing the 1.1 version data. In this case, a plurality of processing paths are provided on a rear end of the equalizer 5300, and each of the above blocks is disposed on each processing path. Therefore, at least one of the processing paths is selected according to a control of a controller (not shown) so that the proper data for the transport stream may be included in each processing path.

In addition, as described above, the mobile data may be placed in the transport stream in a different pattern for each slot. That is, various types of slot such as the first type of slot in which normal data is included as is, the second type of slot in which new mobile data is included in the entire area of the normal data, the third type of slot in which new mobile data is included in an area of the normal data area, and the fourth type of slot in which new mobile data is included in the normal data area and the entire existing mobile data area may be configured repeatedly according to a predetermined pattern.

The signaling decoder 5600 decodes the signaling data and notifies each element of the RS frame mode information or other mode information. Therefore, each element, including the FEC processor 5411 and the TCM decoder 5412, detect the mobile data at a predetermined location for each slot and processes the detected mobile data.

Though a controller is omitted in FIGS. 51 to 53, it is understood that a controller which applies a control signal to each block using the signaling data decoded by the signaling decoder 5600 may be additionally provided. Such a controller may control a tuning operation of the receiver 5100 according to a user's selection.

In the case of a 1.1 version receiver, 1.0 version data or 1.1 version data may be provided according to the user's selection. In addition, in the case where a plurality of 1.1 version data is provided, one of those services may be provided according to the user's selection.

In particular, at least one of the normal data, the existing mobile data, and the new mobile data may be placed in the stream and transmitted, as in the first through the fourth modes or the first through the fifth modes (herein, the first through the fourth mode may be the compatible mode or only the fourth mode is the incompatible mode).

In this case, the digital broadcast receiver detects each of data from an appropriate location according to a mode and performs decoding by applying an appropriate decoding scheme.

More specifically, in an exemplary embodiment in which the mode is represented in two bits so that a TPC signaling field recorded as "00," "01," "10," or "11" is recorded, if the digital broadcast receiver checks a value of 11 in the signaling data, the digital broadcast receiver checks not only the TPC of the slot including the M/H group of the M/H parade to be received but also the TPCs of other slots. Accordingly, if mode information of all of the slots is "11" and the CMM slot does not exist, it is determined that the fourth mode is set to the incompatible mode. Accordingly, the digital broadcast receiver may decode the MPEG header and the parity area in which the new mobile data is placed, for example, the SB5 area, in the same method as in the remaining body area stream. On the other hand, if the scalable mode of all of the slots is not "11" or if the CMM slot exists, it is determined that the set mode is the compatible mode, i.e., the scalable mode 11a, and the MPEG header and the parity area, that is, the SB5 area, is decoded in a different method from that of the remaining body area stream. In other words, the MPEG header and the parity area may be decoded in a decoding scheme corresponding to a coding scheme of the new mobile data. The TPC and the mode of each slot may be identified by a signaling decoder or a separately provided controller.

In an exemplary embodiment in which the mode is represented in three bits so that signaling bits such as "000," "001," "010," "011," and "111" are transmitted, the digital broadcast receiver identifies a mode according to the bit value and performs corresponding decoding.

The digital broadcast transmitter may configure a transport stream by combining the normal data, the existing mobile data, and the new mobile data and then transmit the configured transport stream. Accordingly, the digital broadcast receiver to receive and process the transport stream may be realized in various forms. That is, the digital broadcast receiver may be realized as a normal data receiver capable of processing only normal data, an existing mobile data receiver capable of processing only existing mobile data, a new mobile data receiver capable of processing only new mobile data, and a common receiver capable of processing at least two of these aforementioned data.

If the digital broadcast receiver is realized as the normal data receiver, data to be processed does not exist in the incompatible fourth mode or the incompatible fifth mode, unlike in the first through the compatible fourth mode. Accordingly, the digital broadcast receiver may disregard the transport stream that the digital broadcast receiver cannot recognize and process.

On the other hand, if the digital broadcast receiver is the existing mobile data receiver or the common receiver capable of processing the existing mobile data and the normal data, the receiver decodes a slot including only the normal packets or the normal data included in all of the 38 packets or some of the 38 packets in order to process the normal data, and detects and decodes the existing mobile data included in packets other than the 38 packets in order to process the existing mobile data.

In particular, in the case that the slot includes the new mobile data, if the block mode is a separate mode as described above, a primary ensemble portion is filled with the existing mobile data and a secondary ensemble portion is filled with the new mobile data, so that both the existing mobile data and the new mobile data can be transmitted using one slot. Accordingly, if the mode is the scalable mode 11, the receiver decodes the remaining body area except for SB5 in order to process the existing mobile data. On the other hand, if the mode is the scalable mode 11a, SB5 is not filled with the new mobile data and thus the entire body area is decoded in order to process the existing mobile data. If the block mode is a paired mode, all of the blocks are filled with only the 1.1 mobile data and thus the receiver disregards the corresponding slot in order to process the existing mobile data.

Likewise, if the digital broadcast receiver is the new mobile data receiver or the common receiver capable of processing the new mobile data and the other data, the decoding is performed according to the block mode and the mode. That is, if the block mode is the separate mode and the mode is the scalable mode 11, an independent block of the SB5 area and a block allocated the new mobile data is decoded in a decoding scheme corresponding to a coding scheme of the new mobile data. If the mode is the scalable mode 11a, the block allocated the new mobile data is decoded in a decoding scheme corresponding to a coding scheme of the new mobile data. On the other hand, if the block mode is the paired mode, all of the blocks may be decoded.

In FIGS. 51 to 53, the separately provided controller or the signaling decoder identifies the block mode and the mode and controls decoding as described above. In particular, if two bits of signaling data represent the mode and a bit value of 11 is transmitted, the controller or the signaling decoder may identify not only the TPC of the slot including the M/H group of the M/H parade to be received but also the TPCs of other slots. Accordingly, if it is identified that a normal data rate is 0 Mbps, it is determined that the bit value of 11 is the scalable mode 11 and decoding is performed. On the other hand, if the scalable mode of all of the slots is not "11" or if the CMM slot exists, that is, if the normal data rate is not 0 Mbps, it is determined that the bit value of 11 is the scalable mode 11a and decoding is performed.

The digital broadcast receiver illustrated in FIGS. 51 to 53 may be a set-top box, a TV, a personal computer, a general purpose computer, a special-purpose computer, and a portable device such as a mobile telephone, personal digital assistant (PDA), MP3 player, electronic dictionary, and laptop computer. Furthermore, although not illustrated in FIGS. 51 to 53, it is understood that an element may be included which scales the decoded data appropriately and/or converts the decoded data, and outputs the scaled and/or converted decoded data on, for example, a screen in the form of audio and video data.

Meanwhile, a stream configuring method of a digital broadcast transmitter and a stream processing method of a digital broadcast receiver according to an exemplary embodiment may also correspond to the aforementioned block diagrams and the stream configuration views.

In other words, the stream configuring method of the digital broadcast transmitter may include: placing mobile data in at least a part of the packets allocated to normal data of the entire packets configuring the stream, and configuring a transport stream with the mobile data.

The placing the mobile data may be performed by the data pre-processor 100 illustrated in FIGS. 2 to 4.

The mobile data may be placed in various locations either together with the normal data and the existing mobile data, or independently, as in the aforementioned various exemplary embodiments. In other words, the mobile data and the known data may be placed in various methods as in FIGS. 15 to 40.

In addition, the configuring multiplexes the normal data that has been processed apart from the mobile data with the mobile data, to configure a transport stream.

The configured transport stream undergoes various processes such as RS encoding, interleaving, trellis encoding, sink multiplexing, and modulating, and is then transmitted to the receiver. Processing the transport stream may be performed by various elements of the digital broadcast receiver illustrated in FIG. 4.

The various exemplary embodiments of the stream configuring method may correspond to the various operations of the aforementioned digital broadcast transmitter.

Meanwhile, the stream processing method of the digital broadcast receiver according an exemplary embodiment may include: dividing into a first area which is allocated to first mobile data and a second area which is allocated to normal data, and receiving a transport stream where the mobile data has been placed in at least a portion of the second area apart from the first mobile data; demodulating the received transport stream; equalizing the demodulated transport stream; and decoding at least one of the first mobile data and the mobile data from the equalized transport stream.

The received transport stream according to an exemplary embodiment may be a transport stream that is configured and transmitted by the digital broadcast transmitter according to any of the aforementioned various exemplary embodiments. That is, the transport stream may be the mobile data placed in various methods as in FIGS. 15 to 21 and 29 to 40. In addition, the known data may also be placed in various methods as illustrated in FIGS. 22 to 28.

The various exemplary embodiments for the stream processing method may correspond to the various exemplary embodiments of the aforementioned digital broadcast receiver.

Meanwhile, the exemplary embodiments of the configurations of the various streams as illustrated in the aforementioned FIGS. 15 to 40 are not limited to just one configuration, but may be switched to different configurations according to different situations. That is, the data pre-processor 100 may place the mobile data and the known data, and block code the mobile data and the known data, with reference to various RS frame modes, modes, and block modes, according to a control signal applied from a separately provided controller or an externally input control signal. Accordingly, a digital broadcast enterpriser is able to provide the desired data, including the mobile data, in various sizes.

Furthermore, the aforementioned new mobile data, that is, 1.1 version data may be the same data as other mobile data, for example, 1.0 version data, or may be a different data input from a different source. In addition, a plurality of 1.1 version data may be contained in one slot and transmitted together. Accordingly, a user of the digital broadcast receiver is able to view various types of data that the user desires.

<Block Processing Method>

The above-described various exemplary embodiments may be modified diversely.

For example, the block processor 120 of FIG. 4 may perform block coding by appropriately combining the existing mobile data, the normal data, the new mobile data, and the known data placed in the stream. Herein, the new mobile data and the known data may be placed in not only at least a part of the normal data area allocated to the normal data but also at least a part of the existing mobile data area allocated to the existing mobile data. That is, the normal data, the new mobile data, and the existing mobile data may co-exist.

Figure 54:
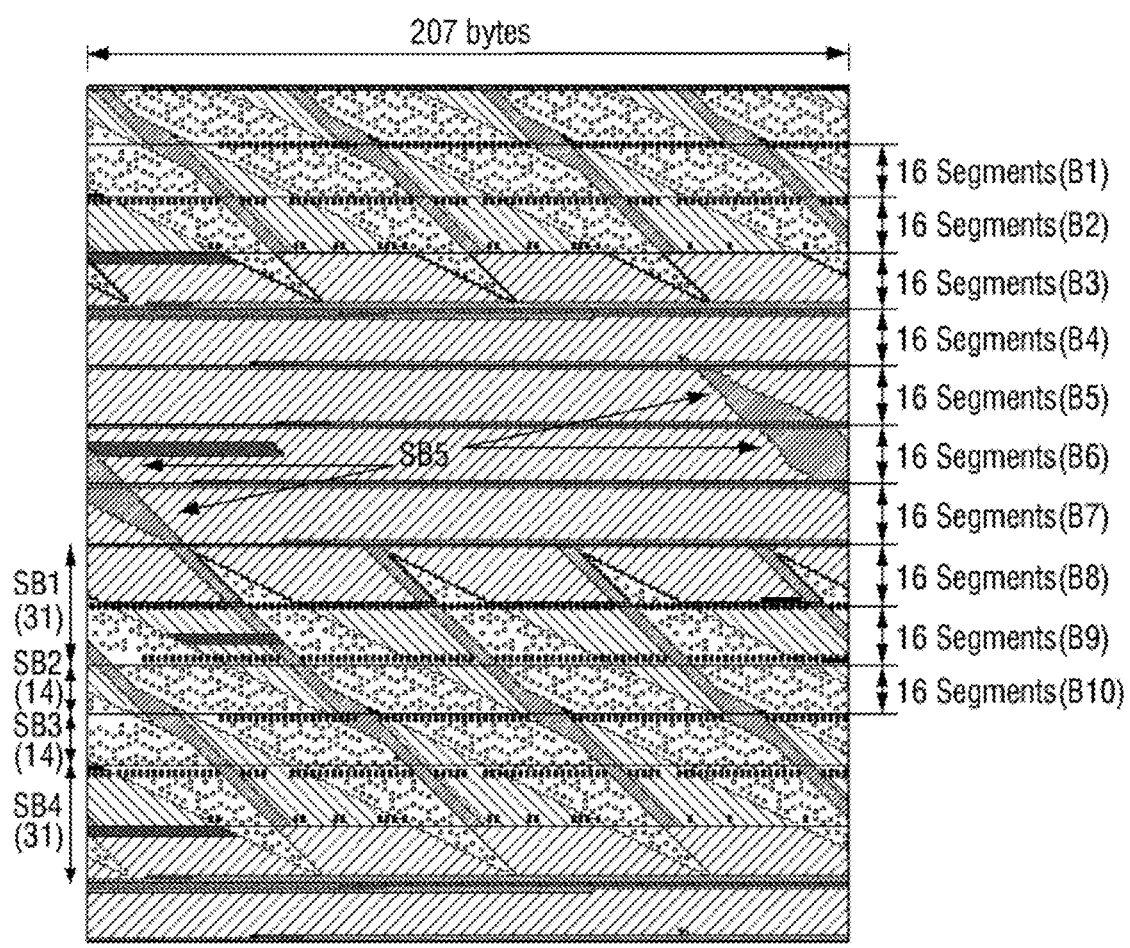
FIG. 54 is a view illustrating an example of a stream format after interleaving.
Figure 55:
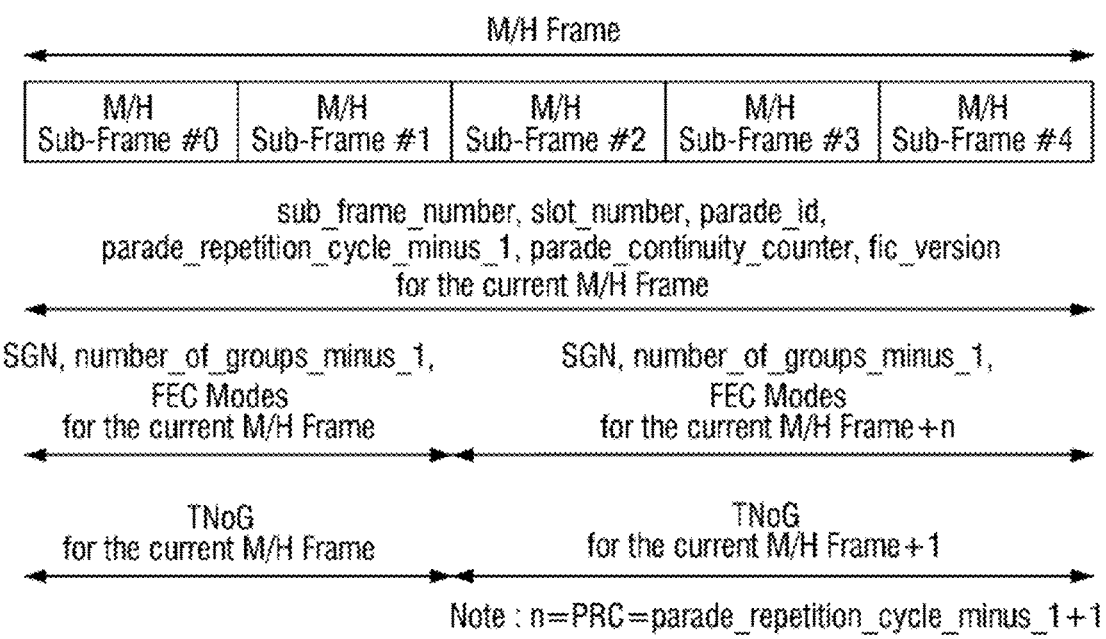
FIG. 55 is a view to explain an example of a method of signaling information of a next frame in advance.

FIG. 54 illustrates an example of a stream format after interleaving. In FIG. 54, a stream including a mobile data group includes 208 data segments. First five segment among these segments correspond to RS parity data and thus are excluded from the mobile data group. Accordingly, the mobile data group of the 203 data segments in total is divided into 15 mobile data blocks. More specifically, the mobile data group includes blocks B1 to B10 and blocks SB1 to SB5. Blocks B1 to B10 may correspond to the mobile data placed in the existing mobile data area as shown in FIG. 8. On the other hand, blocks SB1 to SB5 may correspond to the new mobile data allocated to the existing normal data area. Block SB5 includes an MPEG header and an RS parity for the sake of backward compatibility.

Each of blocks B1 to B10 includes 16 segments, and each of blocks SB1 and SB4 includes 31 segments and each of blocks SB2 and SB3 includes 14 segments.

These blocks, that is, blocks B1 to B10 and blocks SB1 to SB5, may be combined in various forms and may be block-coded.

That is, as described above, the block mode may be set diversely, for example, to "00" or "01." If the block mode is set to "00," each SCB block and an SCCC output block length (SOBL) and an SCCC input block length (SIBL) of each SCB block are shown in the following table:

TABLE 10

| SCCC Block | SOBL | SIBL ½ rate | SIBL ¼ rate |
|---|---|---|---|
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

Referring to Table 10, blocks B1 to B10 become blocks SCB1 to SCB10.

If the block mode is set to "01," each SCB block and a SOBL and a SIBL of each SCB block are shown in the following table:

TABLE 11

| SCCC Block | SOBL | SIBL ½ rate | SIBL ¼ rate |
|---|---|---|---|
| SCB1 (B1 + B6) | 3000 | 1500 | 750 |
| SCB2 (B2 + B7) | 4308 | 2154 | 1077 |
| SCB3 (B3 + B8) | 4884 | 2442 | 1221 |
| SCB4 (B4 + B9) | 3804 | 1902 | 951 |
| SCB5 (B5 + B10) | 3252 | 1626 | 813 |

Referring to Table 11, blocks B1 and B6 are combined to configure one SCB1. In the same manner, blocks B2 and B7, blocks B3 and B8, blocks B4 and B9, and blocks B5 and B10 are combined to configure blocks SCB2, SCB3, SCB4, and SCB5, respectively. Also, the input block length is different according to whether the rate is 1/2 or 1/4.

As described above, configuring the SCB blocks by combining blocks B1 to B10 is an operation that is performed if the new mobile data is not placed, that is, an operation in a CMM mode.

In the Scalable Full-Channel Mobile Mode (SFCMM) in which the new mobile data is placed, the blocks may be combined differently to configure the SCB blocks. That is, the existing mobile data and the new mobile data may be combined so that SCCC block-coding can be achieved. Tables 12 and 13 below illustrate examples of blocks being combined differently according to the RS frame mode and the slot mode.

TABLE 12

| | RS Frame Mode | | | |
|---|---|---|---|---|
| | 00 | | 01 | |
| | SCCC Block Mode | | | |
| | 00 | 01 | 00 | 01 |
| | Description | | | |
| SCB | Separate SCCC Block Mode SCB input, M/H Blocks | Paired SCCC Block Mode SCB input, M/H Blocks | Separate SCCC Block Mode SCB input, M/H Blocks | Paired SCCC Block Mode SCB input, M/H Blocks |
| SCB1 | B1 | B1 + B6 + SB3 | B1 | B1 + SB3 + B9 + SB1 |
| SCB2 | B2 | B2 + B7 + SB4 | B2 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | SB3 | |
| SCB6 | B6 | | SB4 | |
| SCB7 | B7 | | | |
| SCB8 | B8 | | | |
| SCB9 | B9 + SB1 | | | |
| SCB10 | B10 + SB2 | | | |
| SCB11 | SB3 | | | |
| SCB12 | SB4 | | | |

In Table 12, the RS frame mode implies information indicating whether one slot includes one ensemble (i.e., the RS frame mode is "00") or whether one slot includes a plurality of ensembles such as a primary ensemble and a secondary ensemble (i.e., the RS frame mode is "01"). The SCCC block mode implies information indicating whether the mode is to process an individual SCCC block or whether the mode is to process the SCCC block by combining a plurality of blocks, like the above-described block mode.

Table 12 illustrates a case where the slot mode is "00." The slot mode is information indicating a reference for discriminating a start and an end of a slot. That is, if the slot mode is "00," a portion including blocks B1 to B10 and blocks SB1 to SB5 for the same slot as they are is classified as one slot. If the slot mode is "01," blocks B1 and B2 are given to a previous slot and blocks B1 and B2 of a following slot are included in a current slot so that a portion including 15 blocks in total is classified as one slot. The slot mode may be called diversely according to a version of a standard document. For example, the slot mode may be called a block extension mode. This will be explained in detail below.

Referring to Table 12, if the RS frame mode is "00" and the SCCC block mode is "00," blocks B1 to B8 are used as blocks SCB1 to SCB8 and blocks B9 and SB1 are combined to configure block SCB9. Blocks B10 and SB2 are combined to configure block SCB10 and blocks SB3 and SB4 are used as blocks SCB11 and SCB12. On the other hand, if the SCCC block mode is "01," blocks B1, B6, and SB3 are combined and used as block SCB1, and B2+B7+SB4 are used as block SCB2 and B3+B8, B4+B9+SB1, and B5+B10+SB2 are used as blocks SCB3, SCB4, and SCB5, respectively.

On the other hand, if the RS frame mode is "01" and the SCCC block mode is "00," then B1, B2, B9+SB1, B10+SB2, SB3, and SB4 are used as blocks SCB1 to SCB6, respectively. If the SCCC block mode is "01", B1+SB3+B9+SB1 is used as block SCB1 and B2+SB4+B10+SB2 is used as block SCB2.

Also, if the slot mode is "01" and the new mobile data is placed according to the first, second, and third modes as described above, SCCC blocks are combined as in Table 13 below:

TABLE 13

| | RS Frame Mode | | | |
|---|---|---|---|---|
| | 00 | | 01 | |
| | SCCC Block Mode | | | |
| | 00 | 01 | 00 | 01 |
| | Description | | | |
| SCB | Separate SCCC Block Mode SCB input, M/H Blocks | Paired SCCC Block Mode SCB input, M/H Blocks | Separate SCCC Block Mode SCB input, M/H Blocks | Paired SCCC Block Mode SCB input, M/H Blocks |
| SCB1 | B1 + SB3 | B1 + B6 + SB3 | B1 + SB3 | B1 + SB3 + B9 + SB1 |
| SCB2 | B2 + SB4 | B2 + B7 + SB4 | B2 + SB4 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | | |
| SCB6 | B6 | | | |
| SCB7 | B7 | | | |
| SCB8 | B8 | | | |
| SCB9 | B9 + SB1 | | | |
| SCB10 | B10 + SB2 | | | |

Referring to Table 13, blocks B1 to B10 and blocks SB1 to SB5 are combined in various ways according to a setting condition of the RS frame mode and the SCCC block mode.

If the slot mode is "01" and the new mobile data is placed in the entire normal data area according to the fourth mode described above, the SCB blocks are configured in various combinations as in Table 14 below:

TABLE 14

| | RS Frame Mode | | | |
|---|---|---|---|---|
| | 00 | | 01 | |
| | SCCC Block Mode | | | |
| | 00 | 01 | 00 | 01 |
| | Description | | | |
| SCB | Separate SCCC Block Mode SCB input, M/H Blocks | Paired SCCC Block Mode SCB input, M/H Blocks | Separate SCCC Block Mode SCB input, M/H Blocks | Paired SCCC Block Mode SCB input, M/H Blocks |
| SCB1 | B1 + SB3 | B1 + B6 + SB3 + SB5 | B1 + SB3 | B1 + SB3 + B9 + SB1 |
| SCB2 | B2 + SB4 | B2 + B7 + SB4 | B2 + SB4 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | | |
| SCB6 | B6 + SB5 | | | |
| SCB7 | B7 | | | |
| SCB8 | B8 | | | |
| SCB9 | B9 + SB1 | | | |
| SCB10 | B10 + SB2 | | | |

As described above, the existing mobile data, the normal data, and the new mobile data are classified into blocks and the blocks are combined variously according to the mode, so that the SCCC blocks are configured. Accordingly, the SCCC blocks are combined to configure the RS frame.

Combining and coding the blocks may be performed by the data pre-processor 100 described in the above exemplary embodiments. More specifically, the block processor 120 of the data pre-processor 100 combines the blocks and performs block-coding. The other processes have been described in the above exemplary embodiments and thus redundant descriptions thereof are omitted herein.

A coding rate to code the SCCC block, that is, an SCCC outer code rate may be determined differently according to an outer code mode. The outer code mode is described in following table:

TABLE 15

| SCCC outer code mode | Description |
|---|---|
| 00 | The outer code rate of a SCCC Block is ½ rate |
| 01 | The outer code rate of a SCCC Block is ¼ rate |
| 10 | The outer code rate of a SCCC Block is ⅓ rate |
| 11 | Reserved |

As described in Table 15, the SCCC outer code mode may be set to various values such as "00," "01," "10," and "11." If the SCCC outer code mode is "00," the SCCC block is coded by a code rate of 1/2, if the SCCC outer code mode is "01," the SCCC block is coded by a code rate of 1/4, and if the SCCC outer code mode is "10," the SCCC block is coded by a code rate of 1/3. The code rate may be changed in a variety of ways, for example, according to a version of a standard. A newly added code rate may be assigned to the SCCC outer code mode "11." A matching relationship between the above-described SCCC outer code mode and the code rate may be changed. The data pre-processor 100 may code the SCC block by an appropriate code rate according to a setting condition of the outer code mode. The setting condition of the outer code mode may be notified by the controller 310 or other elements or may be identified through a separate signaling channel. The 1/3 code rate receives a 1-bit input and outputs a 3-bit output. An encoder may be configured diversely. For example, the encoder may be configured in combination of the 1/2 code rate and the 1/4 code rate or may be configured by puncturing an output of a 4-state convolution encoder.

[Block Extension Mode: BEM]

As described above, the blocks existing in the slot are coded differently according to the slot mode or the block extension mode. As described above, if the block extension mode is "00," a portion including blocks B1 to B10 and blocks SB1 to SB5 for the same slot as they are is classified as one slot, and if the block extension mode is "01," blocks B1 and B2 are given to the previous slot and blocks B1 and B2 of the following slot are included in the current slot so that a portion including 15 blocks in total is classified as one slot.

The blocks of the slot may be classified into group regions. For example, four blocks B4 to B7 may be classified into a group region "A," two blocks B3 and B8 may be classified into a group region "B," two blocks B2 and B9 may be classified into a group region "C," and two blocks B1 and B10 may be classified into a group region "D." Also, four blocks SB1 to SB4 generated by interleaving the 38 packets which are the normal data area may be classified into a group region "E."

If the block extension mode of a certain slot is "01," the group regions "A" and "B" including blocks B3 to B8 may be defined as a primary ensemble. Blocks B1 and B2 are given to the previous slot and blocks B9 and B10, blocks SB1 to S4, and blocks B1 and B2 of the following slot are included so that the group regions "C," "D," and "E" are defined as new secondary ensembles. The secondary ensemble can fill a head/tail area with long training data of a length corresponding to one data segment, similar to the primary ensemble, and may improve reception performance of the head/tail area up to a level equal to a level of reception performance of the body area.

If the block extension mode of the certain slot is "00," the primary ensemble is the same as in the case of BEM 01, but the secondary ensemble is different. The secondary ensemble may be defined to include blocks B1 and B2 and blocks B9 and B10 of the current slot and blocks SB1 to SB4. Such a secondary ensemble has a saw-like head/tail area unlike the primary ensemble and thus cannot fill the head/tail area with the long training data. Therefore, reception performance of the head/tail area is interior to that of the body area. When an M/H frame is configured according to a service type, a slot filled with the new mobile data (SFCMM slot) may be arranged adjacent to a slot filled with the existing mobile data (SMM slot) or a slot in which 156 packets are filled with the normal data (full main slot). In the case that the BEM mode of the SFCMM slot is "00," the blocks can be combined smoothly even if the CMM slot or the full main slot is arranged as an adjacent slot. If a BEM 00 slot among 16 slots in an M/H sub-frame is arranged in Slot #0 and a CMM slot is arranged in Slot #1, block coding is performed in combination of blocks B1 to B10 in the Slot #0 and blocks SB1 to SB4. In the case of the Slot #1, the block coding is performed in combination of blocks B1 to B10 in the Slot #1.

If the BEM mode of the SFCMM slot is "01" and the CMM slot or the full main slot is arranged as an adjacent slot, an orphan region should be considered. The orphan region refers to a region that is difficult to use in any slot because a plurality of slots of different types are continuously arranged.

If a BEM 01 slot among the 16 slots in the M/H sub-frame is arranged in Slot #0 and the CMM slot is arranged in Slot #1, blocks B1 and B2 in the Slot #0 are incorporated in a previous slot and blocks B3 to B10 and blocks SB1 to SB4 and blocks B1 and B2 of a following slot are incorporated, and then block coding is performed. In other words, two slots filled with mobile data 1.0 and mobile data 1.1 which are not compatible with each other may be set not to interfere with each other according to a block coding scheme of the BEM 01.

A slot with a BEM 00 and a slot with a BEM 01 may be set not to be combined with each other. On the other hand, in the case of BEM 01, the slot may be used with the CMM mode slot, the BEM 01 mode slot, and the full main mode slot. In this case, an area that is difficult to use due to a mode difference is regarded as an orphan region and used.

[Orphan Region]

A location and size of the orphan region may be different according to which type of slot is adjacent to the slot of BEM 01 and according to an order of adjacent slots.

First, if an (i)th slot is the CMM slot and an (i+1)th slot is the BEM 01 slot, blocks B1 and B2 existing in a head area of the BEM 01 slot are given to a previous slot. However, since the CMM slot is not block-coded using blocks B1 and B2 of the following slot, an area of blocks B1 and B2 of the (i+1)th slot remain without being allocated to any service. This area is defined as an orphan type 1. Likewise, if the (i)th slot is the full main slot and the (i+1)th slot is the BEM 01 slot, an area of blocks B1 and B2 of the (i+1)th slot remains without being allocated to any service and thus the orphan type 1 is generated.

Second, if the (i)th slot is the BEM 01 slot and the (i+1)th slot is the CMM slot, block-coding is performed in the (i)th BEM 01 slot using blocks B1 and B2 of the following slot and thus the following slot cannot use blocks B1 and B2. In other words, since the following slot, that is, the CMM slot, is set to a dual frame mode, a service may be allocated to the primary ensemble only and the secondary ensemble may be empty. Blocks B1 and B2 of the secondary ensemble including blocks B1 and B2 and blocks B9 and B10 are given by the previous slot, that is, the (i)th slot, and used, but an area of the remaining blocks B9 and B10 remains without being allocated to any service. This area is defined as an orphan type 2.

[Utilizing Orphan]

The orphan region may include the new mobile data, the training data, or the dummy byte according to a necessity. If the orphan region is filled with the new mobile data, signaling information used by the receiver to recognize presence/absence of corresponding data and a type of data and decode the data and decode may be added.

If the orphan region is filled with the training data, a trellis encoder is initialized according to a training sequence to be generated and then a known byte is defined so that the receiver can recognize the training sequence.

Table 16 shows locations of the orphan regions and using methods, if BEM=01.

TABLE 16

| Slot(i) | Slot(i + 1) | Loss (bytes) | Orphan Location | Orphan Use |
|---|---|---|---|---|
| CMM | BEM = 01 | 1850 | Slot(i + 1) Head | Training (141/89) |
| BEM = 01 | CMM | 1570 | Slot(i + 1) Tail | Training (195/141) |
| Full Main | BEM = 01 | 1850 | Slot(i + 1) Head | Training (141/89) |
| BEM = 01 | Full Main | 3808 | Slot(i + 1) Part of Region A and B | Dummy |

Also, the orphan region may be configured as in Table 17, if BEM=01.

TABLE 17

| Orphan Type | Slot(i) | Slot(i + 1) | Loss (bytes) | Orphan Region Location | Orphan Use(Known bytes/Initialization bytes) |
|---|---|---|---|---|---|
| type1 | CMM slot | SFCMM Slot with BEM = 01 | 1618 | Slot(i + 1) Head | Training (210/252) |
| type2 | SFCMM Slot with BEM = 01 | CMM slot | 1570 | Slot(i + 1) Tail | Training (195/141) |
| type1 | M/H Slot with only Main packets | SFCMM Slot with BEM = 01 | 1618 | Slot(i + 1) Head | Training (210/252) |
| type3 | SFCMM Slot with BEM = 01 | M/H Slot with only Main packets | 3808 | Slot(i + 1) Part of Regions A and B | Dummy |

As described above, the orphan region may be formed in various locations and with various sizes according to shapes of two consecutive slots. Also, the orphan region may be used for various purposes such as training data and dummy data. Although Tables 16 and 17 do not show mobile data being used in the orphan region, the mobile data may be used in the orphan region.

If the orphan region is used, a method for processing a stream of the digital broadcast transmitter may include a stream configuring operation to configure a stream in which a plurality of slots of different types in which at least one of existing mobile data, normal data, and new mobile data is placed in different formats are consecutively arranged, and a transmitting operation to encode and interleave the stream and output a transport stream. The transmitting operation may be performed by the exciter unit 400 of the above-described digital broadcast transmitter.

In the stream configuring operation, at least one of the new mobile data, the training data, and the dummy data may be placed in the orphan region to which data is not allocated due to a difference in the format between the consecutive slots. Using such an orphan region has been described above.

The orphan region may be of diverse types as described above.

That is, if the CMM slot and the SFCMM slot of BEM 01 are consecutively arranged or if the full main slot including only the normal data and the SFCMM slot of BEM 01 are consecutively arranged, the first type orphan region may appear at a head portion of the SFCMM slot.

If the SFCMM slot of BEM 01 and the CMM slot are consecutively arranged, the second type orphan may appear at a tail portion of the CMM slot.

If the SFCMM slot of BEM 01 and the full main slot including only the normal data are consecutively arranged, the third type orphan region may appear at a body portion of the full main slot.

The CMM slot recited herein is a slot in which the existing mobile data is placed in the first area allocated for the existing mobile data and the normal data is placed in the second area allocated for the normal data, as described above.

The SFCMM slot is a slot in which the new mobile data is placed in at least a part of an entire area including the first area and the second area according to a pre-set mode.

Figure 58:
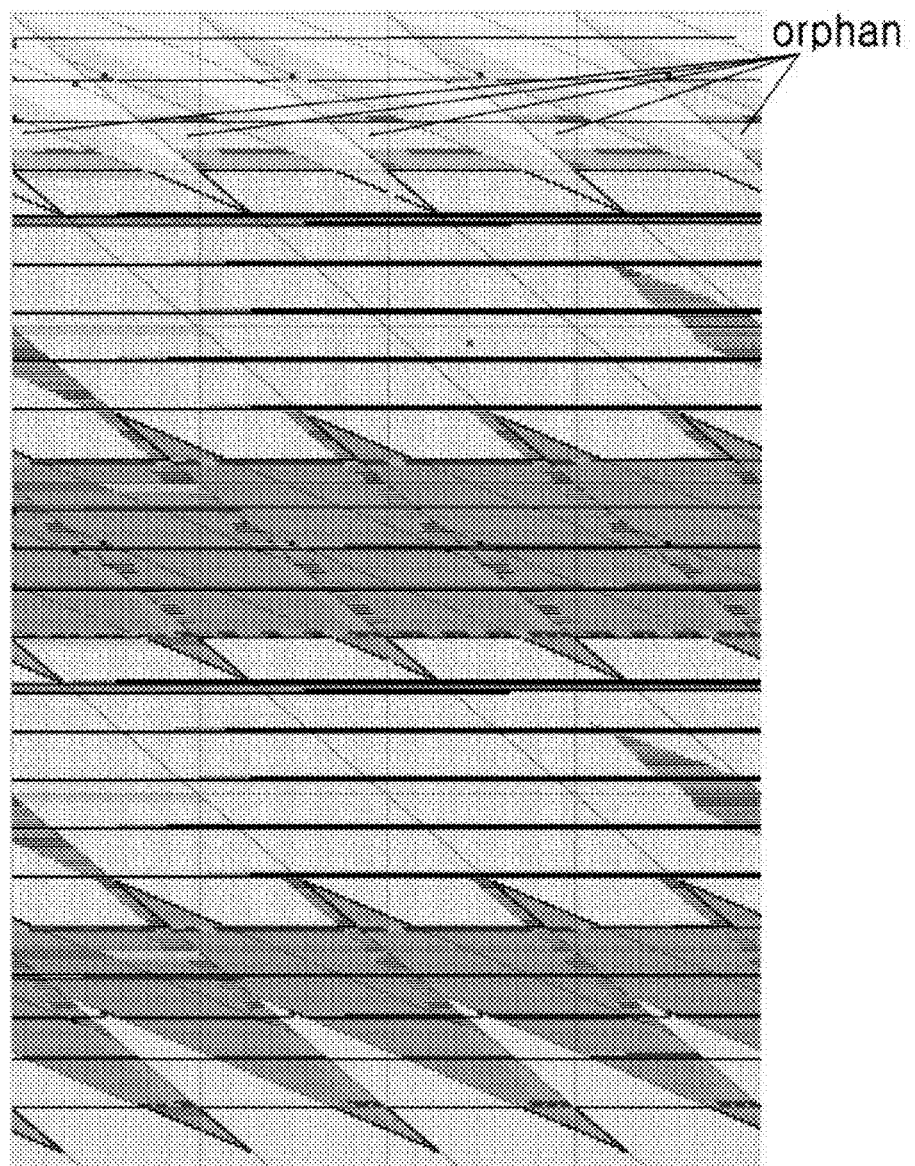
FIG. 58 is a view illustrating a stream configuration showing a first type orphan region after interleaving.
Figure 59:
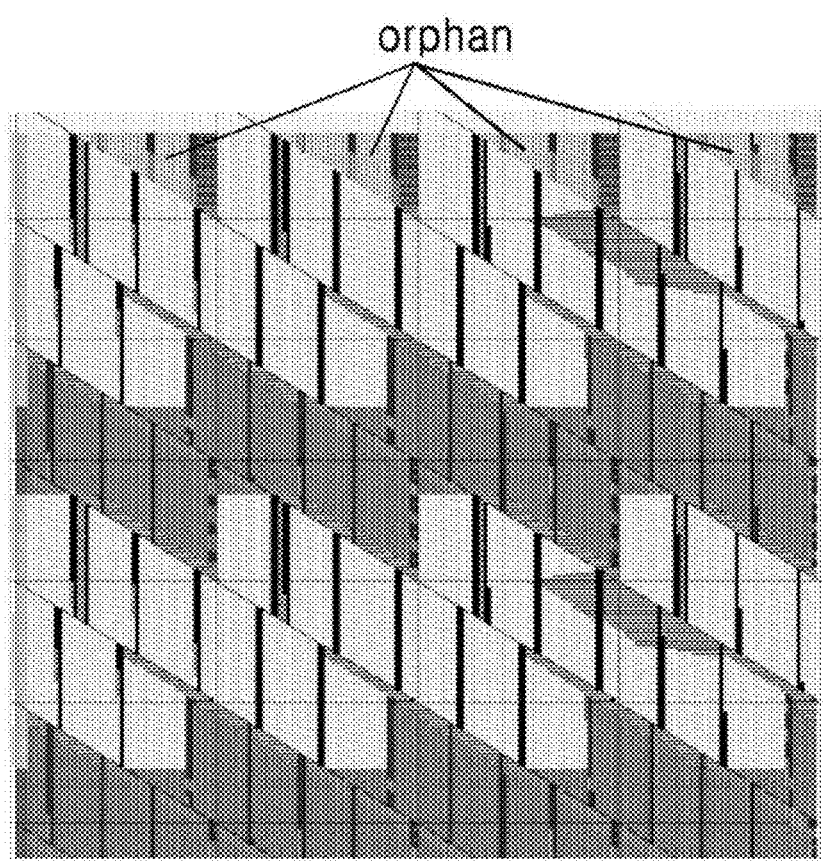
FIG. 59 is a view illustrating a stream configuration showing a first type orphan region before interleaving.

FIG. 58 illustrates a stream configuration showing the first type orphan region after interleaving, and FIG. 59 illustrates a stream configuration showing the first type orphan region before interleaving.

Figure 60:
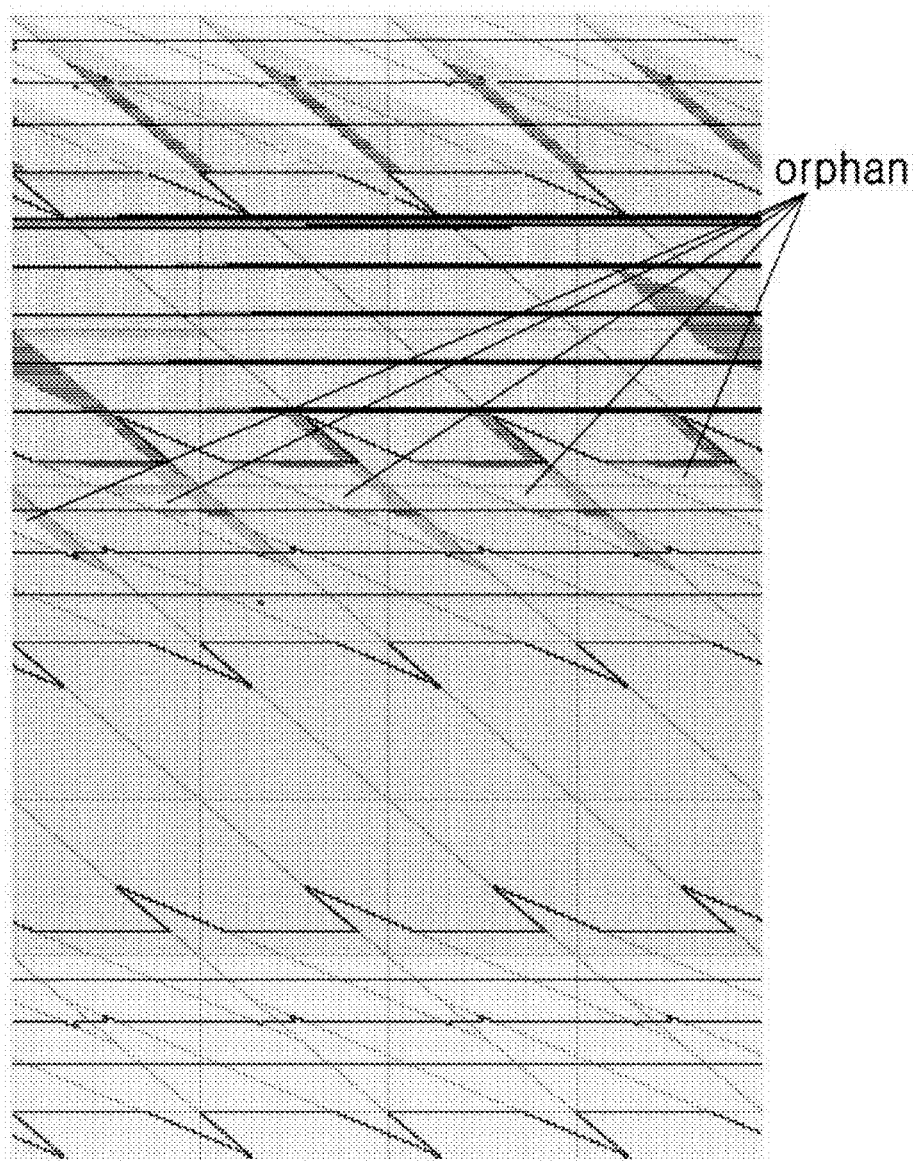
FIG. 60 is a view illustrating a stream configuration showing a second type orphan region after interleaving.
Figure 61:
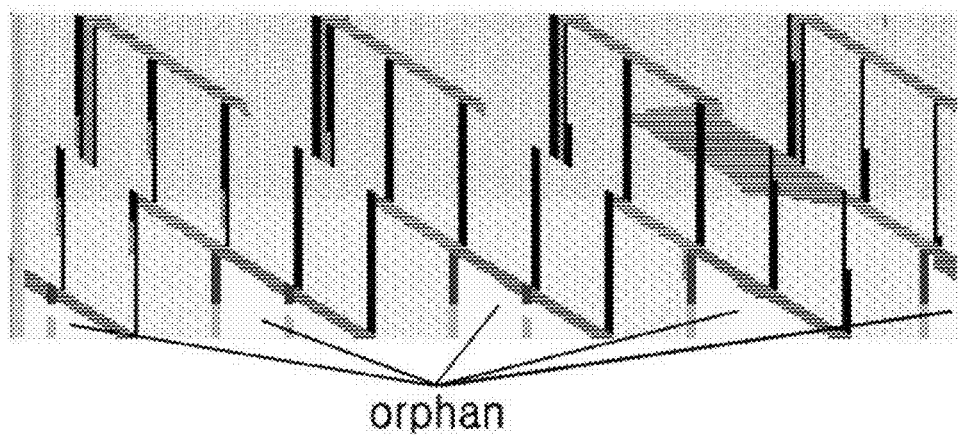
FIG. 61 is a view illustrating a stream configuration showing a second type orphan region before interleaving.

FIG. 60 illustrates a stream configuration showing the second type orphan region after interleaving, and FIG. 61 illustrates a stream configuration showing the second type orphan region before interleaving.

Figure 62:
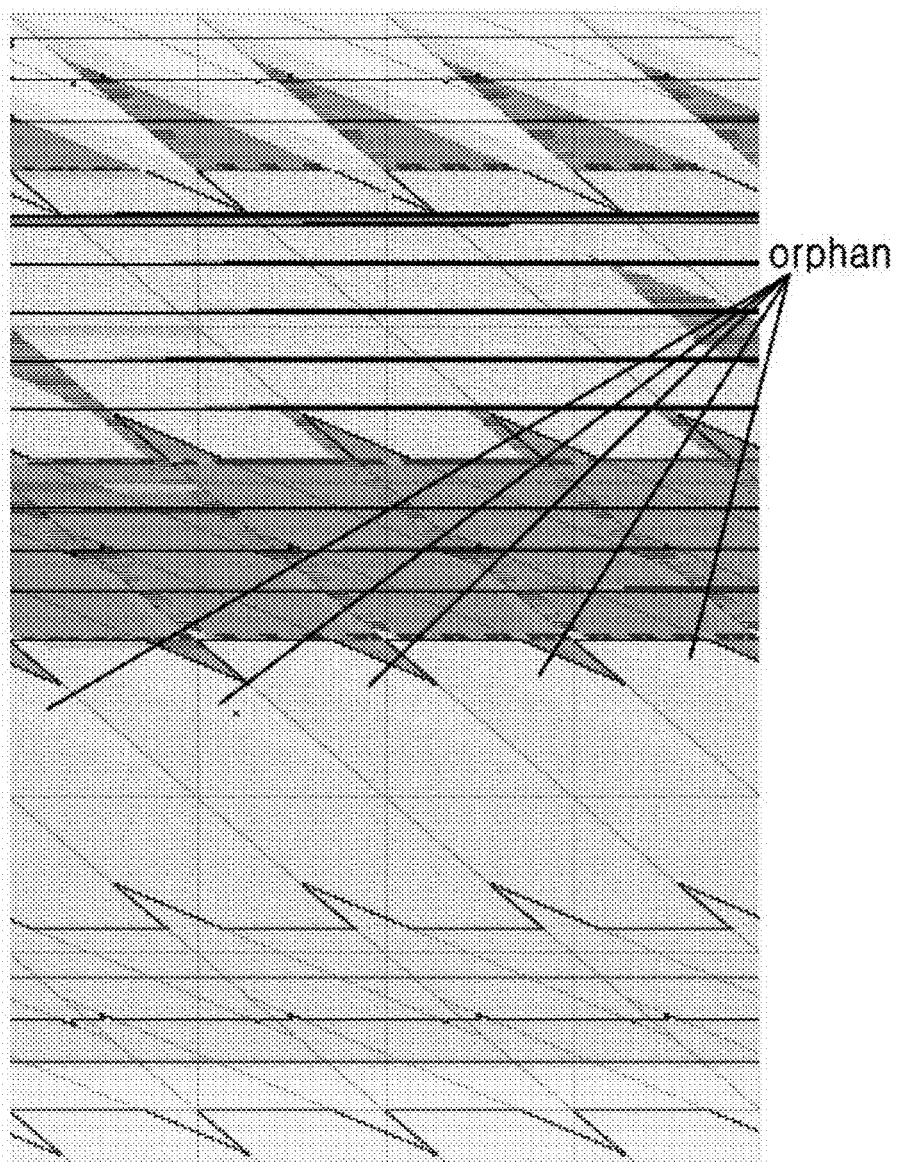
FIG. 62 is a view illustrating a stream configuration showing a third type orphan region after interleaving.
Figure 63:
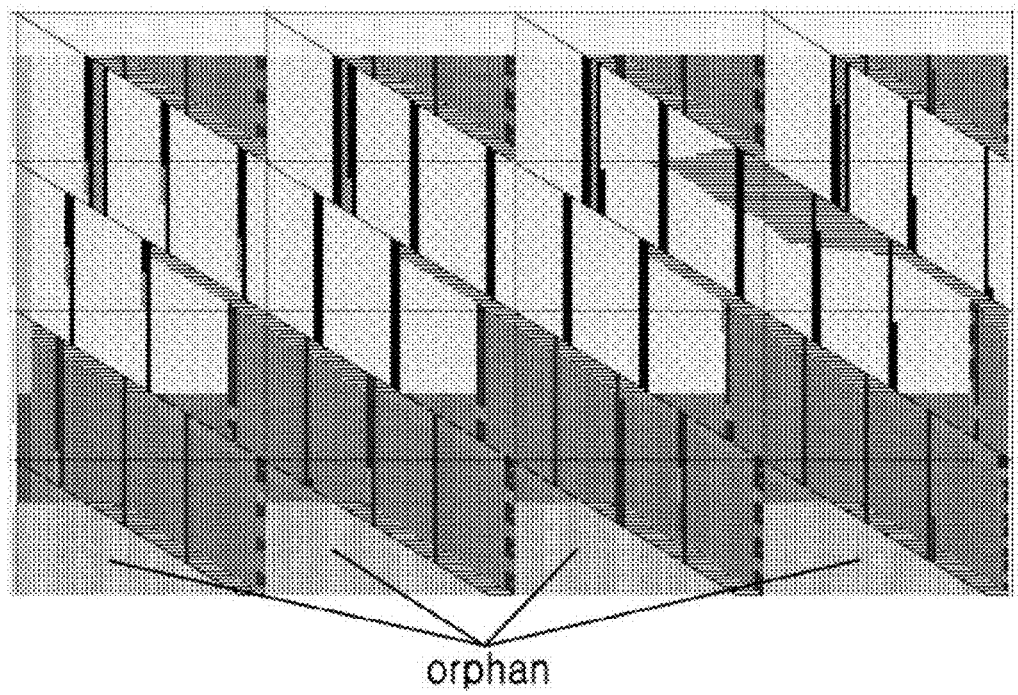
FIG. 63 is a view illustrating a stream configuration showing a third type orphan region before interleaving.

FIG. 62 illustrates a stream configuration showing the third type orphan region after interleaving, and FIG. 63 illustrates a stream configuration showing the third type orphan region before interleaving.

It can be seen from the drawings that the orphan regions are formed in various locations according to arranging patterns of the slots.

The transport stream transmitted from the digital broadcast transmitter may be received and processed by a digital broadcast receiver.

That is, the digital broadcast receiver may include a receiver to receive the transport stream that has been encoded and interleaved in a state in which the plurality of slots of different types in which at least one of the existing mobile data, the normal data, and the new mobile data is placed in different formats are consecutively arranged, a demodulator to demodulate the transport stream, an equalizer to equalize the demodulated transport stream, and a decoder to decode the new mobile data from the equalized stream. The transport stream herein may include an orphan region to which data is not allocated due to a difference in the format between the consecutive slots, and at least one of the new mobile data, the training data, and the dummy data may be placed in the orphan region.

The digital broadcast receiver may detect and process only the data that the digital broadcast receiver can process according to its type, that is, according to whether the digital broadcast receiver is a normal data receiver, a CMM receiver, an SFCMM receiver, or a common receiver.

Signaling information may be used to inform whether data exists in the orphan region or not and the type of data, as described above. That is, the digital broadcast receiver may further include a signaling decoder to decode signaling information and identify whether data exists in the orphan area and a type of the data.

[Signaling Data]

As described above, information such as the number of added existing or new mobile data packets or a code rate may be transmitted to the receiver as signaling information.

For example, such signaling information may be transmitted using a reserved area of the TPC. In this case, some of the sub-frames transmit information on a current frame and the other sub-frames transmit information on a next frame so that "Signaling in Advance" can be achieved. That is, a predetermined TPC parameter and FIC data may be signaled in advance. More specifically, the TPC information may be configured as follows:

TABLE 18

| Syntax | No. of Bits | Format |
|---|---|---|
| TPC_data { | | |
|   sub-frame_number | 3 | uimsbf |
|   slot_number | 4 | uimsbf |
|   parade_id | 7 | uimsbf |
|   if(sub-frame_number ≤ 1){ | | |
|     current_starting_group_number | 4 | uimsbf |
|     current_number_of_groups_minus_1 } | 3 | uimsbf |
|   if(sub-frame_number ≥ 2){ | | |
|     next_starting_group_number | 4 | uimsbf |
|     next_number_of_groups_minus_1 } | 3 | uimsbf |
|   parade_repetition_cycle_minus_1 | 3 | uimsbf |
|   if(sub-frame_number ≤ 1){ | | |
|     current_rs_frame_mode | 2 | bslbf |
|     current_rs_code_mode_primary | 2 | bslbf |
|     current_rs_code_mode_secondary | 2 | bslbf |
|     current_sccc_block_mode | 2 | bslbf |
|     current_sccc_outer_code_mode_a | 2 | bslbf |
|     current_sccc_outer_code_mode_b | 2 | bslbf |
|     current_sccc_outer_code_mode_c | 2 | bslbf |
|     current_sccc_outer_code_mode_d } | 2 | bslbf |
|   if(sub-frame_number ≥ 2){ | | |
|     next_rs_frame_mode | 2 | bslbf |
|     next_rs_code_mode_primary | 2 | bslbf |
|     next_rs_code_mode_secondary | 2 | bslbf |
|     next_sccc_block_mode | 2 | bslbf |
|     next_sccc_outer_code_mode_a | 2 | bslbf |
|     next_sccc_outer_code_mode_b | 2 | bslbf |
|     next_sccc_outer_code_mode_c | 2 | bslbf |
|     next_sccc_outer_code_mode_d } | 2 | bslbf |
|   fic_version | 5 | uimsbf |
|   parade_continuity_counter | 4 | uimsbf |
|   if(sub-frame_number ≤ 1){ | | |
|     current_TNoG | 5 | uimsbf |
|     reserved } | 5 | bslbf |
|   if(sub-frame_number ≥ 2){ | | |
|     next_TNoG | 5 | uimsbf |
|     current_TNoG } | 5 | uimsbf |
|   if(sub-frame_number ≤ 1){ | | |
|     current_sccc_outer_code_mode_e | 2 | bslbf |

TABLE 18-continued

| Syntax | No. of Bits | Format |
| --- | --- | --- |
| current_scalable_mode } | 2 | uimsbf |
| if(sub-frame_number ≥ 2){ | | |
| next_sccc_outer_code_mode_e | 2 | bslbf |
| next_scalable_mode } | 2 | uimsbf |
| slot mode | 2 | uimsbf |
| reserved | 10 | bslbf |
| tpc_protocol_version | 5 | bslbf |
| } | | |

As shown in Table 18, if a sub frame number is less than or equal to 1, that is, if a sub-frame number is #0 or #1, diverse information on a current M/H frame is transmitted, and, if the sub-frame number is greater than or equal to 2, that is, if the sub-frame number is #2, #3, or #4, diverse information on a next M/H frame may be transmitted after considering a parade repetition cycle (PRC). Accordingly, the information on the next frame can be known in advance and thus a processing speed may be improved.

The receiver may be modified according to variations of the above-described embodiments. Specifically, the receiver decodes data which has been combined in various ways according to the block mode and block-coded, and restores the existing mobile data, the normal data, and the new mobile data. Also, the receives identifies signaling information on the next frame in advance so that the receiver prepares a process according to the identified information.

More specifically, in the digital broadcast receiver having the configuration of FIG. 51, the receiving unit 5100 receives the stream that is configured by combining the data placed in the existing mobile data area and the new mobile data placed in the normal data area on a block basis and performing SCCC-coding.

The stream is divided on a frame basis and one frame is divided into a plurality of sub-frames. At least some of the plurality of sub-frames may include the signaling information on the current frame, and the remaining sub-frames may include the signaling information on the next frame considering the PRC. For example, sub-frames #0 and #1 of the five sub-frames in total include signaling information on the current frame, and sub-frames #2, #3, and #4 may include the signaling information on the next frame considering the PRC.

Also, the above-described stream may be a stream that has been SCCC-coded by the digital broadcast transmitter by one of a 1/2 rate, a 1/3 rate, and a 1/4 rate. If the above-described stream is transmitted, the demodulator 5200 demodulates the stream and the equalizer 5300 equalizes the demodulated stream.

The decoder 5400 decodes at least one of the existing mobile data and the new mobile data from the equalized stream. In this case, processing the next frame may be prepared using the frame information included in each frame.

As described above, the digital broadcast receiver may appropriately process the stream transmitted from the digital broadcast transmitter according to various exemplary embodiments. Explanation and illustration of a method for processing the stream of the digital broadcast receiver are omitted.

Since the receiver according to various modified exemplary embodiments is similar to the receiver according to the other exemplary embodiments described above, explanation and illustration of the receiver are omitted.

FIG. 56 is a view illustrating an M/H group format before data interleaving in the above-described compatible mode, that is, in the scalable mode 11a.

Referring to FIG. 56, the M/H group including the mobile data includes 208 data segments. If the M/H group is distributed over 156 packets in the M/H slot configured on a 156-packet basis, the 156 packets are spread over the 208 data segments as a result of interleaving according to an interleaving rule of the interleaver 430.

A mobile data group of the 208 data segments is divided into 15 mobile data blocks. Specifically, the mobile data group includes blocks B1 to B10 and blocks SB1 to SB5. Blocks B1 to B10 may correspond to the mobile data placed in the existing mobile data area as shown in FIG. 8. On the other hand, blocks SB1 to SB5 may correspond to the new mobile data allocated to the existing normal data area. Block SB5 is an area including the MPEG header and the RS parity for the sake of backward compatibility.

Each of blocks B1 to B10 includes 16 segments in the same way as the existing mobile data area, and block SB4 includes 31 segments and each of blocks SB2 and SB3 includes 14 segments. The block SB1 may have a different length of the distributed segment according to the mode. If normal data is not transmitted in all of the frames, that is, if all of the data rates of 19.4 Mbps are filled with mobile data, block SB1 may include 32 segments. If some of the normal data is transmitted, block SB1 may include 31 segments.

Block SB5 is an area in which the MPEG header and the RS parity existing in 51 segments of a body area are distributed, and, if normal data is not transmitted in all of the frames, that is, if all of the data rates of 19.4 Mbps are filled with the mobile data, the block SB5 is defined by filling with the mobile data. This corresponds to the above-described incompatible mode.

As described above, if all of the data is allocated as the mobile data and thus compatibility does not need to be considered, the area in which the MPEG header and the RS parity existing for the sake of compatibility with the receiver to receive the existing normal data are distributed is re-defined as mobile data and used.

In other words, if the SCCC block mode is "00" (separate block mode), the SCCC outer code mode is applied differently according to the group regions (A, B, C, D). However, if the SCCC block mode is "01" (paired block mode), the SCCC outer code mode may be the same for all of the regions. For example, blocks SB1 and SB4, which are newly added mobile data blocks, comply with the SCCC outer code mode set in the group region C, and blocks SB2 and SB3 comply with the SCCC outer code mode set in the group region D. Finally, block SB5 complies with the SCCC outer code mode set in the group region A.

In particular, block SB5 is derived if the service is performed with only the mobile data. In this case, SB5 may be coded differently considering the compatibility between the receiver to receive the existing mobile data and the receiver to additionally receive the new mobile data.

In other words, if a block mode of the slot from which block SB5 is derived is the separate mode, the primary ensemble is filled with 1.0 mobile data and the secondary ensemble is filled with 1.1 mobile data and thus the compatibility with each of the receivers to receive mobile data is to be maintained. Accordingly, block SB5 can be coded independently.

On the other hand, if the block mode of the slot from which block SB5 is derived is the paired mode, block SB5 is filled with only 1.1 mobile data as a single frame and thus compatibility with the existing mobile data receiver does not need to be considered. Accordingly, block SB5 may be absorbed into the existing body area and coded.

More specifically, like in the incompatible mode, that is, the scalable mode 11, if the new mobile data is placed in all of the second areas in one slot, the coding of block SB5 may be differently applied according to the block mode. For example, if the block mode set for a corresponding slot is the separate mode in which the existing mobile data and the new mobile data co-exist, the block including the MPEG header and the RS parity area, that is, block SB5, may be coded independently from the body area in the corresponding slot. On the other hand, if the block mode is the paired mode in which only the new mobile data exists, the block including the MPEG header and the RS parity area, that is, block SB5, may be coded along with the remaining portion of the body area. As described above, the block-coding may be performed in various ways.

Accordingly, the digital broadcast receiver to receive the transport stream checks the mode according to the signaling data and detects and reproduces the new mobile data according to the mode. In other words, if the new mobile data is transmitted according to the paired mode in the above-described incompatible mode (that is, the fifth mode or the scalable mode 11), block SB5 is not separately decoded and is decoded along with the mobile data included in the existing body area.

As described above, if the known data, that is, the training sequence exists, memories of the trellis encoder should be initialized before the training sequence is trellis-encoded. In this case, an area provided for the memory initialization, that is, an initialization byte may be placed before the training sequence.

FIG. 56 illustrates a stream configuration after interleaving. In FIG. 56, a training sequence appears in a body area in the form of a plurality of long training sequences and also appears in a head/tail area in the form of a plurality of long training sequences. More specifically, 5 long training sequences in total appear in the head/tail area. With respect to the second, the third, and the fourth training sequences among the five sequences, the trellis initialization byte does not begin with the first byte of each segment and is set to begin after a predetermined byte, unlike the first and the fifth training sequences.

Such location shift of the trellis initialization byte is not limited to the head/tail area. That is, in some of the plurality of long training sequences included in the body area, the trellis initialization byte may be set to begin after a predetermined byte of each segment.

[Sizes of PL, SOBL, and SIBL According to the Block Mode]

The sizes of the RS frame portion length (PL), the SCCC output block length (SOBL), and the SCCC input block length (SIBL) may be set variously according to the block mode. The following table shows the PL of the primary RS frame, if the RS frame mode is "00" (single frame), the SCCC block mode is "00" (separate block), and the SCCC block extension mode is "01."

TABLE 19

| SCCC Outer Code Mode Combinations | | | | PL | | | | |
|---|---|---|---|---|---|---|---|---|
| For Region A and M/H Block SB5 | For Region B | For Region C, M/H Blocks SB1 and SB4 | For Region D, M/H Blocks SB2 and SB3 | Scalable Mode 00 | Scalable Mode 01 | Scalable Mode 10 | Scalable Mode 11 | Scalable Mode 11a |
| 00 | 00 | 00 | 00 | 10440 | 11094 | 11748 | 13884 | 12444 |
| 00 | 00 | 00 | 10 | 10138 | 10678 | 11216 | 13126 | 11766 |
| 00 | 00 | 00 | 01 | 9987 | 10470 | 10950 | 12747 | 11427 |
| 00 | 00 | 10 | 00 | 9810 | 10360 | 10912 | 12698 | 11522 |
| 00 | 00 | 10 | 10 | 9508 | 9944 | 10380 | 11940 | 10844 |
| 00 | 00 | 10 | 01 | 9357 | 9736 | 10114 | 11561 | 10505 |
| 00 | 00 | 01 | 00 | 9495 | 9993 | 10494 | 12105 | 11061 |
| 00 | 00 | 01 | 10 | 9193 | 9577 | 9962 | 11347 | 10383 |
| 00 | 00 | 01 | 01 | 9042 | 9369 | 9696 | 10968 | 10044 |
| 00 | 10 | 00 | 00 | 9626 | 10280 | 10934 | 13070 | 11630 |
| 00 | 10 | 00 | 10 | 9324 | 9864 | 10402 | 12312 | 10952 |
| 00 | 10 | 00 | 01 | 9173 | 9656 | 10136 | 11933 | 10613 |
| 00 | 10 | 10 | 00 | 8996 | 9546 | 10098 | 11884 | 10708 |
| 00 | 10 | 10 | 10 | 8694 | 9130 | 9566 | 11126 | 10030 |
| 00 | 10 | 10 | 01 | 8543 | 8922 | 9300 | 10747 | 9691 |
| 00 | 10 | 01 | 00 | 8681 | 9179 | 9680 | 11291 | 10247 |
| 00 | 10 | 01 | 10 | 8379 | 8763 | 9148 | 10533 | 9569 |
| 00 | 10 | 01 | 01 | 8228 | 8555 | 8882 | 10154 | 9230 |
| 00 | 01 | 00 | 00 | 9219 | 9873 | 10527 | 12663 | 11223 |
| 00 | 01 | 00 | 10 | 8917 | 9457 | 9995 | 11905 | 10545 |
| 00 | 01 | 00 | 01 | 8766 | 9249 | 9729 | 11526 | 10206 |
| 00 | 01 | 10 | 00 | 8589 | 9139 | 9691 | 11477 | 10301 |
| 00 | 01 | 10 | 10 | 8287 | 8723 | 9159 | 10719 | 9623 |
| 00 | 01 | 10 | 01 | 8136 | 8515 | 8893 | 10340 | 9284 |
| 00 | 01 | 01 | 00 | 8274 | 8772 | 9273 | 10884 | 9840 |
| 00 | 01 | 01 | 10 | 7972 | 8356 | 8741 | 10126 | 9162 |
| 00 | 01 | 01 | 01 | 7821 | 8148 | 8475 | 9747 | 8823 |
| 10 | 00 | 00 | 00 | 8706 | 9360 | 10014 | 12422 | 10710 |
| 10 | 00 | 00 | 10 | 8404 | 8944 | 9482 | 11256 | 10032 |
| 10 | 00 | 00 | 01 | 8253 | 8736 | 9216 | 10877 | 9693 |
| 10 | 00 | 10 | 00 | 8076 | 8626 | 9178 | 10828 | 9788 |
| 10 | 00 | 10 | 10 | 7774 | 8210 | 8646 | 10070 | 9110 |
| 10 | 00 | 10 | 01 | 7623 | 8002 | 8380 | 9691 | 8771 |
| 10 | 00 | 01 | 00 | 7761 | 8259 | 8760 | 10235 | 9327 |
| 10 | 00 | 01 | 10 | 7459 | 7843 | 8228 | 9477 | 8649 |
| 10 | 00 | 01 | 01 | 7308 | 7635 | 7962 | 9098 | 8310 |
| 10 | 10 | 00 | 00 | 7892 | 8546 | 9200 | 11200 | 9896 |
| 10 | 10 | 00 | 10 | 7590 | 8130 | 8668 | 10442 | 9218 |

TABLE 19-continued

| SCCC Outer Code Mode Combinations | | | | PL | | | | |
|---|---|---|---|---|---|---|---|---|
| For Region A and M/H Block SB5 | For Region B | For Region C, M/H Blocks SB1 and SB4 | For Region D, M/H Blocks SB2 and SB3 | Scalable Mode 00 | Scalable Mode 01 | Scalable Mode 10 | Scalable Mode 11 | Scalable Mode 11a |
| 10 | 10 | 00 | 01 | 7439 | 7922 | 8402 | 10063 | 8879 |
| 10 | 10 | 10 | 00 | 7262 | 7812 | 8364 | 10014 | 8974 |
| 10 | 10 | 10 | 10 | 6960 | 7396 | 7832 | 9256 | 8296 |
| 10 | 10 | 10 | 01 | 6809 | 7188 | 7566 | 8877 | 7957 |
| 10 | 10 | 01 | 00 | 6947 | 7445 | 7946 | 9421 | 8513 |
| 10 | 10 | 01 | 10 | 6645 | 7029 | 7414 | 8663 | 7835 |
| 10 | 10 | 01 | 01 | 6494 | 6821 | 7148 | 8284 | 7496 |
| 10 | 01 | 00 | 00 | 7485 | 8139 | 8793 | 10793 | 9489 |
| 10 | 01 | 00 | 10 | 7183 | 7723 | 8261 | 10035 | 8811 |
| 10 | 01 | 00 | 01 | 7032 | 7515 | 7995 | 9656 | 8472 |
| 10 | 01 | 10 | 00 | 6855 | 7405 | 7957 | 9607 | 8567 |
| 10 | 01 | 10 | 10 | 6553 | 6989 | 7425 | 8849 | 7889 |
| 10 | 01 | 10 | 01 | 6402 | 6781 | 7159 | 8470 | 7550 |
| 10 | 01 | 01 | 00 | 6540 | 7038 | 7539 | 9014 | 8106 |
| 10 | 01 | 01 | 10 | 6238 | 6622 | 7007 | 8256 | 7428 |
| 10 | 01 | 01 | 01 | 6087 | 6414 | 6741 | 7877 | 7089 |
| 01 | 00 | 00 | 00 | 7839 | 8493 | 9147 | 11079 | 9843 |
| 01 | 00 | 00 | 10 | 7537 | 8077 | 8615 | 10321 | 9165 |
| 01 | 00 | 00 | 01 | 7386 | 7869 | 8349 | 9942 | 8826 |
| 01 | 00 | 10 | 00 | 7209 | 7759 | 8311 | 9893 | 8921 |
| 01 | 00 | 10 | 10 | 6907 | 7343 | 7779 | 9135 | 8243 |
| 01 | 00 | 10 | 01 | 6756 | 7135 | 7513 | 8756 | 7904 |
| 01 | 00 | 01 | 00 | 6894 | 7392 | 7893 | 9300 | 8460 |
| 01 | 00 | 01 | 10 | 6592 | 6976 | 7361 | 8542 | 7782 |
| 01 | 00 | 01 | 01 | 6441 | 6768 | 7095 | 8163 | 7443 |
| 01 | 10 | 00 | 00 | 7025 | 7679 | 8333 | 10265 | 9029 |
| 01 | 10 | 00 | 10 | 6723 | 7263 | 7801 | 9507 | 8351 |
| 01 | 10 | 00 | 01 | 6572 | 7055 | 7535 | 9128 | 8012 |
| 01 | 10 | 10 | 00 | 6395 | 6945 | 7497 | 9079 | 8107 |
| 01 | 10 | 10 | 10 | 6093 | 6529 | 6965 | 8321 | 7429 |
| 01 | 10 | 10 | 01 | 5942 | 6321 | 6699 | 7942 | 7090 |
| 01 | 10 | 01 | 00 | 6080 | 6578 | 7079 | 8486 | 7646 |
| 01 | 10 | 01 | 10 | 5778 | 6162 | 6547 | 7728 | 6968 |
| 01 | 10 | 01 | 01 | 5627 | 5954 | 6281 | 7349 | 6629 |
| 01 | 01 | 00 | 00 | 6618 | 7272 | 7926 | 9858 | 8622 |
| 01 | 01 | 00 | 10 | 6316 | 6856 | 7394 | 9100 | 7944 |
| 01 | 01 | 00 | 01 | 6165 | 6648 | 7128 | 8721 | 7605 |
| 01 | 01 | 10 | 00 | 5988 | 6538 | 7090 | 8672 | 7700 |
| 01 | 01 | 10 | 10 | 5686 | 6122 | 6558 | 7914 | 7022 |
| 01 | 01 | 10 | 01 | 5535 | 5914 | 6292 | 7535 | 6683 |
| 01 | 01 | 01 | 00 | 5673 | 6171 | 6672 | 8079 | 7239 |
| 01 | 01 | 01 | 10 | 5371 | 5755 | 6140 | 7321 | 6561 |
| 01 | 01 | 01 | 01 | 5220 | 5547 | 5874 | 6942 | 6222 |
| Others | | | | Undefined | Undefined | Undefined | Undefined | Undefined |

Also, following Table 20 shows the PL of the primary RS frame, if the RS frame mode is "00" (single frame), the SCCC block mode is "01" (paired block), and the SCCC block extension mode is "01."

TABLE 20

| SCCC Outer Code Mode | PL | | | | |
|---|---|---|---|---|---|
| | Scalable Mode 00 | Scalable Mode 01 | Scalable Mode 10 | Scalable Mode 11 | Scalable Mode 11a |
| 00 | 10440 | 11094 | 11748 | 13884 | 12444 |
| 10 | 6960 | 7396 | 7832 | 9256 | 8296 |
| 01 | 5220 | 5547 | 5874 | 6942 | 6222 |
| Others | | | Undefined | | |

Also, the following table shows the PL of the secondary RS frame, if the RS frame mode is "01" (dual frame), the SCCC block mode is "00" (separate block), and the SCCC block extension mode is "01."

TABLE 21

SCCC Outer Code Mode Combinations

| For Region C, M/H Blocks SB1 and SB4 | For Region D, M/H Blocks SB2 and SB3 | For M/H Block SB5 | PL Scalable Mode 00 | Scalable Mode 01 | Scalable Mode 10 | Scalable Mode 11 | Scalable Mode 11a |
|---|---|---|---|---|---|---|---|
| 00 | 00 | 00 | 2796 | 3450 | 4104 | 6240 | 4800 |
| 00 | 10 | 00 | 2494 | 3034 | 3572 | 5482 | 4122 |
| 00 | 01 | 00 | 2343 | 2826 | 3306 | 5103 | 3783 |
| 10 | 00 | 00 | 2166 | 2716 | 3268 | 5054 | 3878 |
| 10 | 10 | 00 | 1864 | 2300 | 2736 | 4296 | 3200 |
| 10 | 01 | 00 | 1713 | 2092 | 2470 | 3917 | 2861 |
| 01 | 00 | 00 | 1851 | 2349 | 2850 | 4461 | 3417 |
| 01 | 10 | 00 | 1549 | 1933 | 2318 | 3703 | 2739 |
| 01 | 01 | 00 | 1398 | 1725 | 2052 | 3324 | 2400 |
| 00 | 00 | 01 | 2796 | 3450 | 4104 | 6036 | 4800 |
| 00 | 10 | 01 | 2494 | 3034 | 3572 | 5278 | 4122 |
| 00 | 01 | 01 | 2343 | 2826 | 3306 | 4899 | 3783 |
| 10 | 00 | 01 | 2166 | 2716 | 3268 | 4850 | 3878 |
| 10 | 10 | 01 | 1864 | 2300 | 2736 | 4092 | 3200 |
| 10 | 01 | 01 | 1713 | 2092 | 2470 | 3713 | 2861 |
| 01 | 00 | 01 | 1851 | 2349 | 2850 | 4257 | 3417 |
| 01 | 10 | 01 | 1549 | 1933 | 2318 | 3499 | 2739 |
| 01 | 01 | 01 | 1398 | 1725 | 2052 | 3120 | 2400 |
| Others | | | Undefined | Undefined | Undefined | Undefined | Undefined |

Also, the following table shows the SOBL and the SIBL, if the SCCC block mode is "00" (separate block), the RS frame mode is "00" (single frame), and if the SCCC block extension mode is "01."

TABLE 22

| SCCC Block | SOBL | | | | | SIBL ½ rate | | | | |
|---|---|---|---|---|---|---|---|---|---|---|
| | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB1 (B1+ SB3) | 888 | 1212 | 1536 | 2280 | 1932 | 444 | 606 | 768 | 1140 | 966 |
| SCB2 (B2 + SB4) | 1872 | 2160 | 2412 | 3432 | 2568 | 936 | 1080 | 1206 | 1716 | 1284 |
| SCB3 (B3) | 2376 | 2376 | 2376 | 2376 | 2376 | 1188 | 1188 | 1188 | 1188 | 1188 |
| SCB4 (B4) | 2388 | 2388 | 2388 | 2388 | 2388 | 1194 | 1194 | 1194 | 1194 | 1194 |
| SCB5 (B5) | 2772 | 2772 | 2772 | 2772 | 2772 | 1386 | 1386 | 1386 | 1386 | 1386 |
| SCB6 (B6) | 2472 | 2472 | 2472 | 2472 | 2472 | 1236 | 1236 | 1236 | 1236 | 1236 |
| SCB7 (B7) | 2772 | 2772 | 2772 | 2772 | 2112 | 1386 | 1386 | 1386 | 1386 | 1386 |
| SCB8 (B8) | 2508 | 2508 | 2508 | 2508 | 2508 | 1254 | 1254 | 1254 | 1254 | 1254 |
| SCB9 (B9 + SB1) | 1908 | 2244 | 2604 | 3684 | 2964 | 954 | 1122 | 1302 | 1842 | 1482 |
| SCB10 (B10 + SB2) | 924 | 1284 | 1656 | 2268 | 2136 | 462 | 642 | 828 | 1134 | 1068 |
| SCB11 (SB5) | 0 | 0 | 0 | 816 | 0 | 0 | 0 | 0 | 408 | 0 |

| SCCC Block | SORL | | | | | SIBL ⅓ rate | | | | |
|---|---|---|---|---|---|---|---|---|---|---|
| | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB1 (B1 + SB3) | 888 | 1212 | 1536 | 2280 | 1932 | 296 | 404 | 512 | 760 | 644 |
| SCB2 (B2 + SB4) | 1872 | 2160 | 2412 | 3432 | 2568 | 624 | 720 | 804 | 1144 | 856 |
| SCB3 (B3) | 2376 | 2376 | 2376 | 2376 | 2376 | 792 | 792 | 792 | 792 | 792 |
| SCB4 (B4) | 2388 | 2388 | 2388 | 2388 | 2388 | 796 | 796 | 796 | 796 | 796 |
| SCB5 (B5) | 2772 | 2772 | 2772 | 2772 | 2772 | 924 | 924 | 924 | 924 | 924 |
| SCB6 (B6) | 2472 | 2472 | 2472 | 2472 | 2472 | 824 | 824 | 824 | 824 | 824 |
| SCB7 (B7) | 2772 | 2772 | 2772 | 2772 | 2772 | 924 | 924 | 924 | 924 | 924 |

TABLE 22-continued

| SCCC Block | | | | | | | | | | |
|---|---|---|---|---|---|---|---|---|---|---|
| SCB8 (B8) | 2508 | 2508 | 2508 | 2508 | 2508 | 836 | 836 | 836 | 836 | 836 |
| SCB9 (B9 + SB1) | 1908 | 2244 | 2604 | 3684 | 2964 | 636 | 748 | 868 | 1228 | 988 |
| SCB10 (B10 + SB2) | 924 | 1284 | 1656 | 2268 | 2136 | 308 | 428 | 552 | 756 | 712 |
| SCB11 (SB5) | 0 | 0 | 0 | 816 | 0 | 0 | 0 | 0 | 272 | 0 |

| | SOBL | | | | | SIBL ¼ rate | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB1 (B1 + SB3) | 888 | 1212 | 1536 | 2280 | 1932 | 222 | 303 | 384 | 570 | 483 |
| SCB2 (B2 + SB4) | 1872 | 2160 | 2412 | 3432 | 2568 | 468 | 540 | 603 | 858 | 642 |
| SCB3 (B3) | 2376 | 2376 | 2376 | 2376 | 2376 | 594 | 594 | 594 | 594 | 594 |
| SCB4 (B4) | 2388 | 2388 | 2388 | 2388 | 2388 | 597 | 597 | 597 | 597 | 597 |
| SCB5 (B5) | 2772 | 2772 | 2772 | 2772 | 2772 | 693 | 693 | 693 | 693 | 693 |
| SCB6 (B6) | 2472 | 2472 | 2472 | 2472 | 2472 | 618 | 618 | 618 | 618 | 618 |
| SCB7 (B7) | 2772 | 2772 | 2772 | 2772 | 2772 | 693 | 693 | 693 | 693 | 693 |
| SCB8 (B8) | 2508 | 2508 | 2508 | 2508 | 2508 | 627 | 627 | 627 | 627 | 627 |
| SCB9 (B9 + SB1) | 1908 | 2244 | 2604 | 3684 | 2964 | 477 | 561 | 651 | 921 | 741 |
| SCB10 (B10 + SB2) | 924 | 1284 | 1656 | 2268 | 2136 | 231 | 321 | 414 | 567 | 534 |
| SCB11 (SB5) | 0 | 0 | 0 | 816 | 0 | 0 | 0 | 0 | 204 | 0 |

The following table shows the SOBL and the SIBL, if the SCCC block mode is "01" (paired block), the RS frame mode is "01" (dual frame), and the SCCC block extension mode is "01."

TABLE 23

| | SOBL | | | | | SIBL ½ rate | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB1 (B1 + B6 + SB3) | 3360 | 3684 | 4008 | 4752 | 4404 | 1680 | 1842 | 2004 | 2376 | 2202 |
| SCB2 (B2 + B7 + SB4) | 4644 | 4932 | 5184 | 6204 | 5340 | 2322 | 2466 | 2592 | 3102 | 2670 |
| SCB3 (B3 + B8) | 4884 | 4884 | 4884 | 4884 | 4884 | 2442 | 2442 | 2442 | 2442 | 2442 |
| SCB4 (B4 + B9 + SB1) | 4296 | 4632 | 4992 | 6072 | 5352 | 2148 | 2316 | 2496 | 3036 | 2676 |
| SCB5 (B5 + B10 + SB2) | 3696 | 4056 | 4428 | 5040 | 4908 | 1848 | 2028 | 2214 | 2520 | 2454 |
| SCB6 (SB5) | 0 | 0 | 0 | 816 | 0 | 0 | 0 | 0 | 408 | 0 |

| | SOBL | | | | | SIBL ⅓ rate | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB1 (B1 + B6 + SB3) | 3360 | 3684 | 4008 | 4752 | 4404 | 1120 | 1228 | 1336 | 1584 | 1468 |
| SCB2 (B2 + B7 + SB4) | 4644 | 4932 | 5184 | 6204 | 5340 | 1548 | 1644 | 1728 | 2068 | 1780 |
| SCB3 (B3 + B8) | 4884 | 4884 | 4884 | 4884 | 4884 | 1628 | 1628 | 1628 | 1628 | 1628 |
| SCB4 (B4 + B9 + SB1) | 4296 | 4632 | 4992 | 6072 | 5352 | 1432 | 1544 | 1664 | 2024 | 1784 |
| SCB5 (B5 + B10 + SB2) | 3696 | 4056 | 4428 | 5040 | 4908 | 1232 | 1352 | 1476 | 1680 | 1636 |
| SCB6 (SB5) | 0 | 0 | 0 | 816 | 0 | 0 | 0 | 0 | 272 | 0 |

TABLE 23-continued

| | SOBL | | | | | SIBL ¼ rate | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB1 (B1 + B6 + SB3) | 3360 | 3684 | 4008 | 4752 | 4404 | 840 | 921 | 1002 | 1188 | 1101 |
| SCB2 (B2 + B7 + SB4) | 4644 | 4932 | 5184 | 6204 | 5340 | 1161 | 1233 | 1296 | 1551 | 1335 |
| SCB3 (B3 + B8) | 4884 | 4884 | 4884 | 4884 | 4884 | 1221 | 1221 | 1221 | 1221 | 1221 |
| SCB4 (B4 + B9 + SB1) | 4296 | 4632 | 4992 | 6072 | 5352 | 1074 | 1158 | 1248 | 1518 | 1338 |
| SCB5 (B5 + B10 + SB2) | 3696 | 4056 | 4428 | 5040 | 4908 | 924 | 1014 | 1107 | 1260 | 1227 |
| SCB6 (SB5) | 0 | 0 | 0 | 816 | 0 | 0 | 0 | 0 | 204 | 0 |

As described above, the PL, the SOBL, and the SIBL of various sizes may be realized according to the block mode. The data written in the tables above is merely an example and it is understood that the data is not limited to that of the table above.

[Initialization]

If the known data, that is, the training data is included in the stream as described above, initialization may be performed. That is, an ATSC-M/H transmission system initializes a trellis encoder according to a training sequence and defines a known byte so that a receiver can recognize the training sequence.

In a group format of the BEM 00 mode, the trellis initialization byte is located on a boundary surface between sawteeths and the known byte is distributed after the trellis initialization byte. Specifically, if the trellis encoding is performed from the top segment to the bottom segment and from the left byte to the right byte, the trellis encoding is performed on a boundary surface between the sawteeths filled with data of a different slot and thus a trellis encoder memory value cannot be predicted on a boundary surface between the sawteeths filled with data of a next current slot. Therefore, the trellis encoder may be initialized every boundary surface of the sawteeth. As shown in FIGS. 56 and 57, the initialization byte is distributed over each sawteeth boundary of a head area including blocks B1 and B2, and is also distributed over each sawteeth boundary of a tail area including blocks SB1 to SB4.

If certain two slots are adjacent to each other as the BEM 00, short training data of each head/tail area are located on the same segment and are continuously connected, thereby serving as one long training data. If the two BEM 00 slots are adjacent to each other and thus the training data is a concatenation, only the first 12 initialization bytes of the segment in which the training data exists are used as an initialization mode and the initialization byte existing in a portion in which sawteeth are engaged with each other is input and trellis-encoded like the known byte.

An intermediate initialization byte which exists in a sawteeth-engaged portion, except for the first maximum 12 initialization bytes of the segment, may be input as a known byte or an initialization byte, according to whether the BEM 00 slot is adjacent to the same slot or the BEM 00 slot is adjacent to a different slot. That is, the operation of the trellis encoder may be multiplexing in a normal mode or multiplexing in an initialization mode during an intermediate initialization byte period. Since a symbol is generated differently according to a mode in which the trellis encoder multiplexes an input, a symbol value to be used by the receiver as training may be different. Accordingly, in order to minimize a confusion of the receiver, with reference to a symbol generated by multiplexing all of the intermediate initialization bytes to the known byte when two BEM 00 slots are disposed adjacently to configure a long training, an intermediate initialization byte value may be determined by a value used in the initialization mode when the BEM 00 slot is not adjacent to the same slot. That is, the intermediate initialization byte value may be determined so that a same value as the long training symbol value generated in the case of the concatenation is created. At this time, the value may be different from the symbol value generated in the case of the concatenation during the first two symbols of the intermediate initialization byte.

As described above, the digital broadcast transmitter processes the stream so that the long training sequence is formed on the boundary of the consecutive slots.

A method of processing a stream of the transmitter may include a stream configuring operation to configure a stream in which slots including a plurality of blocks are consecutively arranged and a transmitting operation to encode and interleave the stream and output a transport stream.

If slots set to the block extension mode 00 in which all of the blocks in a corresponding slot are used are consecutively arranged, the stream configuring operation places the known data in a pre-set segment of each of adjacent slots so that the long training sequence is formed on the boundary between the adjacent slots engaged with each other in the form of sawteeth. The block extension mode 00 is a mode in which the above-described blocks B1 and B2 are also used in the slot. Accordingly, on the boundary of a next slot, a sawteeth portion of a preceding slot and a sawteeth portion of a following slot are engaged with each other. In this case, the known data is placed in an appropriate segment position of the preceding slot and in an appropriate segment position of the following slot so that the known data is connected on the sawteeth portions of the two slots. More specifically, if the known data is placed in the $130^{th}$ segment of the preceding slot and the $15^{th}$ segment of the following slot, the known data is connected on the boundary and thus forms one long training sequence.

If first known data placed in the sawteeth portion of the preceding slot of the adjacent slots and second known data placed in the sawteeth portion of the following slot of the adjacent slots are connected to each other alternately on the boundary, values of the first known data and the second known data may be pre-set values for forming the long training sequence known to the digital broadcast receiver.

Also, the known data may be inserted so as to have the same sequence as the long training sequence used in the slot of the block extension mode 01 in which some block of the corresponding slot is provided to other slots, with reference to the long training sequence.

Figure 64:
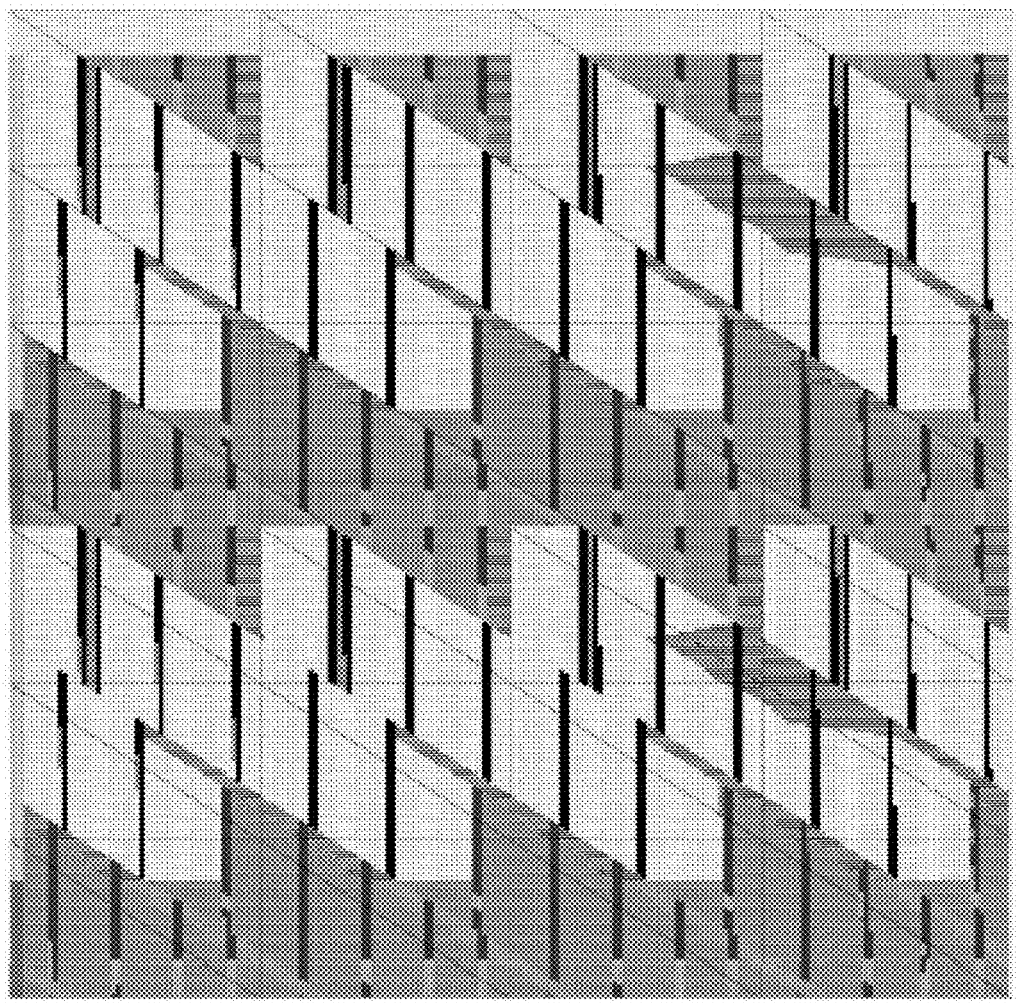
FIG. 64 is a view illustrating a stream configuration before interleaving in a block extension mode 00.
Figure 65:
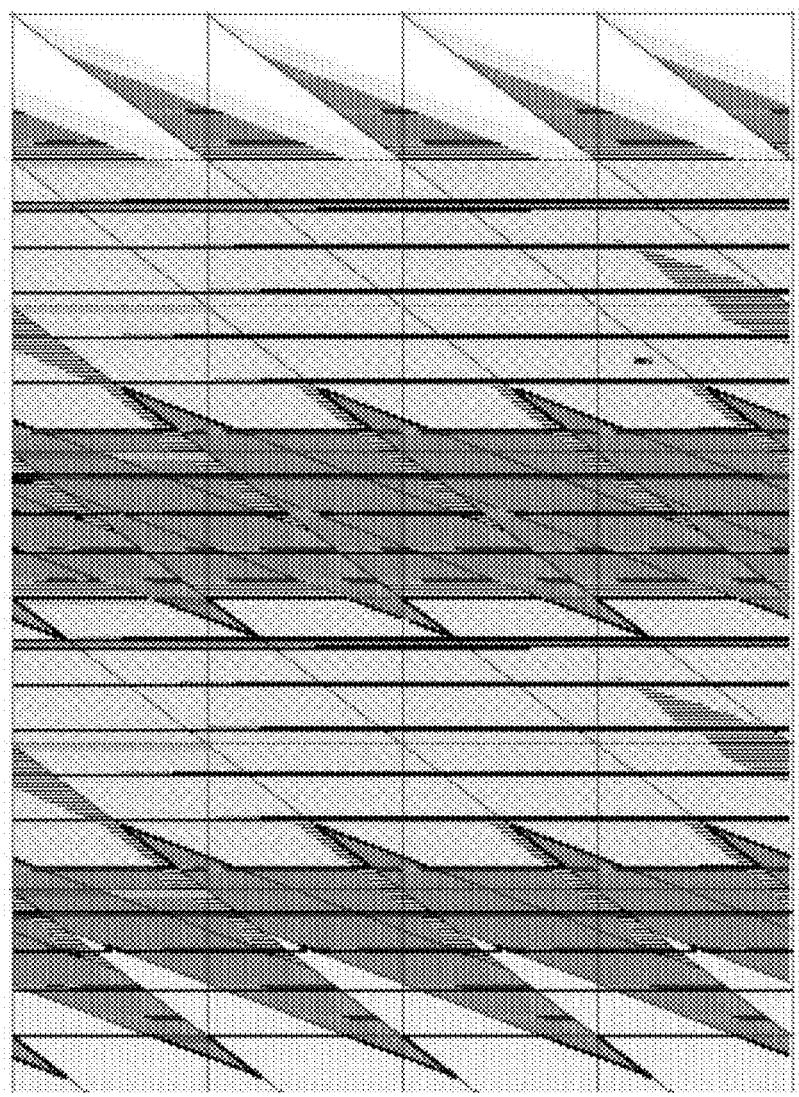
FIG. 65 is a view illustrating a stream configuration after interleaving in a block extension mode 00.

FIG. 64 illustrates a stream configuration before interleaving, if the block extension mode is "00," and FIG. 65 illustrates a stream configuration after interleaving, if the block extension mode is "00."

If the known data is placed in the form of a long training sequence as described above, it is not necessary to perform initialization for every known data. Accordingly, in this case, the method may further include initializing the trellis encoder before trellis-encoding the known data corresponding to the first portion of the long training sequence.

On the other hand, if slots set to different block extension modes are consecutively arranged, the known data cannot continue on the boundary. Accordingly, in this case, the transmitting operation initializes the trellis encoder before the known data placed in the sawteeth portion on the boundary between the consecutive slots is trellis-encoded.

If the known data is placed on the boundary in the form of a long training sequence and then is transmitted, the digital broadcast receiver may process the stream correspondingly.

That is, a method of processing a stream of the digital broadcast receiver includes a receiving operation to receive a transport stream which has been encoded and interleaved with slots including a plurality of blocks being consecutively arranged, a demodulating operation to demodulate the transport stream, an equalizing operation to equalize the transport stream, and a decoding operation to decode new mobile data from the equalized stream.

Each slot of the transport stream may include at least one of normal data, existing mobile data, and new mobile data.

If slots set to the block extension mode 00 in which all of the blocks in a corresponding slot are used are consecutively arranged, the transport stream may be a stream in which known data is placed in a pre-set segment of each of the adjacent slots so that a long training sequence is formed on the boundary of the adjacent slots engaged with each other in the form of sawteeth.

As described above, each known data on the boundary between consecutive preceding and following slots may be connected so that the long training sequence known to the digital broadcast transmitter is formed.

The long training sequence may have the same sequence as the long training sequence used in the slot of the block extension mode 01 in which some of the blocks in a corresponding slot is provided to other slots, with reference to the long training sequence.

The digital broadcast receiver may know whether such a long sequence is used or not by identifying the block extension mode of each slot.

In other words, the method of processing the stream of the digital broadcast receiver may further include identifying the block extension mode of each slot by decoding the signaling data for each slot. More specifically, the block extension mode may be recorded on the TPC of each slot.

In this case, the digital broadcast receiver may defer detecting and processing the known data until a block extension mode of a next slot is identified, even if reception of one slot is completed. That is, if decoding of signaling data of a following slot among the adjacent slots is completed and thus the block extension mode of the following slot is identified as "00," the method may include detecting the known data at the sawteeth portion on the boundary between the adjacent slots as the long training sequence and processing the known data.

According to another exemplary embodiment, the signaling data of each slot may be realized to inform information of adjacent slots in advance.

In this case, the digital broadcast receiver may perform identifying of the block extension mode of the preceding slot and the following slot by decoding the signaling data of the preceding slot of the adjacent slots.

The method for processing the stream of the digital broadcast transmitter and the digital broadcast receiver may be performed by the digital broadcast transmitter and the digital broadcast receiver having the configuration as shown in the drawings and as explained above. For example, the digital broadcast receiver may further include a detector to detect and process known data, in addition to the fundamental elements such as the receiver, the demodulator, the equalizer, and the decoder. In this case, if it is determined that two slots of the block extension mode 00 are received, the detector detects long training data placed on the boundary between the slots and uses it in correcting an error. Also, a result of the detection may be provided to at least one of the demodulator, the equalizer, and the decoder.

[Location of Training Data Considering RS Parity]

With respect to a segment in which an RS parity value has been already determined, if the already calculated RS parity value is changed as the data of the segment is changed during the initialization of the trellis encoder, the receiver may not cause an error and may perform a normal operation. In the case of a packet in which a trellis initialization byte exists, a non-systematic RS parity 20 byte of the corresponding packet is not allowed to precede the trellis initialization byte. The trellis initialization byte may exist only at a location where this constraint condition is satisfied, and the training data may be generated by this initialization byte.

As shown in FIGS. 64 and 65, in order to place the trellis initialization byte ahead of the RS parity, the location of the RS parity is changed differently from the group format of the BEM 01 slot. That is, in the group format of the BEM 01 slot, only the RS parity is located in the first 5 segments among the 208 data segments after interleaving. However, in the case of the BEM 00 slot, the location of the RS parity may be changed so that a lower portion of block B2 is filled with the RS parity as shown in FIGS. 64 and 65.

If the changed RS parity is considered, the training data is distributed over the BEM 00 slot such that the $1^{st}$ training data is located in the $7^{th}$ and the $8^{th}$ segments, the second training data is located in the $20^{th}$ and the $21^{st}$ segments, and the third training data is located in the $31^{st}$ and the $32^{nd}$ segments in blocks B1 and B2. The changed RS parities may be located in the $33^{rd}$ through the $37^{th}$ segments of blocks B1 and B2. Also, the $1^{st}$, $4^{th}$, and $5^{th}$ training data are located in the $134^{th}$ and the $135^{th}$ segments, the $150^{th}$ and the $151^{st}$ segments, the $163^{rd}$ and the $164^{th}$ segments, the $176^{th}$ and the $177^{th}$ segments, and the $187^{th}$ and the $188^{th}$ segments of the tail area, respectively. If two BEM 00 slots are disposed adjacently to generate concatenated long training data, the first training data of blocks B1 and B2 is connected to the third training data of the tail area, the second training data of blocks B1 and B2 is connected to the $4^{th}$ training data of the tail area, and the third training data of blocks B1 and B2 is connected to the $5^{th}$ training data of the tail area.

As described above, the training data is placed in various ways and also initialization of the training data is performed.

The digital broadcast receiver detects the training data from the location where the training data is placed. More specifically, the detector or the signaling decoder shown in FIG. 52 may detect information indicating the plaement location of the training data. Accordingly, the training data is detected from the identified location and the error is corrected.

[Adjacent Slot]

Figure 66:
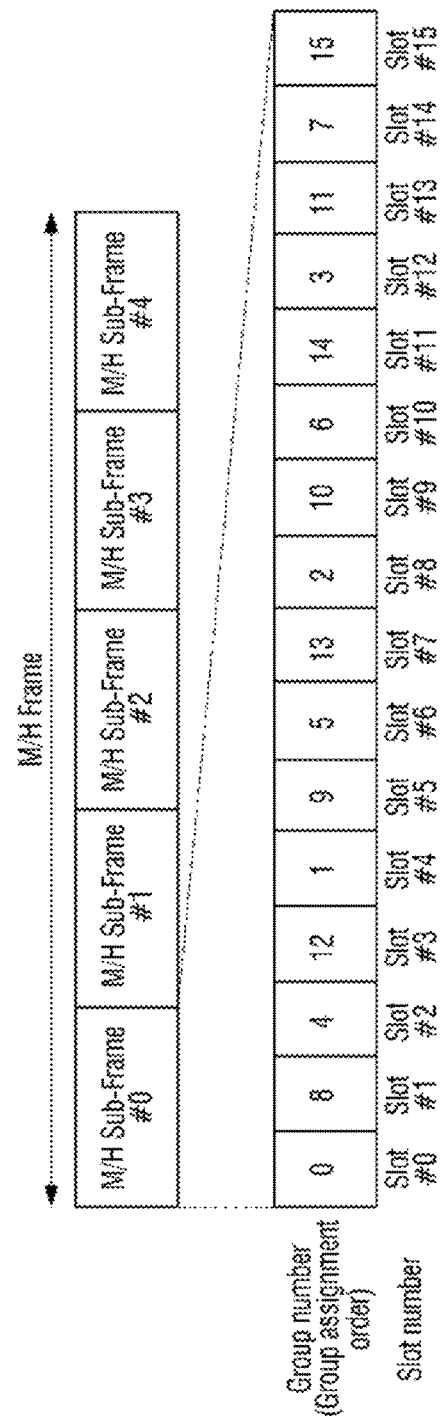
FIG. 66 is a view illustrating a group allocating order in a sub-frame.

The ATSC-M/H system according to an exemplary embodiment allocates an M/H group to 16 slots within a sub-frame according to a predetermined order. FIG. 66 illustrates a group allocating order. A unique group allocating order is determined according to a slot number such that a slot #0 is allocated in $0^{th}$ order, a slot #4 is allocated in first order, a slot #8 is allocated in second order, and a slot #12 is allocated in third order. The group allocating order may be determined appropriately according to the number of whole parades and the number of slots used by each parade. More specifically, the group allocating order may be determined such that one parade is not consecutively placed on the two or more consecutive slots.

Figure 67:
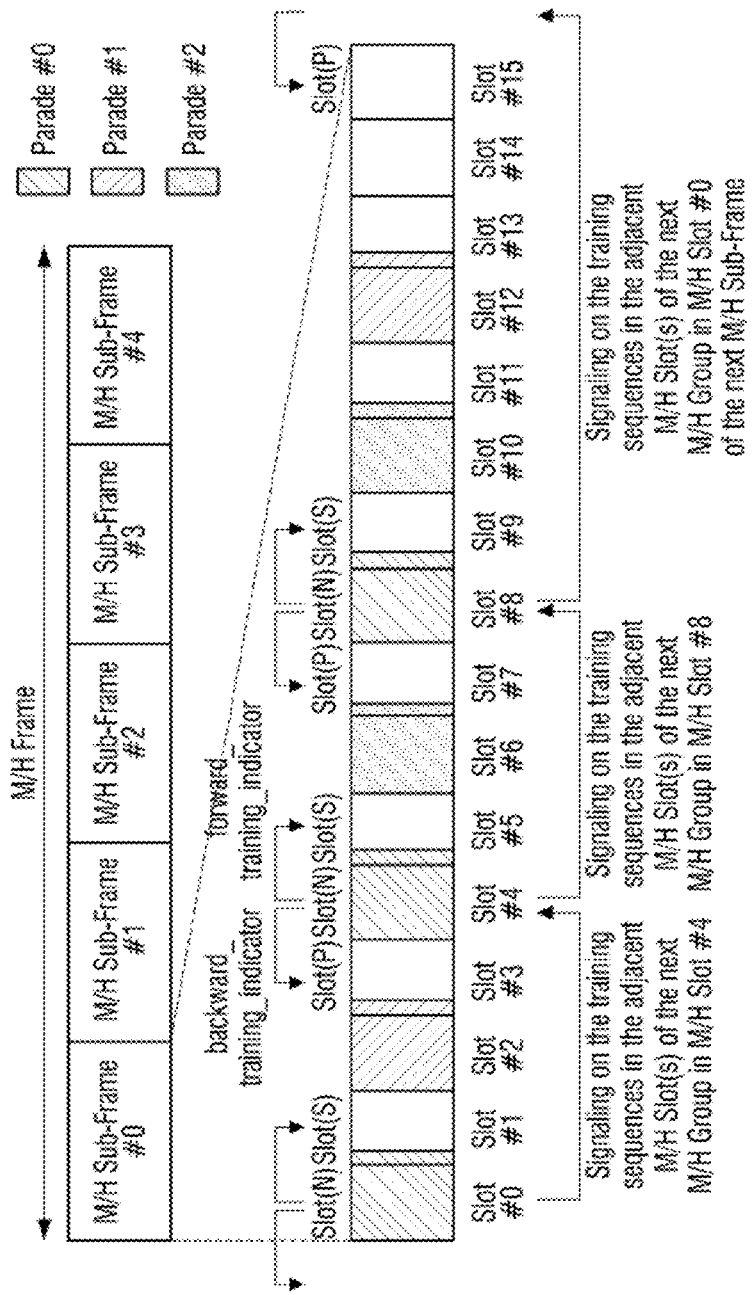
FIG. 67 is a view illustrating a slot allocating pattern of multiple parades.

FIG. 67 illustrates an example of a plurality of parades allocated to slots. In FIG. 67, three parades are not allocated in sequence according to the slot number, and are placed according to an allocating order of each slot and thus a specific parade is not consecutively placed in the order of slots. For example, in the case of a parade #0, mobile data is allocated to the three slots because the NoG is 3. However, the mobile data may be allocated to the slots #0, #4, and #8 rather than the slots #0, #1, and #2, and parades #1 and #2 are placed between the slots #0, #4, and #8.

If the specific parade is placed according to the slot allocating order as described above, mobile data of the same parade may or may not be allocated before/after a certain slot. As shown in FIG. 67, the slot #1, which is a next slot of the slot #0, may be allocated main data rather than mobile data of the same parade #0. Consequently, data type or MH group configuration of a certain slot and those of previous/next slot of the certain slot may be different.

[Notification of Adjacent Slot Information]

As described above, since the configuration of each slot and adjacent slot may be different, an exemplary embodiment in which information on the adjacent slot is notified and utilized may be provided separately from the above-described exemplary embodiments.

For example, the information on previous and next slots of a corresponding slot, that is, the information on the adjacent slots may be included in a transmission parameter channel (TPC) data portion transmitting configuration-related information among the signaling data of the mobile data. In other words, as described above, in the ATSC-M/H system, a certain slot and previous/next slots of the certain slot may have different types of data and different M/H group configurations. Generally, a receiver may decode TPC information of previous/next slots of a slot corresponding to a parade to decode first, in order to obtain information on the adjacent previous/next slots of the slot. As a result, additional power consumption is used in accessing the adjacent slot in every M/H frame, and causes a load to the receiver. In order to solve this problem, an exemplary embodiment in which the information on the adjacent slot is added to a TPC of a certain slot may be provided.

Among the information on the adjacent slot, training sequence-related information may be most utilized by the receiver.

According to an additional exemplary embodiment as described above, the information on the adjacent slot may be transmitted using a reserved area of the TPC.

For example, the TPC may be provided as follows:

TABLE 24

| Syntax | No. of Bits | Format |
|---|---|---|
| TPC_data{ | | |
|   sub-frame_number | 3 | uimsbf |
|   slot_number | 4 | uimsbf |
|   parade_id | 7 | uimsbf |
|   if(sub-frame_number ≤ 1){ | | |
|     current_starting_group_number | 4 | uimsbf |
|     current_number_of_groups_minus_1 | 3 | uimsbf |
|   } | | |
|   if(sub-frame_number ≥ 2){ | | |
|     next_starting_group_number | 4 | uimsbf |
|     next_number_of_groups_minus_1 | 3 | bslbf |
|   } | | |
|   ~~~~~~~~~~~~~~~~ | | |
|   ~~~~~~~~~~~~~~~~ | | |
|   ~~~~~~~~~~~~~~~~ | | |
|   if(tpc_protocol_version== '11000'){ | | |
|     if(sub-frame_number ≤ 1){ | | |
|       current_scalable_mode | 3 | uimsbf |
|     } | | |
|     if(sub-frame_number ≥ 2){ | | |
|       next_scalable_mode | 3 | uimsbf |
|     } | | |
|     sccc_block_extension_mode | 2 | uimsbf |
|     reserved | 11 | bslbf |
|   } | | |
|   if(tpc_protocol_version= '11111'){ | | |
|     reserved | 16 | bslbf |
|   } | | |
|   tpc_protocol_version | | |
| } | 5 | bslbf |

As shown in Table 24 above, the reserved area of the TPC may include the information on the adjacent slot according to a protocol version. "tpc_protocol_version" in Table 24 is a field indicating a version of a TPC syntax configuration and includes 5 bits.

As shown in FIG. 67, a TPC reserved area of the slot #0 may include information on an adjacent slot of the slot #4 of the same parade. In this case, the slot #4 may include information on an adjacent slot of the slot #8 of the same parade. The slot #8 may include information on an adjacent slot of the slot #0 of the next sub-frame.

The adjacent slot recited herein may be a previous slot or a next slot or may be all of the previous slot and the next slot. That is, a first indicator on the previous slot and a second indicator on the next slot may be included.

Also, the adjacent slot information may be at least one of presence/absence of training data in the adjacent slot, a type of training data, a block extension mode of the adjacent slot, a scalable mode of the adjacent slot, and an orphan type existing in the adjacent slot. Furthermore, the adjacent slot information may include information on a field to be transmitted among existing TPC fields.

If a slot (n) is a CMM slot, information on an adjacent slot (n−1), the sawteeth of which is engaged with blocks B1 and B2 of the slot (n), is utilized in decoding the slot (n). Accordingly, an information-related field of the slot (n−1) may be added to the TPC of the slot (n).

However, blocks B9 and B10 of the slot (n), which is the CMM slot, are engaged with sawteeth of 38 packets of the slot (n), rather than blocks B1 and B2 of the slot (n+1). Accordingly, in the case of the CMM slot, it is not necessary to add an information-related field of the slot (n+1). In other words, when the information on the adjacent slot is additionally transmitted to the TPC of the adjacent slot, the information on all of the previous/next slots may be added or only the information on the previous slot may be added according to the type of the slot.

As described above, according to the type of the slot, the information on all of the previous slot and the next slot may be used or only the information on the previous slot may be used. Considering this point, a slot indicator may be used to discriminate the type of the slot according to another exemplary embodiment. In an exemplary embodiment in which the slot indicator is used, TPC information may be generated as follows:

TABLE 25

| Syntax | No. of Bits | Format |
|---|---|---|
| TPC_data{ | | |
| sub-frame_number | 3 | uimsbf |
| slot_number | 4 | uimsbf |
| parade_id | 7 | uimsbf |
| if(sub-frame_number ≤ 1) { | | |
| ~~~~ omitted ~~~~~~~~~~~~~~~~~~~~~ | | |
| } | | |
| fic_version | | |
| parade_continuity_counter | 5 | uimsbf |
|  | 4 | uimsbf |
| if(sub-frame_number ≤ 1) { | | |
| current_TNoG | | |
| reserved | 5 | uimsbf |
| } | 5 | bslbf |
| if(sub-frame_number ≥ 2){ | | |
| next_TNoG | | |
| current_TNoG | 5 | uimsbf |
| } | 5 | uimsbf |
| if(tpc_protocol_version== '11000'){ | | |
| slot_indicator | | |
| if(slot_indicator== '0' { | 1 | bslbf |
| backward_training_indicator | | |
| reserved | 3 | bslbf |
| } | 12 | bslbf |
| if(slot_indicator== '1' { | | |
| backward_training_indicator | | |
| forward_training_indicator | 3 | bslbf |
| if(sub-frame_number ≤ 1) { | 1 | bslbf |
| current_scalable_mode | | |

TABLE 25-continued

| Syntax | No. of Bits | Format |
|---|---|---|
| } | 3 | bslbf |
| if(sub-frame_number ≥ 2){ | | |
| next_scalable_mode | | |
| } | 3 | bslbf |
| sccc block_extension_mode | | |
| reserved | 2 | bslbf |
| } | 6 | bslbf |
| } | | |
| if(tpc_protocol_version= '11111'){ | | |
| reserved | | |
| } | 16 | bslbf |
| tpc_protocol_version | | |
| } | 5 | bslbf |

As shown in Table 25 above, fields such as a slot indicator (slot_indicator), a forward training indicator (forward_training_indicator), and a backward training indicator (backward_training_indicator) may be added to TPC data as new mobile data is transmitted. According to a location of a slot in a stream, one of the backward training indicator and the forward training indicator may indicate the first indicator on the previous slot and the other of the backward training indicator and the forward training indicator may indicate the second indicator on the next slot.

According to an exemplary embodiment shown in Table 25, if the slot indicator is "0," only 3 bits are used for the backward training indicator. On the other hand, if the slot indicator is "1," 1 bit is allocated to the forward training indicator besides the 3 bits for the backward training indicator.

The slot indicator in Table 25 indicates a type of an M/H slot. The slot indicator of "0" indicates that a current M/H slot has 118 M/H packets and 38 TS-M packets. On the other hand, the slot indicator of "1" indicates that the current M/H slot has 118+x M/H packets and y TS-M packets. Herein, x+y=38.

The backward training indicator indicates a characteristic of a training sequence of a previous slot of a next slot of a current parade or a characteristic of a training sequence in M/H blocks B1 and B2 of a next slot of a current parade. The backward training indicator may be set variously as follows:

TABLE 26

| Value | Slot(P) type | Slot(N) type | Slot(P) training location | Slot(N) training location | Slot(N) training concatenation |
|---|---|---|---|---|---|
| 000 | BEM = 01 SM = 000 | CMM(Dual) or BEM = 01 SM = 000-011 | Region E | M/H Blocks B1 and B2 | Yes |
| 001 | BEM = 01 SM = 001 | CMM(Dual) or BEM = 01 SM = 000-011 | Region E | M/H Blocks B1 and B2 | Yes |
| 010 | BEM = 01 SM = 010 | CMM(Dual) or BEM = 01 SM = 000-011 | Region E | M/H Blocks B1 and B2 | Yes |
| 011 | BEM = 01 SM011 | CMM(Dual) or BEM = 01 SM = 000-011 | Region E | M/H Blocks B1 and B2 | Yes |
| 100 | BEM = 00 BEM = 00 | CMM BEM = 00 | Region E Region E | N/A M/H Blocks B1 and B2 | No Yes |
| 101 | CMM or Main CMM or Main | CMM BEM = 00 | N/A N/A | N/A M/H Blocks B1 and B2 | No No |
| 110 | CMM or Main | BEM = 01 SM = 000-011 | N/A | M/H Blocks B1 and B2 (Orphan type 1) | No |

TABLE 26-continued

| Value | Slot(P) type | Slot(N) type | Slot(P) training location | Slot(N) training location | Slot(N) training concatenation |
|---|---|---|---|---|---|
| 111 | CMM(Dual) | BEM = 01<br>SM = 000-011 | M/H Blocks B9 and B10<br>(Orphan type 2) | M/H Blocks B1 and B2<br>(Orphan type 1) | No |
|  | BEM = 01<br>SM = 111 | BEM = 01<br>SM = 111 | Region E | M/H Blocks B1 and B2 | Yes |

In Table 26, the slot (N) indicates a next slot of a current parade, and the slot (P) indicates a slot preceding the slot (N). As described above, the backward training sequence may be set to various values such as 000, 001, 010, 011, 100, 101, 110, and 111 according to the relationship of the slot (P) and the slot (N).

The forward training indicator indicates a characteristic of a slot following the next slot of the current parade. As described above, if the slot (N) indicates the next slot of the current parade, the slot (S) is a slot transmitted after the slot (N). The forward training sequence may also be set to various values as follows:

TABLE 27

| Value | Slot(N) type | Slot(S) type | Slot(N) training location | Slot(S) training location | Slot(N) training concatenation |
|---|---|---|---|---|---|
| 1 | BEM = 01<br>SM = 000-011 | CMM(Dual) or Partial Main or BEM = 01<br>SM = 000-011 | Region E | M/H Blocks B1 and B2 | Yes |
|  | BEM = 01<br>SM = 111 | BEM = 01<br>SM = 111 | Region E | M/H Blocks B1 and B2 | Yes |
|  | BEM = 00 | BEM = 00 | Region E | M/H Blocks B1 and B2 | Yes |
| 0 | BEM = 00 | CMM or Main | Region E | N/A | No |

Referring to Table 27, if a block extension mode of a corresponding slot is "01" and a next slot is a CMM slot, a partial main slot, or a SFCMM slot of a block extension mode 01, and, if the block extension mode of the corresponding slot is "00" and the next slot is a SFCMM slot of a block extension mode 00, the forward training indicator is set to "1."

On the other hand, if the block extension mode of the corresponding slot is "00" and the next slot is the CMM slot or the main slot, the forward training indicator is set to The partial main slot refers to an M/H slot which is smaller than 156 main packets and has an orphan type 3 in Table 17.

As described above, the backward training indicator or the backward training indicator/forward training indicator may be selectively included according to the value of the slot indicator.

As described above, the slot indicator, the backward training indicator, and the forward training indicator may be determined with reference to the next slot corresponding to the same parade as that of the current slot, although it is understood that another exemplary embodiment is not limited thereto. For example, according to another exemplary embodiment, the slot indicator, the backward training indicator, and the forward training indicator may be determined with reference to the current slot.

Also, as described above, the adjacent slot information may be notified in various ways.

The digital broadcast transmitter to transmit the adjacent slot information along with the current slot may have the same configuration as that of the above-described digital broadcast transmitters.

For example, the digital broadcast transmitter in the present exemplary embodiment may have the configuration as shown in FIG. 4. More specifically, the digital broadcast transmitter may include a data pre-processor, a normal processor, a multiplexer, and an exciter unit. For the convenience of explanation, the data pre-processor, the normal processor, and the multiplexer are referred to as a stream configuration unit.

The stream configuration unit allocates groups to a plurality of parades as shown in FIGS. 66 and 67. The group allocating order may be determined according to the number of groups of each parade. More specifically, the groups of the same parade are not consecutively placed. This operation may be performed under control of a controller separately provided and may be performed according to programming for each block.

The data pre-processor may place 1.0 version data, 1.1 version data, and training data according to mode information (i.e., a block extension mode) set for each parade. This has been described in the above-described exemplary embodiments and thus an additional explanation is omitted.

As described above, if the training data is placed along with each M/H data, the signaling encoder of the data pre-processor places the information on the adjacent slot in the reserved area of the TPC according to the block extension mode, and prepares signaling data. The signaling data is included in the stream by the group formatter, is processed along with the stream by the multiplexer and the exciter unit, and is then broadcasted.

According to an exemplary embodiment, the method for processing the stream of the digital broadcast transmitter may include configuring a stream including a slot to which M/H data is allocated, and encoding and interleaving the stream and outputting the stream.

Each slot of the stream includes the signaling data. The TPC of the signaling data may be realized in the form as shown in Table 24 or Table 25 above. If the signaling data is realized as in Table 25, the signaling data includes the slot indicator indicating the type of the slot. The signaling data may include at least one of the backward training indicator and the forward training indicator according to a value of the slot indicator.

The configuring of the stream may include placing each of the plurality of parades in the plurality of slots according to a placing pattern in which slots corresponding to the same parade are not consecutively placed, generating signaling data including the slot indicator, the backward training indicator, and the forward training indicator, encoding the signaling data, and adding the signaling data to the stream.

More specifically, the parades may be placed as shown in FIGS. 66 and 67. Also, values of the slot indicator, the backward training indicator, and the forward training indicator may be determined according to a placing pattern of the parades and the type of each slot. The determined values are recorded on a bit of a field allocated to each indicator.

Referring to Table 25, in the case of the CMM slot, information on training data at a previous slot preceding the CMM slot is generated as the backward training indicator, and the forward training indicator is not generated. On the other hand, in the case of the SFCMM slot, information on training data at a previous slot preceding the SFCMM slot is generated as the backward training indicator, and information on training data at a next slot following the SFCMM slot is generated as the forward training indicator.

As described above, the various indicators are recorded according to the type of the slot so that the digital broadcast receiver uses the previous slot and the next slot efficiently.

The digital broadcast receiver receives the broadcasted transport stream, detects the signaling data, decodes the singling data, and identifies the adjacent slot information.

The digital broadcast receiver according to the present exemplary embodiment also has the same configuration as that of the above-described exemplary embodiments.

Figure 68:
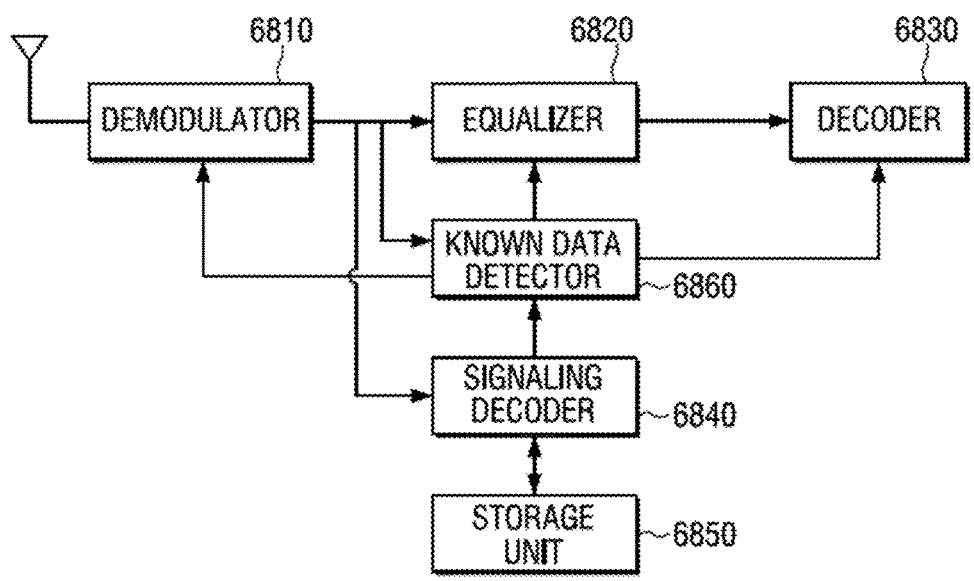
FIG. 68 is a block diagram illustrating a digital broadcast receiver according to another exemplary embodiment.

For example, the receiver may be configured as shown in FIG. 68.

Referring to FIG. 68, the digital broadcast receiver may include a demodulator 6810, an equalizer 6820, a decoder 6830, a signaling decoder 6840, a storage unit 6850, and a known data detector 6860.

The demodulator 6810 receives and demodulates the transport stream. The demodulated stream is output to the signaling decoder 6840 and the equalizer 6820.

The signaling decoder 6840 detects the signaling data from the demodulated stream and decodes the signaling data. A de-multiplexer (not shown) may be provided in the signaling decoder 6840 to detect the signaling data, and may be provided at a rear end of the demodulator 6810.

The signaling decoder 6840 processes the signaling data and detects the adjacent slot information from the reserved area of the TPC. More specifically, if the TPC is configured as in Table 25, the signaling decoder 6840 identifies the tpc_protocol_version and determines whether the slot is the CMM slot or the SFCMM slot. After that, the signaling decoder 6840 identifies the slot indicator and then identifies at least one of the backward training indicator and the forward training indicator.

The storage unit 6850 may store values of the indicators and corresponding slot types, and locations of training data of the adjacent slots. More specifically, the storage unit 6850 stores information as shown in Tables 26 and 27.

The signaling decoder 6840 reads out information matched with the indicator values in the signaling data.

The read-out information may be provided to the known data detector 6860.

In the case of the CMM slot, the known data detector 6860 detects known data from the previous slot according to training sequence information of the previous slot. Accordingly, the known data is provided to the demodulator 6810, the equalizer 6820, and the decoder 6830 along with the known data of the present slot. Accordingly, the known data may be used in at least one of demodulating, equalizing, and decoding.

In the case of the SFCMM slot, the known data detector 6860 detects known data placed in the previous slot and known data placed in the next slot according to training sequence information of the previous slot and training sequence information of the next slot. The known data is provided to the demodulator 6810, the equalizer 6820, and the decoder 6830 along with the known data of the present slot, and is used in each of the processes.

If a synchronizer (not shown) is provided, the known data may be provided to the synchronizer.

For example, if the adjacent slots have the same BEM 00 mode, the equalizer 6820 may perform equalizing using a concatenated long training sequence instead of a short training sequence in a C/D/E area of the slot (n), based on the adjacent slot information informed by the TPC of the slot (n).

Although the known data detector 6860 is illustrated as a separate module in FIG. 68, the known data detector 6860 may be provided in the signaling decoder 6840, the demodulator 6810, the equalizer 6820, or the decoder 6830. Accordingly, if the training sequence information is known, the known data detector 6860 may directly detect the known data and process the known data.

The values and the types of the slot indicator, the backward training indicator, and the forward training indicator may be determined variously as shown in Tables 25 to 27. In particular, referring to Table 25, the value of the slot indicator is expressed by 1-bit, the backward training indicator is expressed by 3-bits, and the forward training indicator is expressed by 1-bit. As described above, according to the various exemplary embodiments, the stream is efficiently processed using the training sequence of the adjacent slot without additional power consumption.

According to an exemplary embodiment, a placing order of the ensemble is corrected unlike in the above-described exemplary embodiments so that the digital broadcast receiver can predict the adjacent slot information.

That is, the digital broadcast transmitter may place the M/H data and the normal data in each slot according to a pre-set regulation according to a parade repetition cycle (PRC) of each parade. The PRC refers to a cycle in which the same parade is repeated in every frame. If the PRC is 3, the data of the same parade is transmitted in every third M/H frame. Accordingly, according to the PRC value of each parade, the data is placed and transmitted according to the pre-set regulation so that a starting group number (SGN) is fixed in every frame. In this case, if the digital broadcast receiver knows the regulation in advance, the type of the slot can be predicted without separate information on the previous slot and the next slot of each slot.

According to one example of the above regulation, a parade of PRC=1 in which data is repeatedly placed in every frame is first placed. If a plurality of parades of PRC=1 are provided, each slot of frame is filled in sequence from the smallest group number or the greatest group number.

Next, with respect to parades of a PRC greater than or equal to 2, a PRC set including the greatest common and the least common multiple except for 1 is created. For example, the PRC set may be generated as {2,4,8}, {3,6}, {4,8}, {5,5,5}.

After that, in the selected PRC set, each slot of frame is filled in sequence from the smallest PRC parade and the smallest group number or in reverse order.

As described above, if the parades are placed in the slot according to the uniform regulation and the digital broadcast receiver shares the regulation, the stream may be processed using the training data of the adjacent slots without separate adjacent slot information.

While not restricted thereto, exemplary embodiments can also be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, exemplary embodiments may be written as computer programs transmitted over a computer-readable transmission medium, such as a carrier wave, and received and implemented in general-use or special-purpose digital computers that execute the programs. Moreover, while not required in all aspects, one or more units of the digital broadcast transmitter and the digital broadcast receiver can include a processor or microprocessor executing a computer program stored in a computer-readable medium.

The foregoing exemplary embodiments and advantages are merely exemplary and are not to be construed as limiting the present invention. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A method for processing a stream of a digital broadcast transmitter, the method comprising:
   configuring a stream comprising a slot to which mobile data is allocated; and
   encoding and interleaving the configured stream and outputting the encoded and interleaved stream,
   wherein the slot comprises signaling data, and
   wherein the signaling data comprises a slot indicator indicating a type of the slot, and at least one of a backward training indicator and a forward training indicator according to a value of the slot indicator.

2. The method as claimed in claim 1, wherein:
   the configuring the stream comprises placing known data so that the known data placed in sawteeth portions of two adjacent slots among a plurality of slots included in the stream are connected to each other; and
   the backward training indicator and the forward training indicator are information to indicate, to a digital broadcast receiver, locations of the known data of a previous slot or a next slot in the sawteeth portions.

3. The method as claimed in claim 1, wherein the slot indicator, the backward training indicator, and the forward training indicator are determined with reference to a next slot corresponding to a same parade as a parade of the slot.

4. The method as claimed in claim 3, wherein the configuring the stream comprises:
   placing each of a plurality of parades in a plurality of slots according to a placing pattern in which slots corresponding to a same parade are not consecutively placed;
   generating the signaling data comprising the slot indicator and the at least one of the backward training indicator and the forward training indicator; and
   encoding the generated signaling data and adding the encoded signaling data to the stream.

5. The method as claimed in claim 4, wherein the generating the signaling data comprises:
   if the slot is a Core Mobile Mode (CMM) slot, generating the backward training indicator from information on training data of a previous slot preceding the CMM slot; and
   if the slot is a Scalable Full-Channel Mobile Mode (SFCMM) slot, generating the backward training indicator from information on training data of a previous slot preceding the SFCMM slot and generating the forward training indicator from information on training data of a next slot following the SFCMM slot.

6. The method as claimed in claim 5, wherein the slot indicator is represented by 1 bit, the backward training indicator is represented by 3 bits, and the forward training indicator is represented by 1 bit.

7. A non-transitory computer readable recording medium having recorded thereon a program executable by a computer for performing the method of claim 1.

8. The method as claimed in claim 1, wherein:
   the signaling data comprises the backward training indicator and not the forward training indicator when the slot indicator indicates a first type of slot; and
   the signaling data comprises both the backward training indicator and the forward training indicator when the slot indicator indicates a second type of slot.

9. A digital broadcast transmitter comprising:
   a stream configuration unit which configures a stream comprising a slot to which mobile data is allocated; and
   an exciter unit which encodes and interleaves the configured stream and outputs the encoded and interleaved stream,
   wherein the slot comprises signaling data,
   wherein the signaling data comprises a slot indicator indicating a type of the slot, and at least one of a backward training indicator and a forward training indicator according to a value of the slot indicator.

10. The digital broadcast transmitter as claimed in claim 9, wherein:
    the stream configuration unit comprises a group formatter which places known data so that the known data placed in sawteeth portions of two adjacent slots among a plurality of slots included in the stream are connected to each other; and
    the backward training indicator and the forward training indicator are information to indicate, to a digital broadcast receiver, locations of the known data of a previous slot or a next slot in the sawteeth portions.

11. The digital broadcast transmitter as claimed in claim 9, wherein the slot indicator, the backward training indicator, and the forward training indicator are determined with reference to a next slot corresponding to a same parade as a parade of the slot.

12. The digital broadcast transmitter as claimed in claim 11, wherein the stream configuration unit comprises:
    a data pre-processor which places each of a plurality of parades in a plurality of slots according to a placing pattern in which slots corresponding to a same parade are not consecutively placed;
    a signaling encoder which encodes the signaling data comprising the slot indicator, and the at least one of the backward training indicator and the forward training indicator, and provides the encoded signaling data to the data pre-processor; and
    a multiplexer which receives data processed by the data pre-processor and configures a transport stream according to the received data.

13. The digital broadcast transmitter as claimed in claim 12, wherein:
  if the slot is a Core Mobile Mode (CMM) slot, the signaling encoder generates the forward training indicator from information on training data of a previous slot preceding the CMM slot; and
  if the slot is a Scalable Full-Channel Mobile Mode (SFCMM) slot, the signaling encoder generates the forward training indicator from information on training data of a previous slot preceding the SFCMM slot as the backward training indicator and generates information on training data of a next slot following the SFCMM slot.

14. The digital broadcast transmitter as claimed in claim 13, wherein the slot indicator is represented by 1 bit, the backward training indicator is represented by 3 bits, and the forward training indicator is represented by 1 bit.

15. A method for processing a stream of a digital broadcast receiver, the method comprising:
  receiving and demodulating a stream comprising a slot to which mobile data is allocated;
  equalizing the demodulated stream;
  decoding the equalized stream; and
  detecting and decoding signaling data included in the slot of the demodulated stream,
  wherein the signaling data comprises a slot indicator indicating a type of the slot, and at least one of a backward training indicator and a forward training indicator according to a value of the slot indicator.

16. The method as claimed in claim 15, wherein the detecting and decoding the signaling data comprises:
  separating the signaling data from the demodulated stream;
  decoding the separated signaling data and checking the slot indicator;
  if the slot indicator indicates a Core Mobile Mode (CMM) slot, checking the backward training indicator and checking training sequence information of a previous slot according to a value of the backward training indicator; and
  if the slot indicator indicates a Scalable Full-Channel Mobile Mode (SFCMM) slot, checking the backward training indicator and the forward training indicator and checking the training sequence information of the previous slot and training sequence information of a next slot according to the value of the backward training indicator and a value of the forward training indicator.

17. The method as claimed in claim 16, further comprising:
  if the slot is the CMM slot, detecting known data from the previous slot according to the training sequence information of the previous slot; and
  if the slot is the SFCMM slot, detecting the known data placed in the previous slot and known data placed in the next slot according to the training sequence information of the previous slot and the training sequence information of the next slot,
  wherein the detected known data is used in at least one of the demodulating, the equalizing, and the decoding.

18. The method as claimed in claim 17, wherein the slot indicator is represented by 1 bit, the backward training indicator is represented by 3 bits, and the forward training indicator is represented by 1 bit.

19. A non-transitory computer readable recording medium having recorded thereon a program executable by a computer for performing the method of claim 15.

20. A digital broadcast receiver comprising:
  a demodulator which receives and demodulates a stream comprising a slot to which mobile data is allocated;
  an equalizer which equalizes the demodulated stream;
  a decoder which decodes the equalized stream; and
  a signaling decoder which detects and decodes signaling data included in the slot of the demodulated stream,
  wherein the signaling data comprises a slot indicator indicating a type of the slot, and at least one of a backward training indicator and a forward training indicator according to a value of the slot indicator.

21. The digital broadcast receiver as claimed in claim 20, further comprising:
  a storage unit which stores information on an adjacent slot, adjacent to the slot,
  wherein the signaling decoder separates the signaling data from the demodulated stream, decodes the separated signaling data and checks the slot indicator, if the slot indicator indicates a Core Mobile Mode (CMM) slot, checks training sequence information of a previous slot according to a value of the backward training indicator from the storage unit, and if the slot indicator indicates a Scalable Full-Channel Mobile Mode (SFCMM) slot, checks the training sequence information of the previous slot and training sequence information of a next slot according to values of the backward training indicator and the forward training indicator from the storage unit.

22. The digital broadcast receiver as claimed in claim 21, further comprising:
  a known data detector which, if the slot is the CMM slot, detects known data from the previous slot according to the training sequence information of the previous slot, and, if the slot is the SFCMM slot, detects the known data placed in the previous slot and known data placed in the next slot according to the training sequence information of the previous slot and the training sequence information of the next slot,
  wherein the detected known data is used by at least one of the demodulator, the equalizer, and the decoder.

23. The digital broadcast receiver as claimed in claim 22, wherein the slot indicator is represented by 1 bit, the backward training indicator is represented by 3 bits, and the forward training indicator is represented by 1 bit.

* * * * *